(12) United States Patent
Yamaguchi

(10) Patent No.: US 11,158,645 B2
(45) Date of Patent: Oct. 26, 2021

(54) SEMICONDUCTOR MEMORY DEVICE

(71) Applicant: KIOXIA CORPORATION, Tokyo (JP)

(72) Inventor: Koichiro Yamaguchi, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 94 days.

(21) Appl. No.: 16/749,704

(22) Filed: Jan. 22, 2020

(65) Prior Publication Data

US 2020/0161320 A1 May 21, 2020

Related U.S. Application Data

(63) Continuation of application No. PCT/JP2017/038204, filed on Oct. 23, 2017.

(30) Foreign Application Priority Data

Jul. 26, 2017 (JP) .............................. JP2017-144465

(51) Int. Cl.
 *G11C 16/08* (2006.01)
 *H01L 27/11529* (2017.01)
 (Continued)

(52) U.S. Cl.
 CPC .... *H01L 27/11529* (2013.01); *G11C 16/0483* (2013.01); *G11C 16/06* (2013.01);
 (Continued)

(58) Field of Classification Search
 CPC ... G11C 11/406; G11C 16/0483; G11C 16/06; G11C 16/34; G11C 16/26
 (Continued)

(56) References Cited

U.S. PATENT DOCUMENTS 6,249,461 B1 6/2001 Choi et al.
6,882,569 B2 4/2005 Hosono et al.
(Continued)

FOREIGN PATENT DOCUMENTS

JP 2002073405 A 3/2002
JP 2003233992 A 8/2003
(Continued)

OTHER PUBLICATIONS

International Search Report (ISR) (and English translation thereof) dated Nov. 21, 2017 issued in International Application No. PCT/JP2017/038204.

*Primary Examiner* — Xiaochun L Chen
(74) *Attorney, Agent, or Firm* — Holtz, Holtz & Volek PC

(57) ABSTRACT

According to one embodiment, a semiconductor memory device including a first memory cell; a word line; a bit line; a row decoder; a sense amplifier including a latch circuit; a data register; and a control circuit capable of suspending a write operation during the write operation of the first memory cell to perform a read operation of the first memory cell. In a read operation of the first memory cell performed while suspending the write operation, the row decoder applies a read voltage to the word line, and the sense amplifier transmits data read from the first memory cell to the data register as read data when writing to the first memory cell is completed, and transfers write data held by the latch circuit to the data register as the read data when the writing is not completed.

17 Claims, 32 Drawing Sheets

(51) Int. Cl.
  *G11C 16/34* (2006.01)
  *H01L 27/11524* (2017.01)
  *H01L 27/1157* (2017.01)
  *G11C 16/04* (2006.01)
  *G11C 16/06* (2006.01)
  *G11C 16/26* (2006.01)

(52) U.S. Cl.
  CPC .............. *G11C 16/26* (2013.01); *G11C 16/34* (2013.01); *G11C 16/3436* (2013.01); *H01L 27/1157* (2013.01); *H01L 27/11524* (2013.01)

(58) Field of Classification Search
  USPC ........................................................ 365/149
  See application file for complete search history.

(56) References Cited

U.S. PATENT DOCUMENTS

| | | |
|---|---|---|
| 7,586,785 B2 | 9/2009 | Hosono et al. |
| 9,093,132 B2 | 7/2015 | Kim et al. |
| 2003/0169630 A1 | 9/2003 | Hosono et al. |
| 2004/0264257 A1 | 12/2004 | Hamaguchi et al. |
| 2007/0121376 A1 | 5/2007 | Toda |
| 2007/0171721 A1 | 7/2007 | Shibata |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0167100 A1 | 6/2012 | Li et al. |
| 2012/0307557 A1 | 12/2012 | Itagaki |
| 2014/0219034 A1 | 8/2014 | Gomez et al. |
| 2016/0012902 A1 | 1/2016 | Harada et al. |
| 2016/0313946 A1 | 10/2016 | Zang et al. |
| 2016/0365150 A1 | 12/2016 | Tokiwa |
| 2019/0362761 A1* | 11/2019 | Sato .................. G11C 16/0483 |

FOREIGN PATENT DOCUMENTS

| | | |
|---|---|---|
| JP | 2004348808 A | 12/2004 |
| JP | 2007141393 A | 6/2007 |
| JP | 2007193911 A | 8/2007 |
| JP | 2017004583 A | 1/2017 |

* cited by examiner

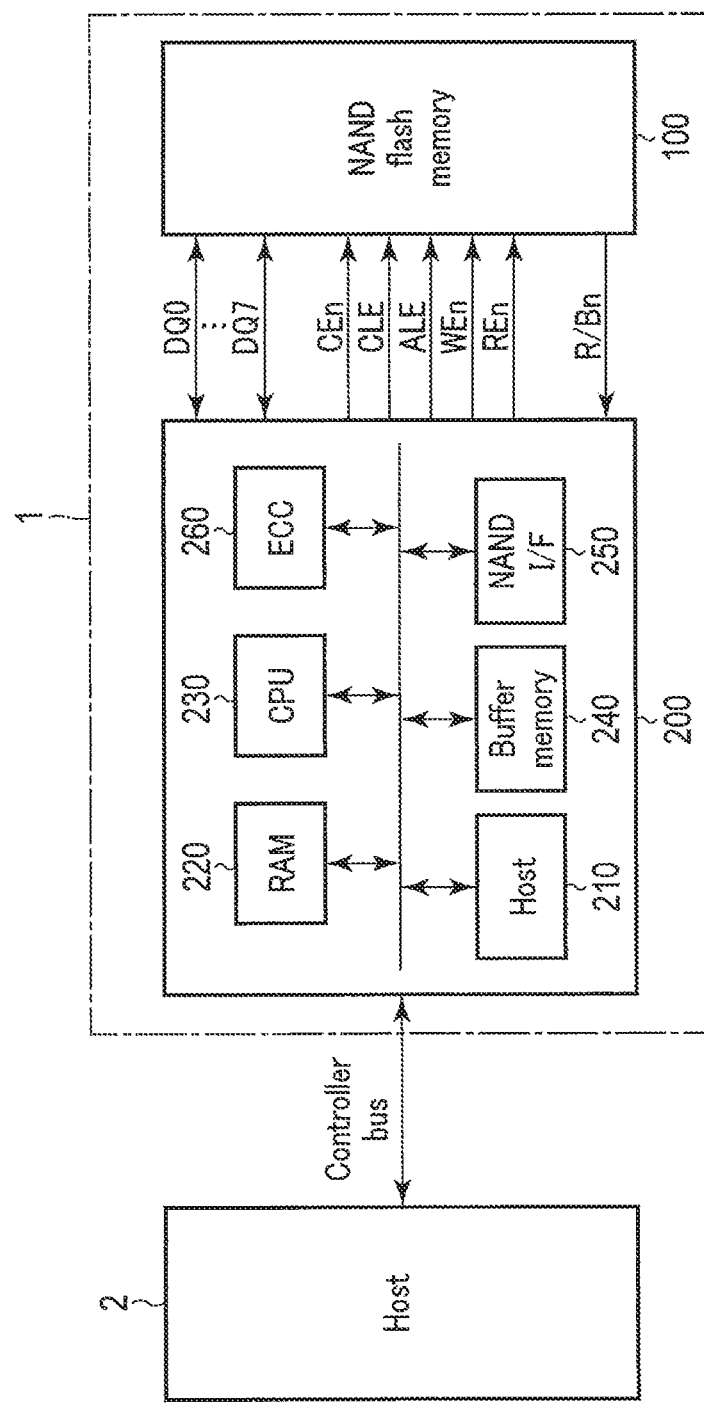
F I G. 1

F.I.G. 2

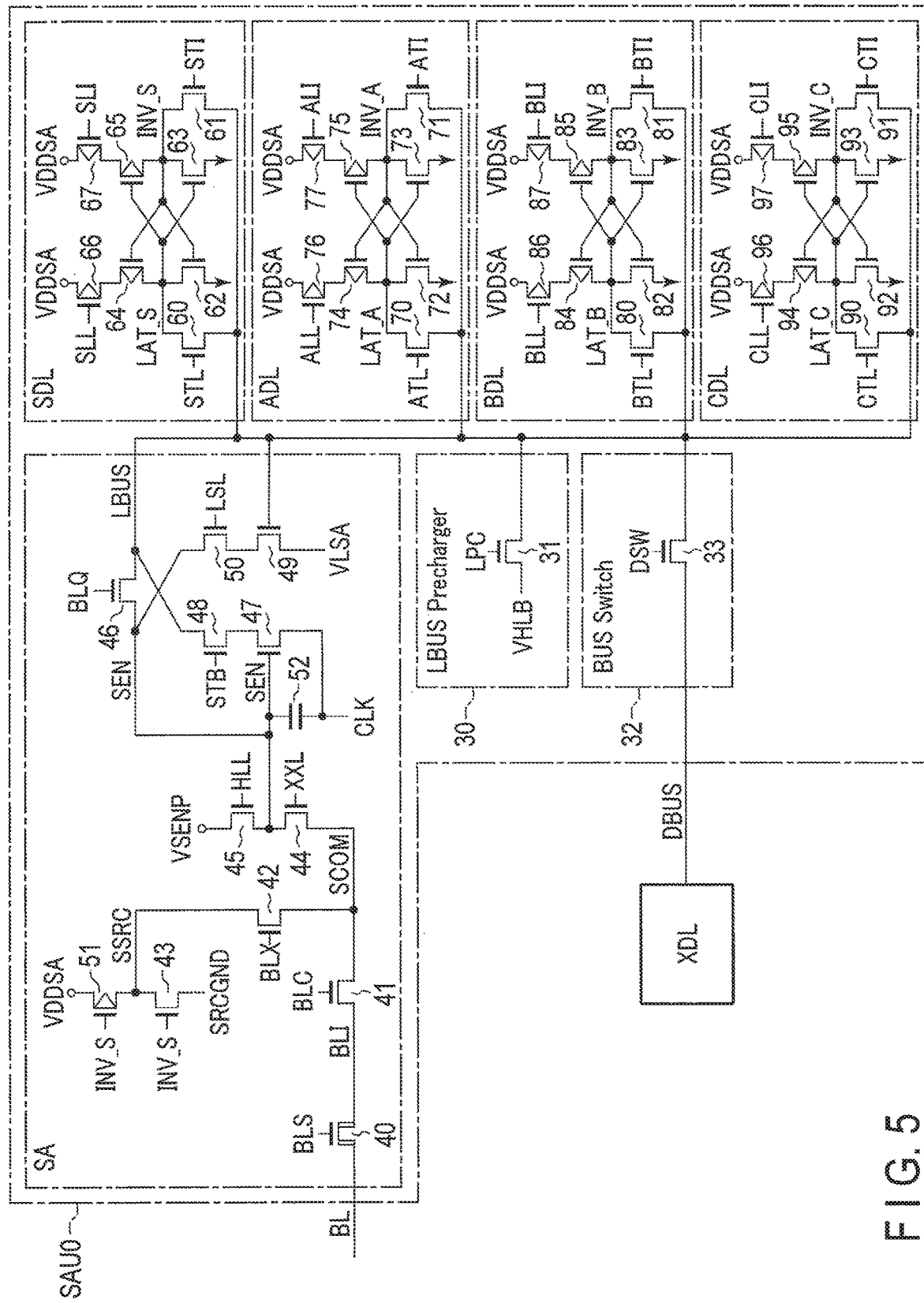
F I G. 5

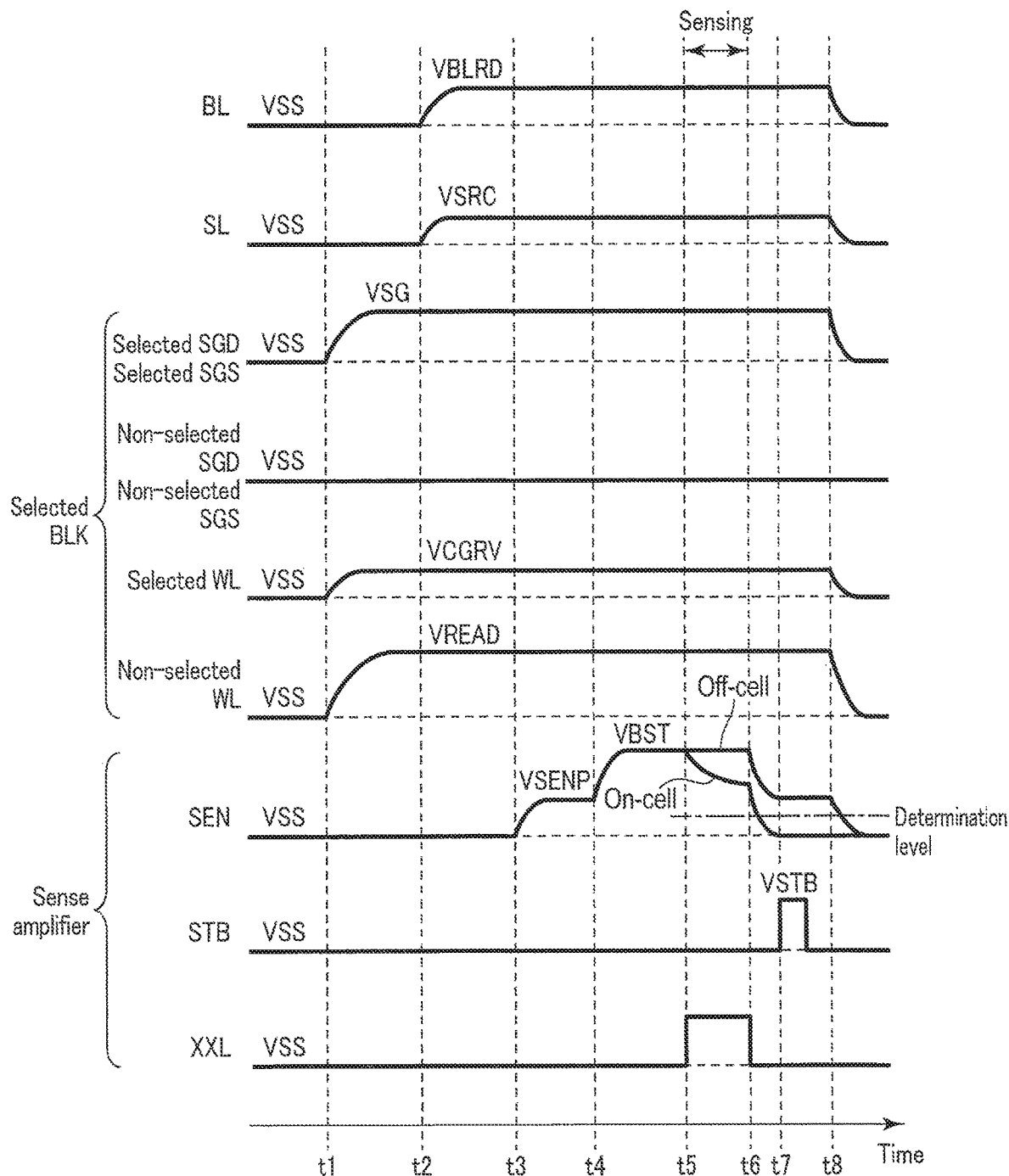
F I G. 8

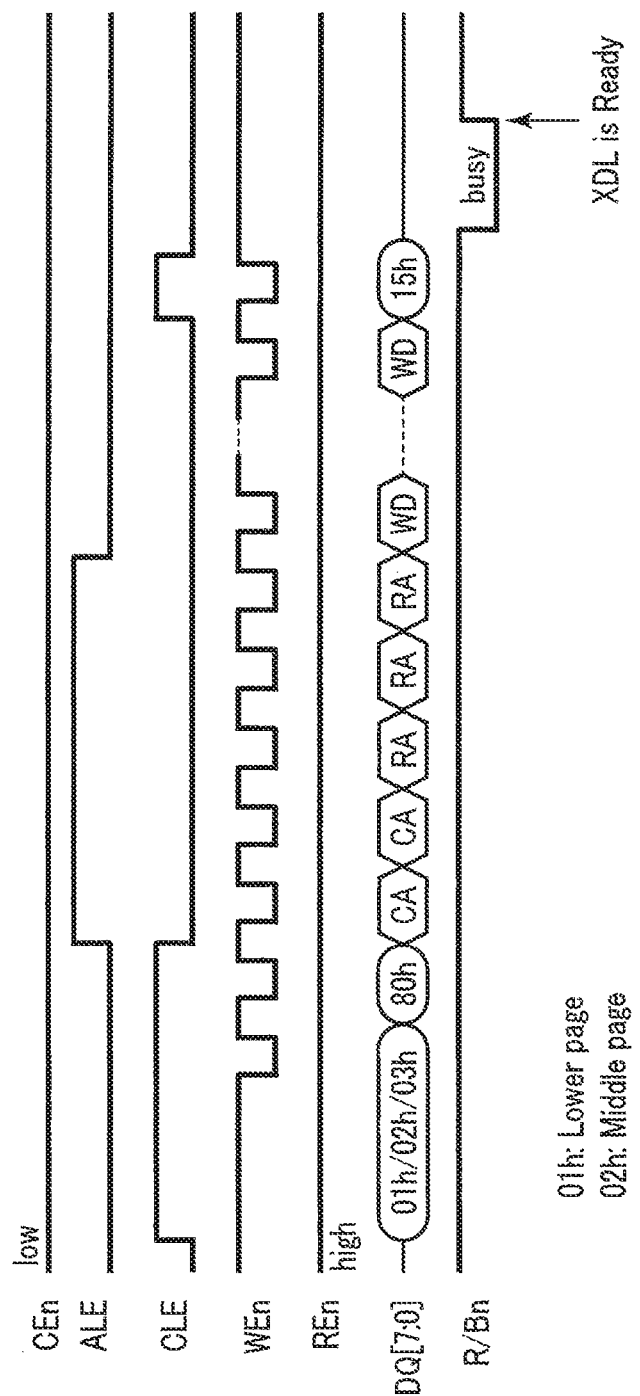
F I G. 12

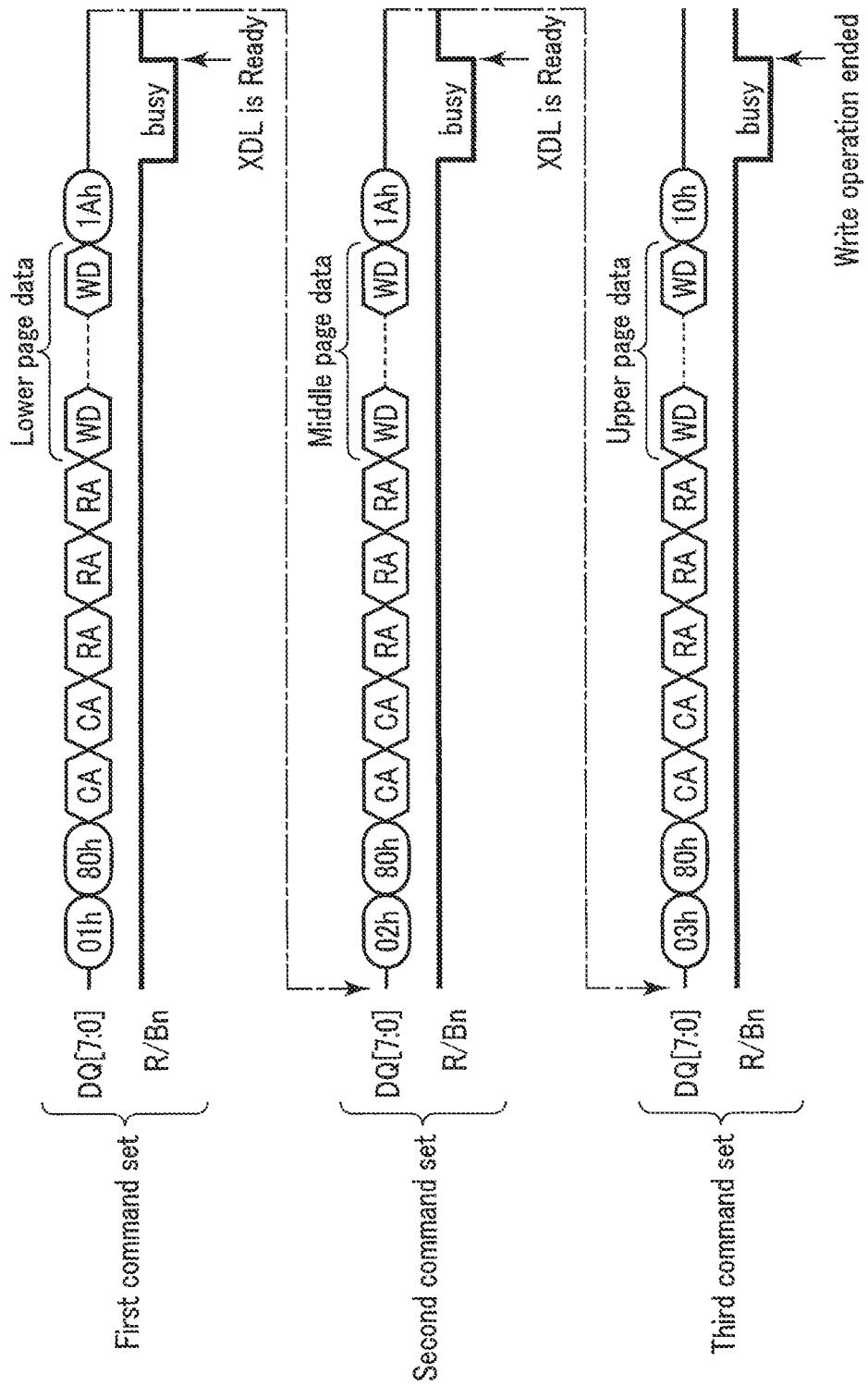
F I G. 13

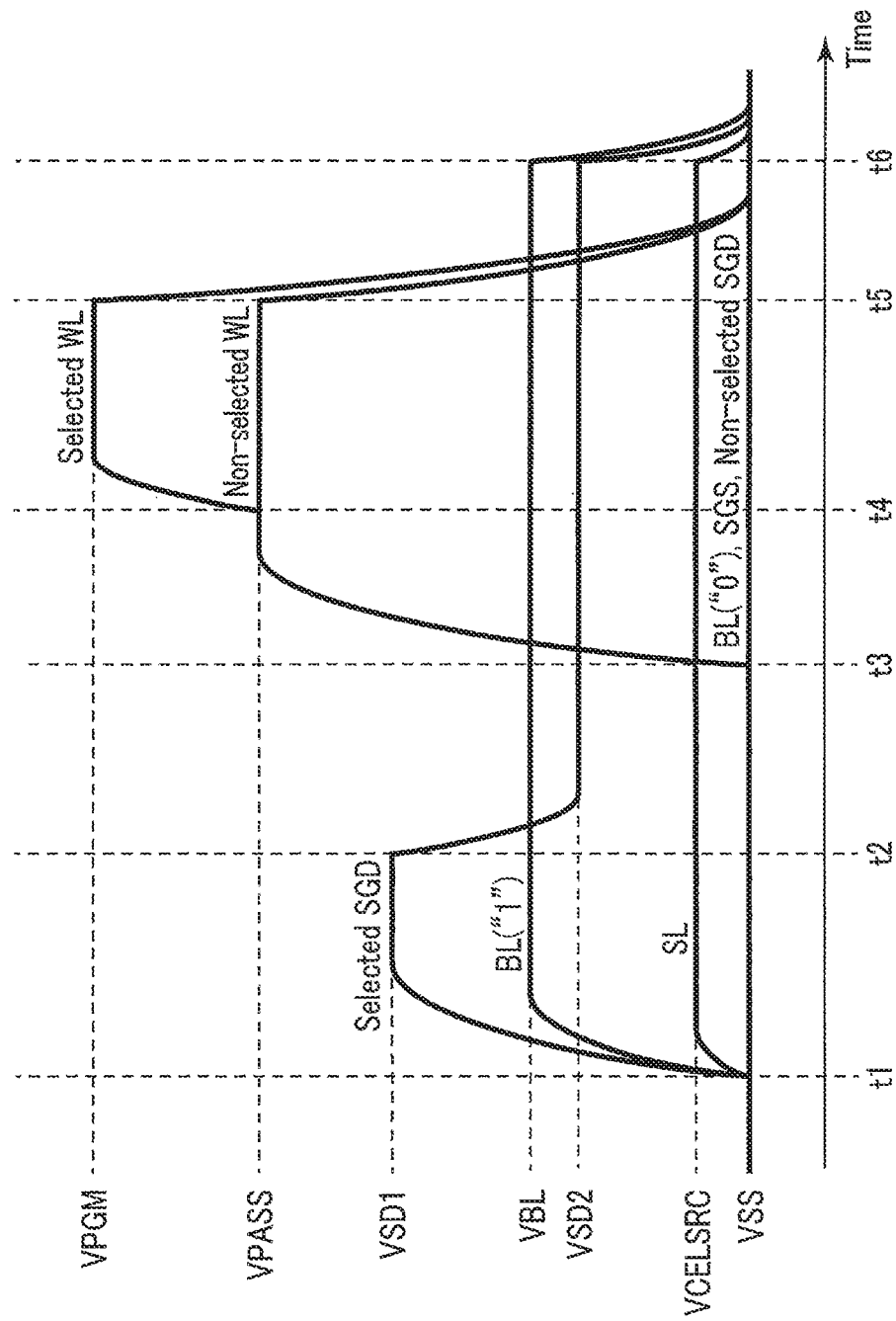
F I G. 14

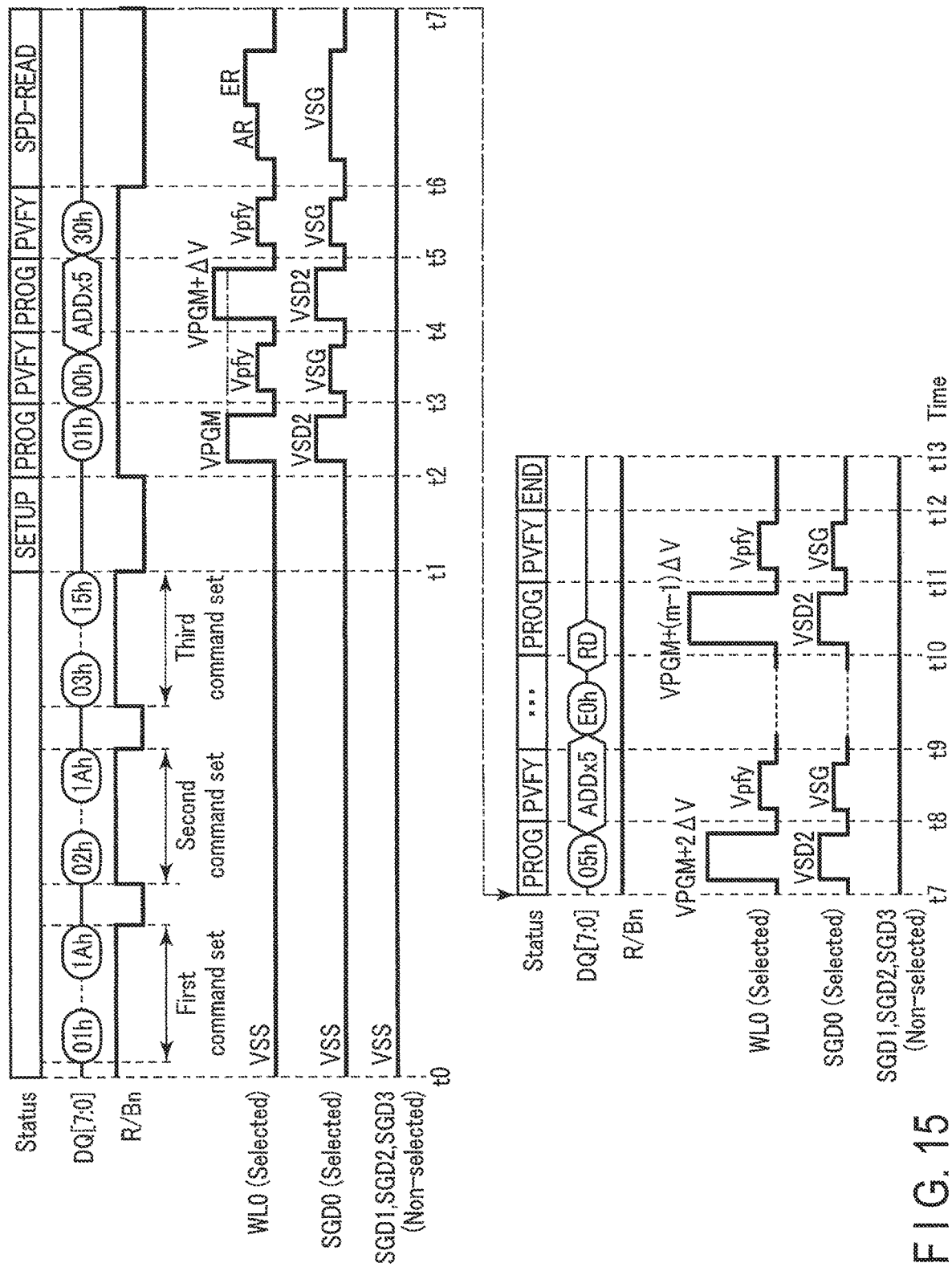
F I G. 15

FIG. 17

| Write data | Er | A | A | B | B | E | |
|---|---|---|---|---|---|---|---|
| | XDL0 x | XDL1 x | XDL2 x | XDL3 x | XDL4 x | XDL5 x | |
| | ADL0 1 | ADL1 0 | ADL2 1 | ADL3 0 | ADL4 0 | ADL5 1 | Store "1" when operation is passed |
| | BDL0 1 | BDL1 1 | BDL2 1 | BDL3 0 | BDL4 0 | BDL5 1 | |
| | CDL0 1 | CDL1 1 | CDL2 1 | CDL3 1 | CDL4 1 | CDL5 0 | |
| | SDL0 x | SDL1 0 | SDL2 1 | SDL3 x | SDL4 x | SDL5 x | SDL=SEN |
| | SEN0 x | SEN1 0 | SEN2 1 | SEN3 x | SEN4 x | SEN5 x | A-verify operation (1: passed; 0: failed) |
| | Non-eligible | | | Non-eligible | Non-eligible | Non-eligible | |
| | BL0 | BL1 | BL2 | BL3 | BL4 | BL5 | |

FIG. 18

| | Er | A | A | B | B | E | |
|---|---|---|---|---|---|---|---|
| Write data | | | | | | | |
| | XDL0 x | XDL1 x | XDL2 x | XDL3 x | XDL4 x | XDL5 x | |
| | ADL0 1 | ADL1 0 | ADL2 1 | ADL3 0 | ADL4 1 | ADL5 1 | Store "1" when operation is passed |
| | BDL0 1 | BDL1 1 | BDL2 1 | BDL3 0 | BDL4 1 | BDL5 1 | Store "1" when operation is passed |
| | CDL0 1 | CDL1 1 | CDL2 1 | CDL3 1 | CDL4 1 | CDL5 0 | |
| | SDL0 x | SDL1 x | SDL2 x | SDL3 0 | SDL4 1 | SDL5 x | SDL=SEN |
| | SEN0 x | SEN1 x | SEN2 x | SEN3 0 | SEN4 1 | SEN5 x | B-verify operation |
| | BL0 | BL1 | BL2 | BL3 | BL4 | BL5 | |
| | Non-eligible | Non-eligible | Non-eligible | | | Non-eligible | |
| | Er | Write operation not ended | Write operation ended | Write operation not ended | Write operation ended | Write operation not ended | |

F I G. 20

| | Er | A | A | B | B | E |
|---|---|---|---|---|---|---|
| Write data | | | | | | Store write data when XDL = 0, and write operation has not ended |
| | XDL0 \| 1 | XDL1 \| 0 | XDL2 \| 0 | XDL3 \| 0 | XDL4 \| 0 | XDL5 \| 1 |
| | ADL0 \| 1 | ADL1 \| 0 | ADL2 \| 1 | ADL3 \| 0 | ADL4 \| 1 | ADL5 \| 1 |
| | BDL0 \| 1 | BDL1 \| 1 | BDL2 \| 1 | BDL3 \| 0 | BDL4 \| 1 | BDL5 \| 1 |
| | CDL0 \| 1 | CDL1 \| 1 | CDL2 \| 1 | CDL3 \| 1 | CDL4 \| 1 | CDL5 \| 0 |
| | SDL0 \| x | SDL1 \| x | SDL2 \| x | SDL3 \| x | SDL4 \| x | SDL5 \| x |
| | SEN0 \| x | SEN1 \| x | SEN2 \| x | SEN3 \| x | SEN4 \| x | SEN5 \| x |
| | BL0 | BL1 | BL2 | BL3 | BL4 | BL5 |
| | Er | Write operation not ended | Write operation ended | Write operation not ended | Write operation ended | Write operation not ended |

F I G. 21

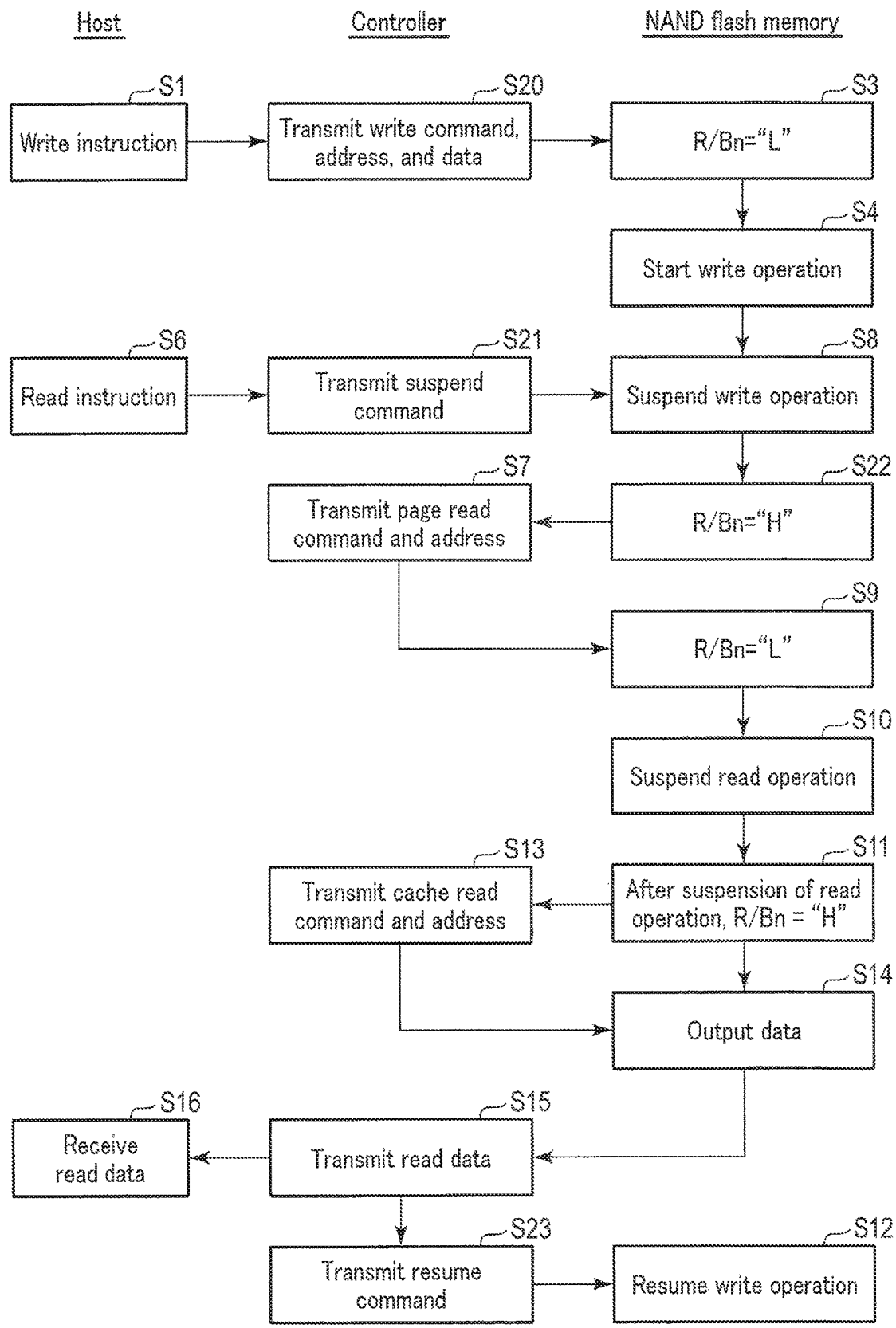
F I G. 22

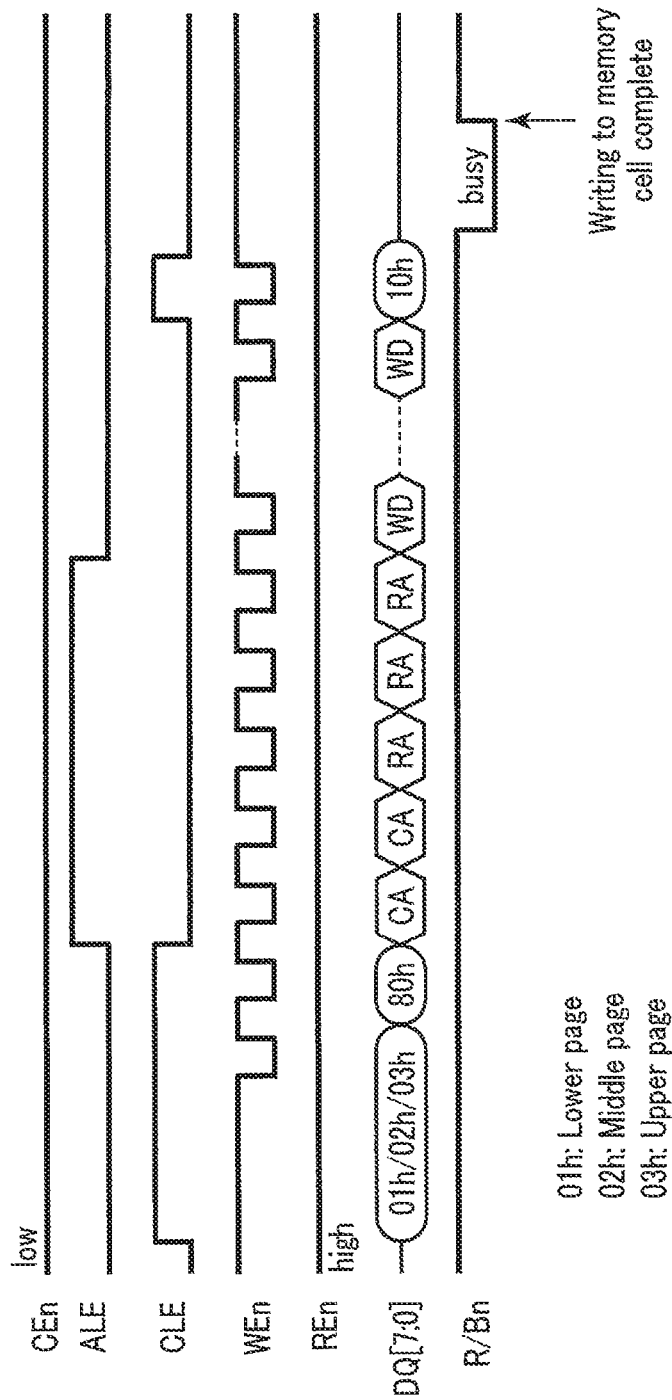
F I G. 25

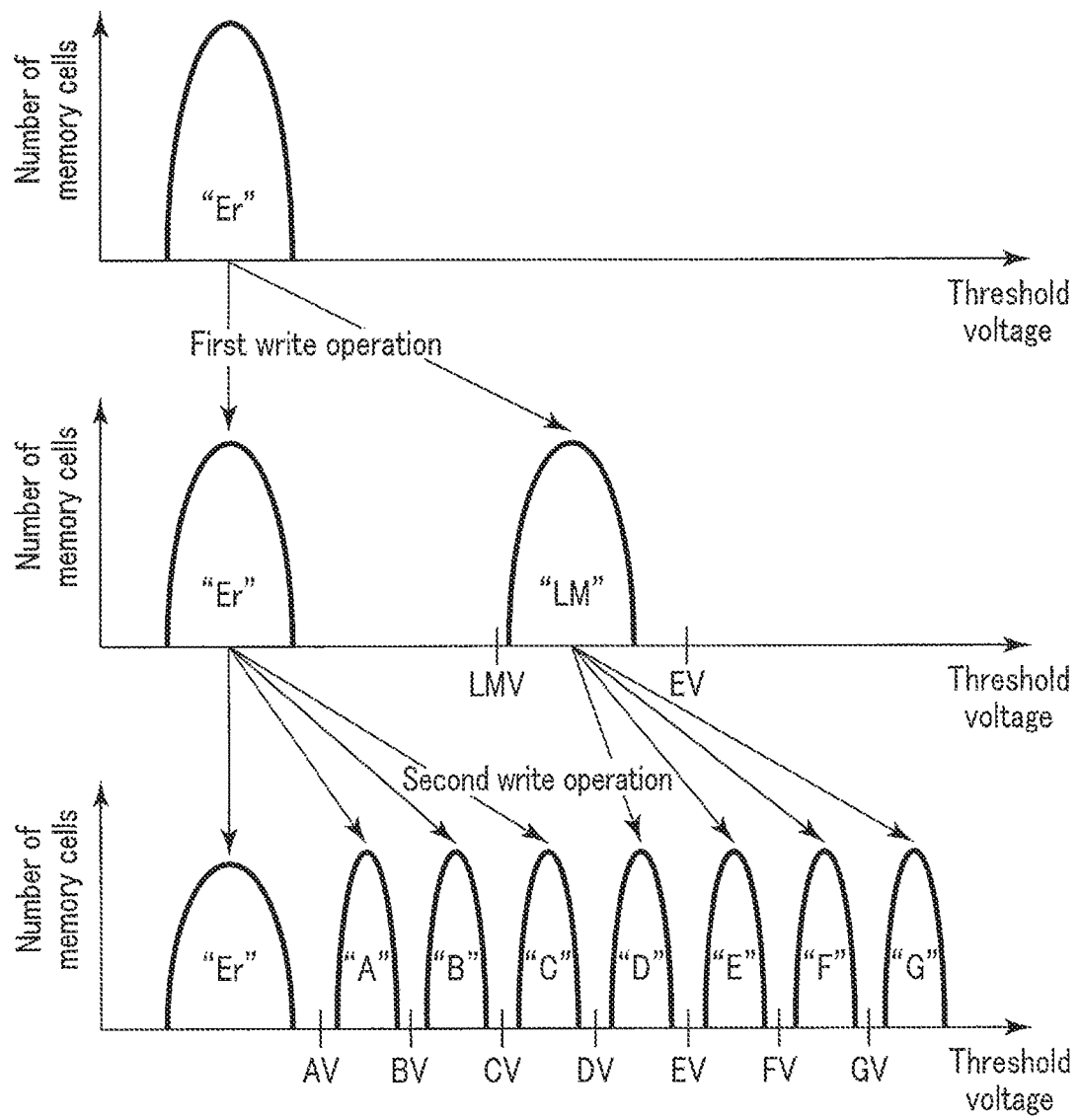
F I G. 27

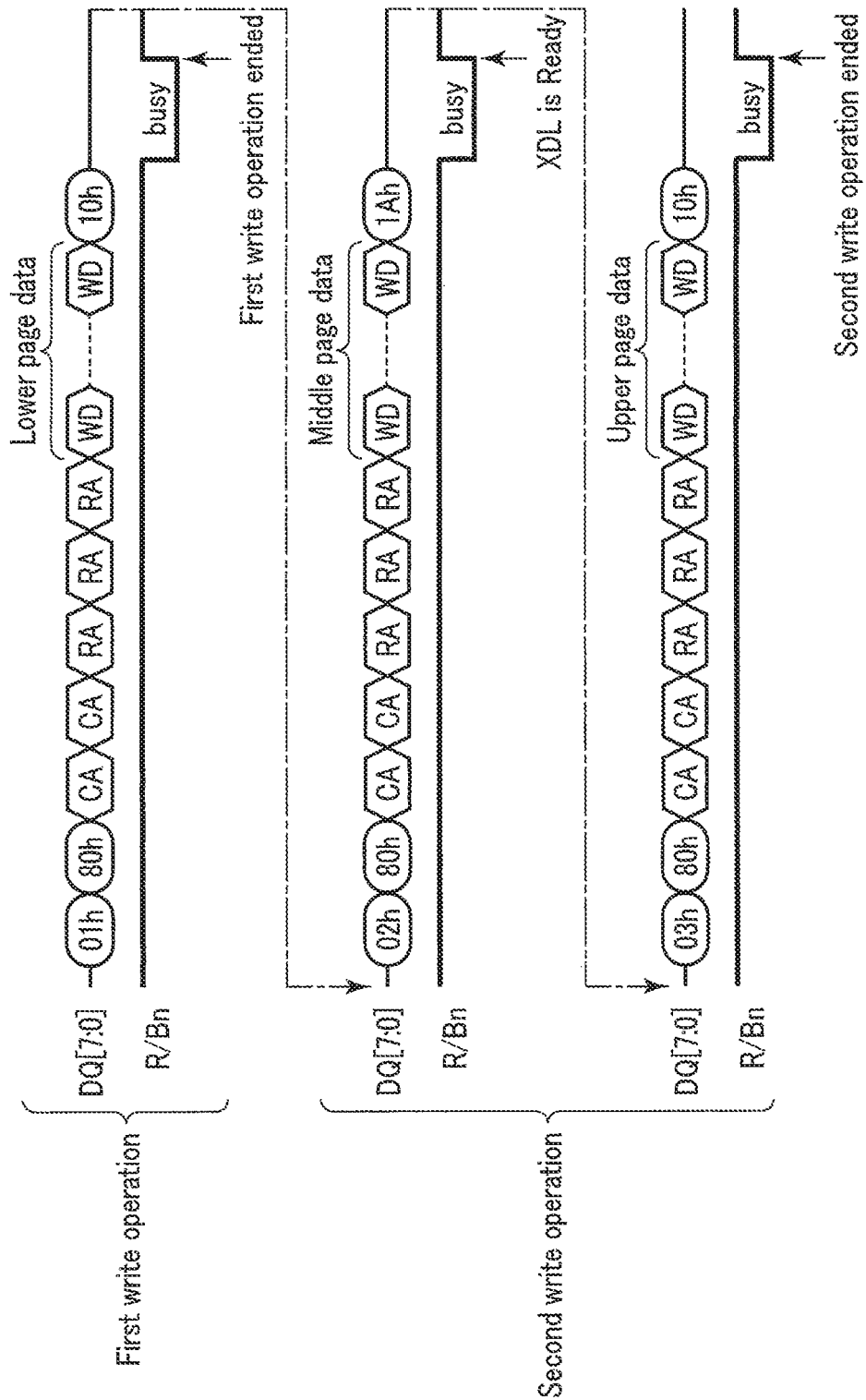
F I G. 28

First write instruction (Input in ADL)
| First write operation | Er | | | | LM | | | | Latch |
|---|---|---|---|---|---|---|---|---|---|
| Second write operation | Er | A | B | C | D | E | F | G | |
| Lower page | 1 | 1 | 1 | 1 | 0 | 0 | 0 | 0 | ADL |
| Middle page | x | x | x | x | x | x | x | x | BDL |
| Upper page | x | x | x | x | x | x | x | x | CDL |
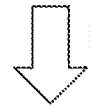 Execute first write operation
| First write operation | Er | | | | LM | | | | Latch |
|---|---|---|---|---|---|---|---|---|---|
| Second write operation | Er | A | B | C | D | E | F | G | |
| Lower page | 1 | 1 | 1 | 1 | 1 | 1 | 1 | 1 | ADL |
| Middle page | x | x | x | x | x | x | x | x | BDL |
| Upper page | x | x | x | x | x | x | x | x | CDL |
F I G. 31

⬇ Second write instruction
(Input in BDL and CDL)

| First write operation | Er | | | | LM | | | | Latch |
|---|---|---|---|---|---|---|---|---|---|
| Second write operation | Er | A | B | C | D | E | F | G | |
| Lower page | 1 | 1 | 1 | 1 | 1 | 1 | 1 | 1 | ADL |
| Middle page | 1 | 0 | 1 | 0 | 1 | 0 | 1 | 0 | BDL |
| Upper page | 1 | 1 | 0 | 0 | 1 | 1 | 0 | 0 | CDL |

⬇ IDL (1-3-3 Code)

| First write operation | Er | | | | LM | | | | Latch |
|---|---|---|---|---|---|---|---|---|---|
| Second write operation | Er | A | B | C | D | E | F | G | |
| Lower page | 1 | 1 | 1 | 1 | 0 | 0 | 0 | 0 | ADL |
| Middle page | 1 | 0 | 1 | 0 | 1 | 0 | 1 | 0 | BDL |
| Upper paget | 1 | 1 | 0 | 0 | 1 | 1 | 0 | 0 | CDL |

⬇

Second write operation

FIG. 32

SEMICONDUCTOR MEMORY DEVICE

CROSS-REFERENCE TO RELATED APPLICATIONS

This application is a Continuation Application of PCT Application No. PCT/JP2017/038204, filed Oct. 23, 2017, and based upon and claiming the benefit of priority from Japanese Patent Application No. 2017-144465, filed Jul. 26, 2017, the entire contents of all of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram of a memory system including a semiconductor memory device according to a first embodiment;

FIG. 5 is a circuit diagram of a sense amplifier unit included in the semiconductor memory device according to the first embodiment;

FIG. 8 is a timing chart of various interconnects and various signals during a read operation in the semiconductor memory device according to the first embodiment;

FIG. 12 is a timing chart of various signals during a write operation in a memory system including the semiconductor memory device according to the first embodiment;

FIG. 13 is a timing chart of a full sequence in the memory system including the semiconductor memory device according to the first embodiment;

FIG. 14 is a timing chart of various interconnects during a write operation in the semiconductor memory device according to the first embodiment;

FIG. 15 is a timing chart illustrating an example of a write operation including a same page suspend read operation in a memory system which includes the semiconductor memory device according to the first embodiment;

FIG. 17 is a diagram showing an example of data held by the latch circuits SDL, ADL, BDL, CDL, and XDL, in a write operation, in the semiconductor memory device according to the first embodiment;

FIG. 18 is a diagram showing an example of data held by the latch circuits SDL, ADL, BDL, CDL, and XDL, in a write operation, in the semiconductor memory device according to the first embodiment;

FIG. 20 is a diagram showing an example of data held by the latch circuits SDL, ADL, BDL, CDL, and XDL, in a write operation, in the semiconductor memory device according to the first embodiment;

FIG. 21 is a diagram showing an example of data held by the latch circuits SDL, ADL, BDL, CDL, and XDL, in a write operation, in the semiconductor memory device according to the first embodiment.

FIG. 22 is a flowchart of a write operation of a memory system including a semiconductor memory device according to a second embodiment;

FIG. 25 is a timing chart of various signals during a write operation in a memory system including the semiconductor memory device according to the second embodiment;

FIG. 27 is a diagram showing threshold distributions of memory cell transistors during a first write operation and a second write operation in a semiconductor memory device according to a third embodiment;

FIG. 28 is a timing chart during a write operation of a memory system including the semiconductor memory device according to the third embodiment;

FIG. 31 is a diagram showing an example of data held by latch circuits ADL, BDL, and CDL during a first write operation in the semiconductor memory device according to the third embodiment; and FIG. 32 is a diagram showing an example of data held by the latch circuits ADL, BDL, and CDL in a second write operation in the semiconductor memory device according to the third embodiment.

DETAILED DESCRIPTION

Figure 2:
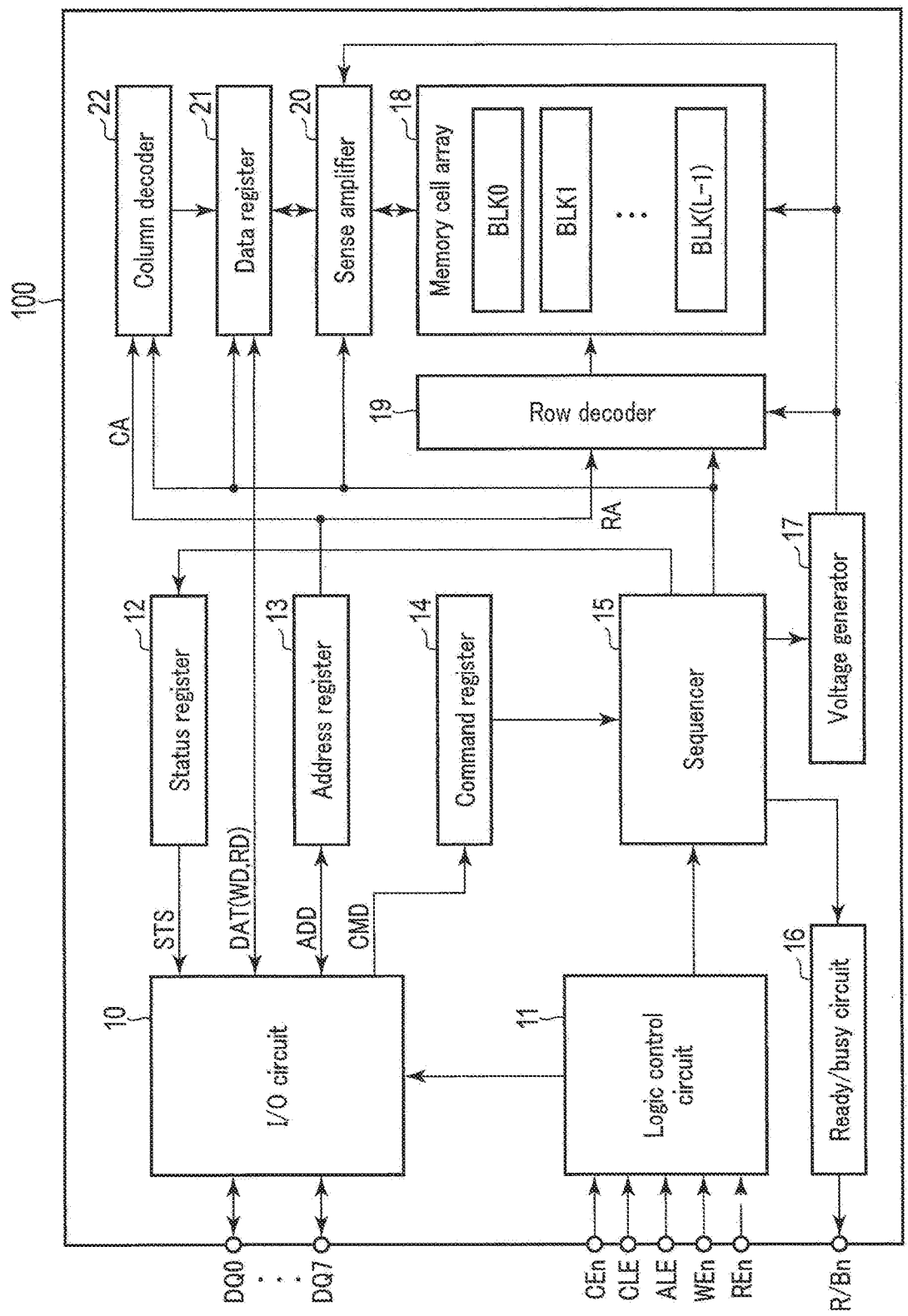
FIG. 2 is a block diagram of the semiconductor memory device according to the first embodiment.

The semiconductor memory device according to the embodiment includes a first memory string including a first memory cell and a first selection transistor coupled to the first memory cell; a second memory string including a second memory cell and a second selection transistor coupled to the second memory cell; a word line coupled to the gates of the first and second memory cells; a first selection gate line coupled to a gate of the first selection transistor; a second selection gate line coupled to a gate of the second selection transistor; a bit line coupled to the first and second selection transistors; a row decoder coupled to the word line, the first selection gate line, and the second selection gate line; a sense amplifier coupled to the bit line and including a latch circuit capable of holding write data; a data register coupled to the sense amplifier to transmit and receive data to and from the sense amplifier; and a control circuit capable of suspending a write operation of the first memory cell to perform a read operation of the first memory cell when receiving a read instruction of the first memory cell during the write operation of the first memory cell. In the read operation of the first memory cell performed while suspending the write operation of the first memory cell, the row decoder is configured to apply a write voltage to the word line, and the sense amplifier transmits data read from the first memory cell to the data register as read data when the writing of the write data to the first memory cell is completed, and transmits the write data held by the latch circuit to the data register as the read data when the writing of the write data to the first memory cell is not completed.

Hereinafter, embodiments will be described with reference to the drawings. In the description, common parts throughout the drawings are denoted by common reference symbols.

1. First Embodiment

A semiconductor memory device according to a first embodiment will be described. As an example of a semiconductor memory device, a three-dimensionally stacked NAND flash memory with memory cell transistors stacked above a semiconductor substrate will be described below.

The semiconductor memory device according to the present embodiment has a function to stop (hereinafter also referred to as "suspend") a write operation once, for example, a read command is received from an external device during the write operation of data; and to restart (hereinafter also referred to as "resume") the write operation after the execution of the read operation. Furthermore, in the following description, the term "same data" does not necessarily refer to data that coincide exactly, and, for example, allows for an error that can be corrected by, for example, an ECC technique, etc.

1.1 Configuration

1.1.1 Overall Configuration of Memory System

First, an overall configuration of a memory system including the semiconductor memory device according to the present embodiment will be described with reference to FIG. 1.

As shown in FIG. 1, a memory system 1 includes a NAND flash memory 100 and a controller 200. For example, the controller 200 and the NAND flash memory 100 may constitute one semiconductor memory device by a combination thereof, and examples thereof include a memory card, such as an SD™ card, and an SSD (solid state drive).

The NAND flash memory 100 includes a plurality of memory cell transistors and stores data in a nonvolatile manner. The NAND flash memory 100 is coupled to the controller 200 via a NAND bus and operates based on an instruction from the controller 200. More specifically, the NAND flash memory 100 transmits and receives, for example, 8-bit signals DQ0 to DQ7 (hereinafter, when not limiting DQ0 to DQ7, they are simply referred to as "signal DQ" or "signal DQ [7:0]") to and from the controller 200. The signals DQ0 to DQ7 include, for example, data, addresses, and commands. The NAND flash memory 100 receives, from the controller 200, for example, a chip enable signal CEn, a command latch enable signal CLE, an address latch enable signal ALE, a write enable signal WEn, and a read enable signal REn. Then, the NAND flash memory 100 transmits a ready/busy signal R/Bn to the controller 200.

The chip enable signal CEn is a signal to enable the NAND flash memory 100, and is asserted, for example, at a low ("L") level. The command latch enable signal CLE is a signal indicating that the signal DQ is a command, and is asserted at, for example, a high ("H") level. The address latch enable signal ALE is a signal indicating that the signal DQ is an address, and is asserted, for example, at the "H" level. The write enable signal WEn is a signal to load a received signal into the NAND flash memory 100, and is asserted, for example, at the "L" level every time a command, an address, data, and others are received from the controller 200. Thus, the signal DQ is loaded into the NAND flash memory 100 every time WEn is toggled. The read enable signal REn is a signal for the controller 200 to read data from the NAND flash memory 100. The read enable signal REn is asserted, for example, at the "L" level. The ready/busy signal R/Bn is a signal indicating whether the NAND flash memory 100 is in a busy or ready state (whether the NAND flash memory 100 is unready or ready to receive a command from the controller 200). For example, when the NAND flash memory 100 is busy, the ready/busy signal R/Bn is set to the "L" level.

The controller 200 instructs the NAND flash memory 100 to perform data read, write, erase operations, etc., in response to the instruction from the host device 2. The controller 200 manages a memory space of the NAND flash memory 100.

The controller 200 includes a host interface circuit 210, an internal memory (RAM) 220, a processor (CPU) 230, a buffer memory 240, a NAND interface circuit 250, and an error check and correction (ECC) circuit 260.

The host interface circuit 210 is coupled to the host device 2 via a controller bus and manages communication with a host device 2. The host interface circuit 210 transfers instructions and data received from the host device 2 to the processor 230 and the buffer memory 240. The host interface circuit 210 transfers data within the buffer memory 240 to the host device 2, in response to an instruction from the processor 230.

The NAND interface circuit 250 is coupled to the NAND flash memory 100 via a NAND bus and manages communication with the NAND flash memory 100. The NAND interface circuit 250 transfers the instruction received from the processor 230 to the NAND flash memory 100. During a write operation, the NAND interface circuit 250 transfers write data within the buffer memory 240 to the NAND flash memory 100. Furthermore, during a read operation, the NAND interface circuit 250 transfers the data read from the NAND flash memory 100 to the buffer memory 240.

The processor 230 controls the entire operation of the controller 200. Also, the processor 230 issues various commands in response to instructions from the host device 2 and transmits them to the NAND flash memory 100. For example, when the processor 230 receives a write instruction from the host device 2, the processor 230 transmits a write instruction to the NAND flash memory 100 in response to the write instruction. The same applies to read and erase operations. Furthermore, the processor 230 executes various kinds of processing for managing the NAND flash memory 100, such as wear leveling. Furthermore, the processor 230 executes various types of arithmetic operations, for example, data encryption processing and randomizing processing, etc.

The ECC circuit 260 executes error checking and correction (ECC) processing.

The internal memory 220 is a semiconductor memory, such as a DRAM, and is used as a working area of the processor 230. The internal memory 220 holds firmware to manage the NAND flash memory 100, various management tables, and others.

1.1.2 Configuration of Semiconductor Memory Device

Next, the configuration of the semiconductor memory device will be described with reference to FIG. 2. In FIG. 2, part of the coupling between blocks is indicated by directional lines, but coupling between blocks is not limited thereto.

As shown in FIG. 2, the NAND flash memory 100 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input and output of signals DQ to and from the controller 200. More specifically, the input/output circuit 10 includes an input circuit and an output circuit. The input circuit transmits data DAT (write data WD) received from the controller 200 to the data register 21, transmits an address ADD received from the controller 200 to the address register 13, and transmits a command CMD received from the controller 200 to the command register 14. The output circuit transmits, to the controller 200, status information STS received from the status register 12, data DAT (read data RD) received from the data register 21, and address ADD received from the address register 13.

The logic controller 11 receives, from the controller 200, for example, a chip enable signal CEn, a command latch enable signal CLE, an address latch enable signal ALE, a write enable signal WEn, and a read enable signal REn. The logic controller 11 controls the input/output circuit 10 and the sequencer 15 according to a received signal.

The status register 12 temporarily holds status information STS, for example, in data write, read, and erase operations, and notifies the controller 200 whether or not the operations have ended properly.

The address register 13 temporarily holds an address ADD received from the controller 200 via the input/output circuit 10. The address register 13 transfers a row address RA to the row decoder 19, and transfers a column address CA to the column decoder 22.

The command register 14 temporarily stores a command CMD received from the controller 200 via the input/output circuit 10 and transfers it to the sequencer 15.

The sequencer 15 controls the entire operation of the NAND flash memory 100. More specifically, the sequencer 15 controls, for example, the status register 12, the ready/busy circuit 16, the voltage generator 17, the row decoder 19, the sense amplifier 20, the data register 21, and the column decoder 22, etc., based on the commands CMD held by the command register 14, thereby performing write, read, and erase operations, etc. The sequencer 15 includes a register (not shown). For example, the register holds suspend information when a write operation is suspended. The sequencer 15 resumes the write operation based on the suspend information held by the register.

The ready/busy circuit 16 transmits the ready/busy signal R/Bn to the controller 200 according to the operation status of the sequencer 15.

The voltage generator 17 generates voltages necessary for write, read, and erase operations based on the control of the sequencer 15, and supplies the generated voltages to the memory cell array 18, the row decoder 19, the sense amplifier 20, etc. The row decoder 19 and the sense amplifier 20 apply the voltage supplied from the voltage generator 17 to the memory cell transistors in the memory cell array 18.

The memory cell array 18 includes a plurality of blocks BLK (BLK0, BLK1, ..., BLK (L−1)) (L is an integer of 2 or more) including nonvolatile memory cell transistors corresponding to rows and columns (hereinafter also referred to as "memory cells"). Each block BLK includes a plurality of string units SU (SU0, SU1, SU2, SU3, ...). Each string unit SU includes a plurality of NAND strings SR. The number of blocks BLK in the memory cell array 18 and the number of string units SU in the blocks BLK are arbitrary. Details of the memory cell array 18 will be described later.

The row decoder 19 decodes a row address RA. The row decoder 19 selects one of the blocks BLK and further selects one of the string units SU, based on a decoding result. The row decoder 19 then applies a necessary voltage to the block BLK.

The sense amplifier 20 senses data read from the memory cell array 18 during a read operation. The sense amplifier 20 transmits read data RD to the data register 21. The sense amplifier 20 transmits write data WD to the memory cell array 18 during a write operation.

The data register 21 includes a plurality of latch circuits. The latch circuit holds write data WD and read data RD. For example, in a write operation, the data register 21 temporarily holds write data WD received from the input/output circuit 10 and transmits it to the sense amplifier 20. For example, in a read operation, the data register 21 temporarily holds read data RD received from the sense amplifier 20 and transmits it to the input/output circuit 10.

The column decoder 22 decodes a column address CA in write, read, and erase operations, for example, and selects a latch circuit in the data register 21 based on a result of the decoding.

1.1.3 Configuration of Memory Cell Array

Next, the configuration of the memory cell array 18 will be described with reference to FIG. 3. Although the example in FIG. 3 shows a block BLK0, the configuration of the other blocks BLK is the same.

Figure 3:
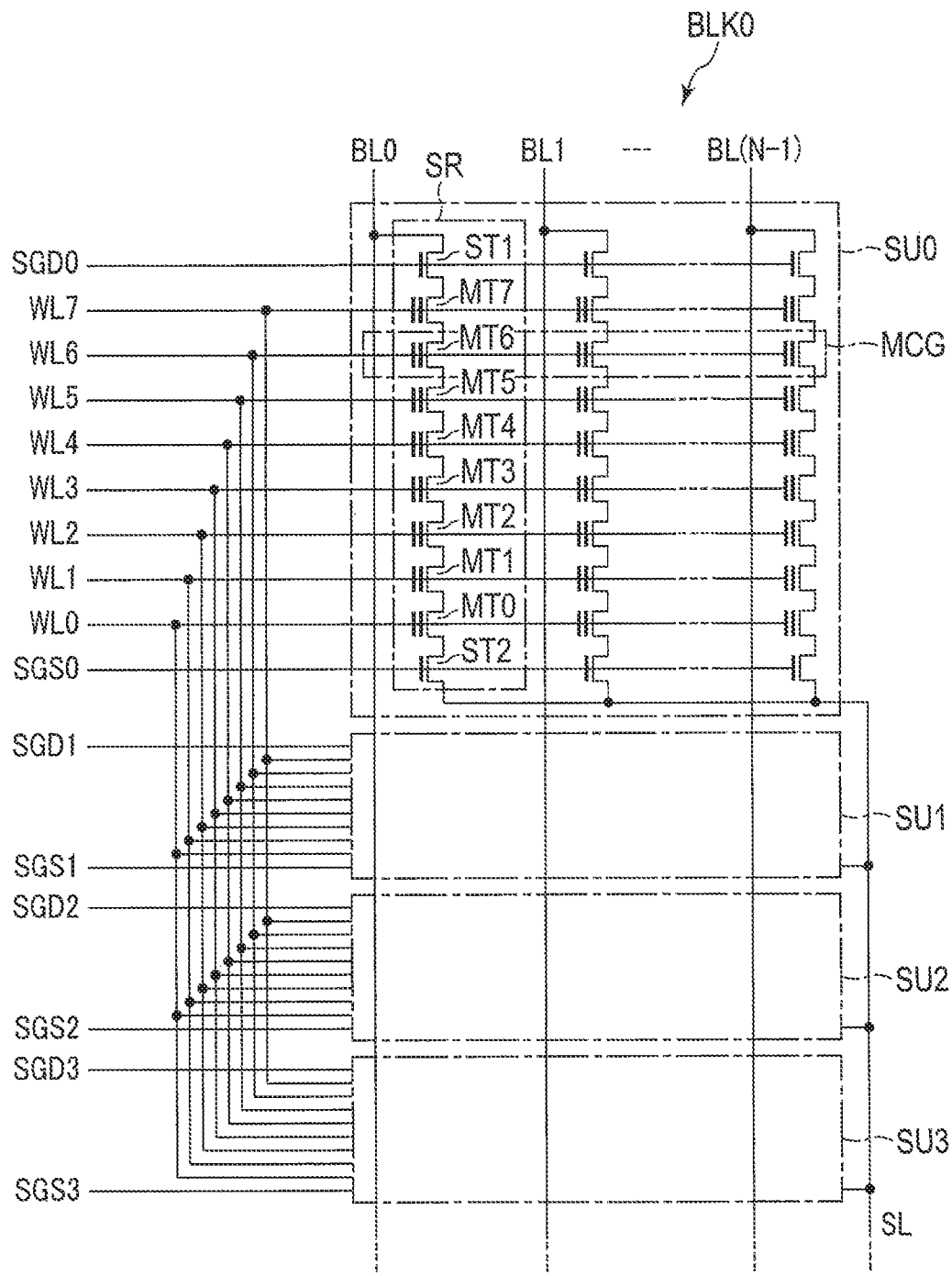
FIG. 3 is a circuit diagram of a memory cell array included in the semiconductor memory device according to the first embodiment.

As shown in FIG. 3, the block BLK0 includes, for example, four string units SU (SU0 to SU3). Each string unit SU includes a plurality of NAND strings SR. Each of the NAND strings SR includes, for example, eight memory cell transistors MT0 to MT7 and selection transistors ST1 and ST2. Hereinafter, the memory cell transistors MT0 to MT7 will be referred to as "memory cell transistor MT" unless otherwise specified. The memory cell transistor MT includes a control gate and a charge storage layer, and holds data in a nonvolatile manner.

The memory cell transistor MT may be a MONOS type that uses an insulating film for a charge storage layer, or an FG type that uses an electric conductive layer for the charge storage layer. Hereinafter, in the present embodiment, the MONOS type is described below by way of example. The number of the memory cell transistors MT is not limited to 8, and may be, but not exclusively, for example, 16, 32, 64, 128, or the like. Moreover, any number of selection transistors ST1 and any number of selection transistors ST2 are provided, and only one or more selection transistors ST1 and one or more selection transistors ST2 need to be provided.

The memory cell transistors MT are coupled in series between a source of the selection transistor ST1 and a drain of the selection transistor ST2. More specifically, the memory cell transistors MT0 to MT7 have their electric current paths coupled in series. Therefore, a drain of the memory cell transistor MT7 is coupled to the source of the selection transistor ST1, and a source of the memory cell transistor MT0 is coupled to the drain of the selection transistor ST2.

A gate of the selection transistor ST1 in each of the string units SU0 to SU3 is coupled to each of selection gate lines SGD0 to SGD3. Similarly, a gate of the selection transistor ST2 in each of the string units SU0 to SU3 is coupled to each of selection gate lines SGS0 to SGS3. The selection gate lines SGS0 to SGS3 will be hereinafter referred to as a "selection gate line SGD" unless otherwise specified. The selection gate lines SGS0 to SGS3 will be hereinafter referred to as a "selection gate line SGS" unless otherwise specified. The selection gate lines SGS0 to SGS3 of each of the string units SU may be coupled in common.

The control gates of the memory cell transistors MT0 to MT7 in the block BLK are coupled in common to word lines WL0 to WL7, respectively. The word lines WL0 to WL7 will be hereinafter referred to as a "word line WL" unless otherwise specified.

Drains of the selection transistors ST1 of each NAND string SR in the string unit SU are respectively coupled to different bit lines BL0 to BL(N-1) (N is an integer of 2 or more). The bit lines BL0 to BL (N-1) will be hereinafter referred to as a "bit line BL" unless otherwise specified. Each bit line BL couples, in common, a single NAND string SR in each of the string units SU among the blocks BLK. Furthermore, sources of the selection transistors ST2 are coupled to a source line SL in common. That is, the string unit SU is an aggregate of the NAND strings SR coupled to different bit lines BL and coupled to the same selection gate lines SGD and SGS. Also, the block BLK is an aggregate of the string units SU having the word line WL in common. The memory cell array 18 is an aggregate of the blocks BLK having the bit line BL in common.

Data write and read operations are performed in a batch for memory cell transistors MT coupled to one of the word lines WL in one of the string units SU. A group of memory cell transistors MT selected in a batch in data write and read operations will be hereinafter referred to as a "memory cell group MCG." A set of 1-bit data written to or read from one memory cell group MCG is referred to as a "page."

Data can be erased in units of block BLK or in units smaller than the block BLK. An erasing method is described in, for example, U.S. patent application Ser. No. 13/235,389 entitled "NONVOLATILE SEMICONDUCTOR MEMORY DEVICE" filed on Sep. 18, 2011. Another erasing method is described in U.S. patent application Ser. No. 12/694,690 entitled "NON-VOLATILE SEMICONDUCTOR STORAGE DEVICE" filed on Jan. 27, 2010. Yet another erasing method is described in U.S. patent application Ser. No. 13/483,610 entitled "NONVOLATILE SEMICONDUCTOR MEMORY DEVICE AND DATA ERASE METHOD THEREOF" filed on May 30, 2012. These patent applications are incorporated herein in their entireties by reference.

Furthermore, the memory cell array 18 may be laid out in some other configuration. The configuration of the memory cell array 18 is described in, for example, U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 18 is also described in U.S. patent application Ser. No. 12/406,524 entitled "THREE DIMENSIONAL STACKED NONVOLATILE SEMICONDUCTOR MEMORY" filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING SAME" filed on Mar. 23, 2009. These patent applications are incorporated herein in their entireties by reference.

1.1.4 Configurations of Sense Amplifier and Data Register

Next, the configurations of the sense amplifier 20 and the data register 21 will be described with reference to FIG. 4.

Figure 4:
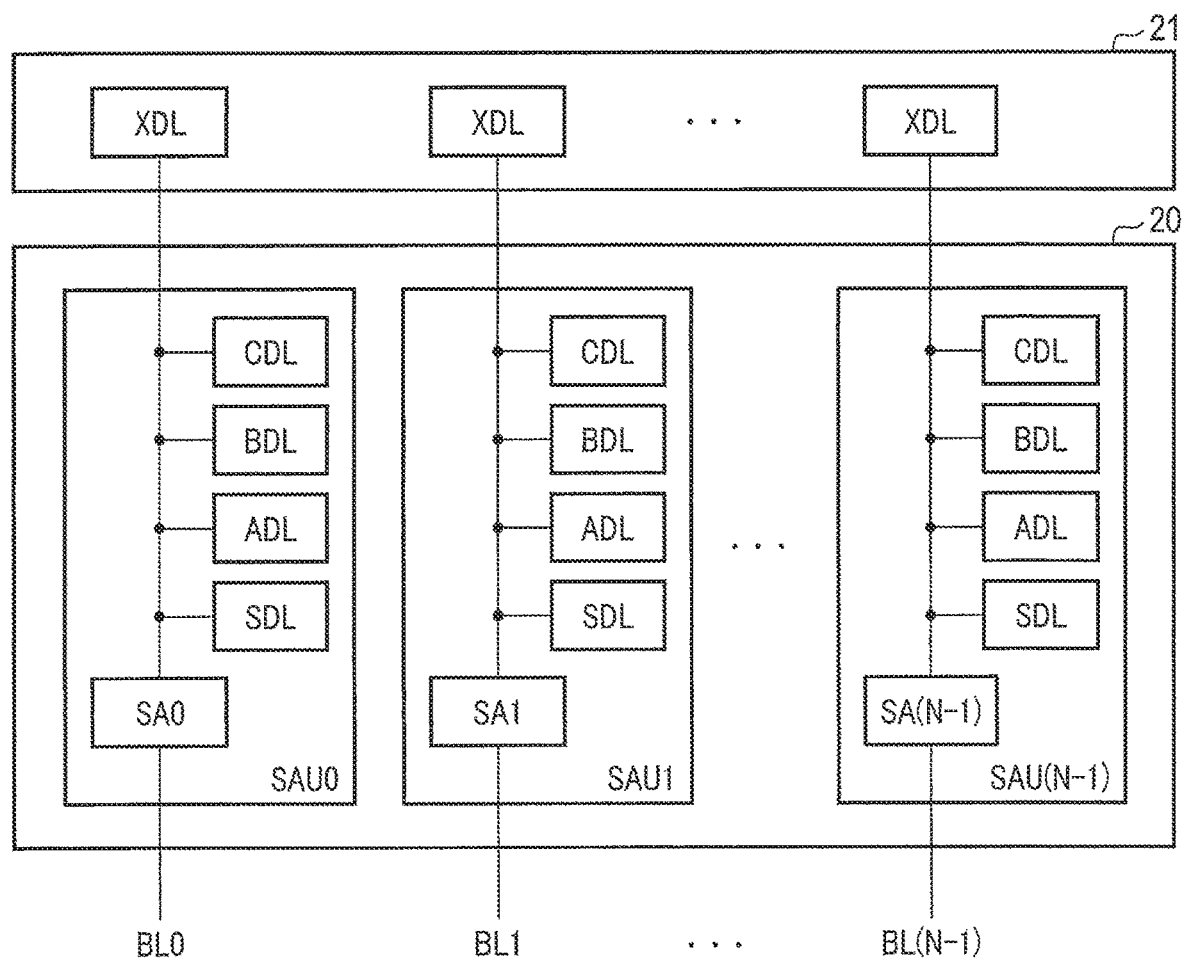
FIG. 4 is a block diagram of a sense amplifier and a data register included in the semiconductor memory device according to the first embodiment.

As shown in FIG. 4, the sense amplifier 20 includes sense amplifier units SAU0 to SAU(N-1) provided to respectively correspond to the bit lines BL0 to BL (N-1). Each sense amplifier unit SAU includes a sense circuit SA, latch circuits SDL, ADL, BDL, and CDL. The sense circuit SA, the latch circuits SDL, ADL, BDL, and CDL are coupled so as to be able to transmit and receive data to and from each other.

The sense circuit SA senses data read to the corresponding bit line BL during a read operation, and determines whether the data is "0" data or "1" data. The sense circuit SA applies voltage to a bit line BL based on write data WD.

The latch circuits SDL, ADL, BDL, and CDL temporarily hold write data WD, for example. The configuration of the sense amplifier unit SAU is not limited thereto, and various modifications can be made. The number of latch circuits included in the sense amplifier unit SAU can be discretionally changed, based, for example, on the number of bits of data held by one memory cell transistor MT.

The data register 21 includes a plurality of latch circuits XDL provided to correspond to each sense amplifier unit SAU. The latch circuit XDL temporarily holds read data RD received from the sense amplifier unit SAU and write data WD received from the input/output circuit 10. More specifically, the write data WD received by the input/output circuit 10 is transferred to one of the latch circuits SDL, ADL, BDL, CDL, or the sense circuit SA via the latch circuit XDL. The read data RD received from the sense amplifier unit SAU is transferred to the input/output circuit 10 via the latch circuit XDL.

1.1.5 Configuration of Sense Amplifier Unit

Next, details of the configuration of the sense amplifier unit SAU will be described with reference to FIG. 5. Although the sense amplifier unit SAU of an electric current sensing type that senses an electric current flowing through the bit line BL is described by way of example in the present embodiment, the sense amplifier unit SAU of a voltage sensing type may be used instead. In the following explanation, a source or drain of a transistor is referred to as "one end of the transistor", and the other is referred to as "the other end of the transistor".

As shown in FIG. 5, the sense amplifier unit SAU includes a sense circuit SA, four latch circuits (SDL, ADL, BDL, and CDL), a pre-charge circuit 30, and a bus switch 32.

The sense circuit SA includes a high breakdown voltage n-channel MOS transistor 40, low breakdown voltage n-channel MOS transistors 41 to 50, a low breakdown voltage p-channel MOS transistor 51, and a capacitance element 52.

A signal BLS is input to a gate of the transistor 40. One end of the transistor 40 is coupled to the corresponding bit line BL, and the other end of the transistor 40 is coupled to a node BLI.

A signal BLC is input to the gate of the transistor 41. One end of the transistor 41 is coupled to the node BLI, and the other end of the transistor 41 is coupled to a node SCOM. The transistor 41 clamps the corresponding bit line BL at a potential corresponding to the signal BLC.

A signal BLX is input to a gate of the transistor 42. One end of the transistor 42 is coupled to the node SCOM, and the other end of the transistor 42 is coupled to a node SSRC.

A gate of the transistor 43 is coupled to a node INV_S. One end of the transistor 43 is coupled to the node SSRC, and the other end of the transistor 43 is coupled to a node SRCGND. For example, a ground voltage VSS is applied to the node SRCGND.

A gate of the transistor 51 is coupled to the node INV_S. A power source voltage VDDSA is applied to one end of the transistor 51, and the other end of the transistor 51 is coupled to a node SSRC.

A signal XXL is input to a gate of the transistor 44. One end of the transistor 44 is coupled to the node SCOM, and the other end of the transistor 44 is coupled to a node SEN.

A signal HLL is input to a gate of the transistor 45. A voltage VSENP is applied to one end of the transistor 45, and the other end of the transistor 45 is coupled to the node SEN.

One electrode of the capacitance element 52 is coupled to the node SEN, and a clock signal CLK is input to the other electrode of the capacitance element 52.

A gate of the transistor 47 is coupled to the node SEN. One end of the transistor 47 is coupled to one end of the transistor 48, and the clock signal CLK is input to the other end of the transistor 47. The transistor 47 functions as a sense transistor that senses the voltage of the node SEN.

A signal STB is input to a gate of the transistor 48. The other end of the transistor 48 is coupled to a bus LBUS.

A signal BLQ is input to a gate of the transistor 46. One end of the transistor 46 is coupled to the node SEN, and the other end of the transistor 46 is coupled to the bus LBUS. For example, when the node SEN is charged through the bus LBUS, or when data of the latch circuit SDL, ADL, BDL, CDL, or XDL is transferred to the node SEN, the transistor 46 is turned on.

A gate of the transistor 49 is coupled to the bus LBUS. One end of the transistor 49 is coupled to one end of the transistor 50, and a voltage VLSA is applied to the other end of the transistor 49. The voltage VLSA may be, for example, a ground voltage VSS.

A signal LSL is input to a gate of the transistor 50. The other end of the transistor 50 is coupled to the node SEN.

During a write operation, the sense circuit SA controls the bit lines BL in accordance with the data held in the latch circuit SDL. The other latch circuits ADL, BDL, and CDL are used, for example, for a multivalued action in which the individual memory cell transistor holds data of 2 or more bits.

The latch circuit SDL includes low breakdown voltage n-channel MOS transistors 60 to 63 and low breakdown voltage p-channel MOS transistors 64 to 67.

A signal STL is input to a gate of the transistor 60. One end of the transistor 60 is coupled to the bus LBUS, and the other end of the transistor 60 is coupled to a node LAT_S.

A signal STI is input to a gate of the transistor 61. One end of the transistor 61 is coupled to the bus LBUS, and the other end of the transistor 61 is coupled to the node INV_S.

A gate of the transistor 62 is coupled to the node INV_S. One end of the transistor 62 is grounded, and the other end of the transistor 62 is coupled to the node LAT_S.

A gate of the transistor 63 is coupled to the node LAT_S. One end of the transistor 63 is grounded, and the other end of the transistor 63 is coupled to the node INV_S.

A gate of the transistor 64 is coupled to the node INV_S. One end of the transistor 64 is coupled to the node LAT_S, and the other end of the transistor 64 is coupled to one end of the transistor 66.

A gate of the transistor 65 is coupled to the node LAT_S. One end of the transistor 65 is coupled to the node INV_S, and the other end of the transistor 65 is coupled to one end of the transistor 67.

A signal SLL is input to a gate of the transistor 66. A power source voltage VDDSA is applied to the other end of the transistor 66.

A signal SLI is input to a gate of the transistor 67. The power source voltage VDDSA is applied to the other end of the transistor 67.

In the latch circuit SDL, a first inverter is formed by the transistors 62 and 64, and a second inverter is formed by the transistors 63 and 65. The latch circuit SDL holds data at the node LAT_S and holds its inverted data at the node INV_S.

Since the latch circuits ADL, BDL, and CDL have configurations similar to that of the latch circuit SDL, explanations thereof are omitted, but the reference symbol and signal names of the respective transistors are described below in a manner differentiated from those of the latch circuit SDL as shown in FIG. 5. The transistors 60 to 67 of the latch circuit SDL are equivalent to transistors 70 to 77 of the latch circuit ADL, transistors 80 to 87 of the latch circuit BDL, and transistors 90 to 97 of the latch circuit CDL, respectively. In each sense amplifier unit SAU, the sense circuit SA, and the four latch circuits SDL, ADL, BDL, and CDL are coupled by the bus LBUS so as to transmit and receive data to and from one another.

The pre-charge circuit 30 precharges the bus LBUS. The pre-charge circuit 30 includes a low breakdown voltage n-channel MOS transistor 31, for example. A signal LPC is input to a gate of the transistor 31. One end of the transistor 31 is coupled to the bus LBUS, and a voltage VHLB is applied to the other end of the transistor 31. The pre-charge circuit 30 precharges the bus LBUS by transferring the voltage VHLB to the bus LBUS.

The bus switch 32 couples the bus LBUS to a bus DBUS. That is, the bus switch 32 couples the sense circuit SA to the latch circuit XDL. The bus switch 32 includes, for example, a low breakdown voltage n-channel MOS transistor 33. A signal DSW is input to a gate of the transistor 33. One end of the transistor 33 is coupled to the bus LBUS, and the other end of the transistor 33 is coupled to the latch circuit XDL via the bus DBUS.

Various signals in the sense amplifier unit SAU having the above configuration are given by, for example, the sequencer 15.

1.2 Threshold Distributions of Memory Cell Transistor

Figure 6:
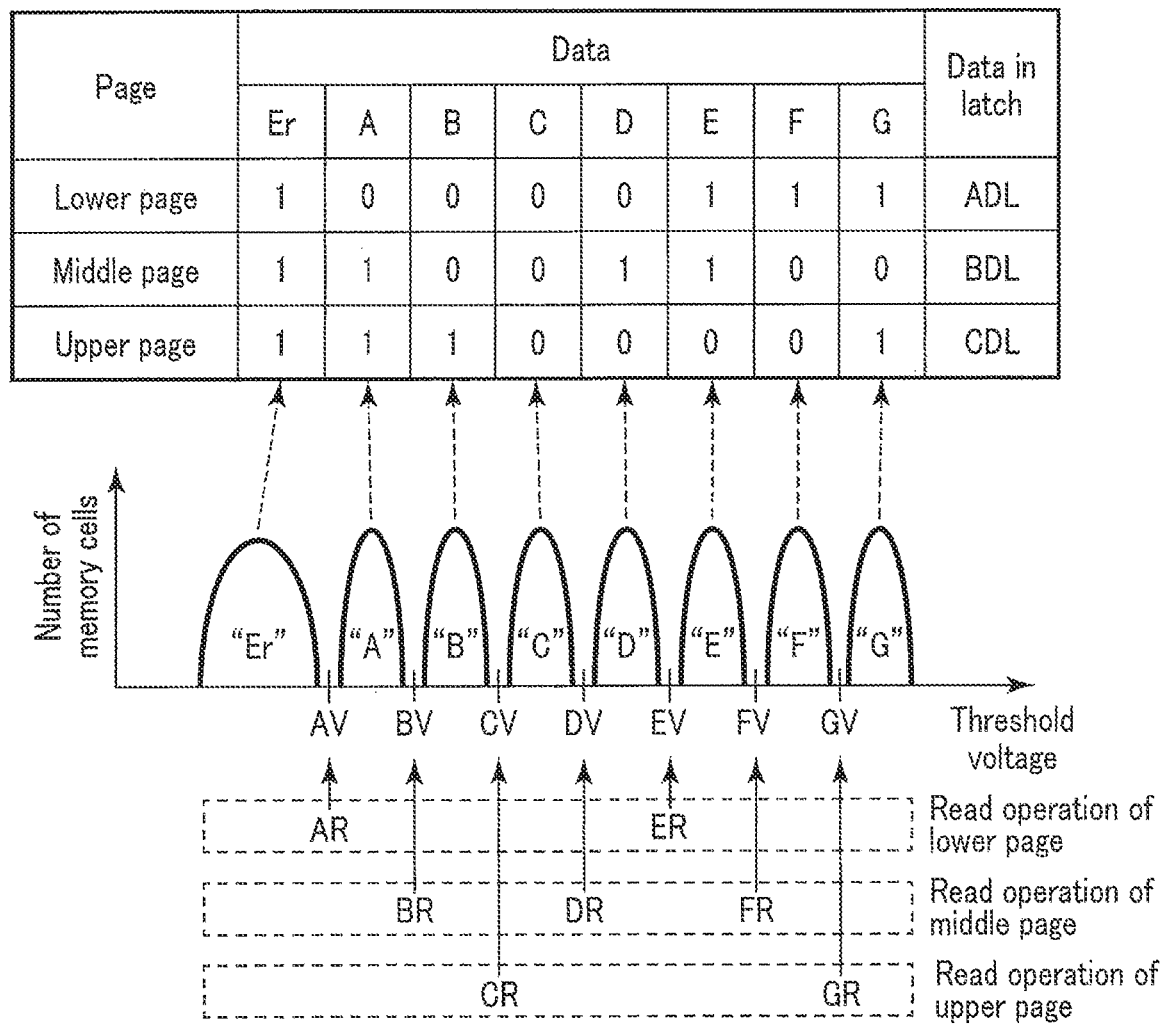
FIG. 6 is a threshold distribution diagram of memory cell transistors included in the semiconductor memory device according to the first embodiment.

Next, threshold distributions that may be taken by the memory cell transistor MT according to the present embodiment are described using FIG. 6. Although a case where the memory cell transistor MT is capable of holding 8-value (3-bit) data will be hereinafter described in the present embodiment, the data that can be held is not limited to 8 values. In the present embodiment, the memory cell transistor MT has only to be capable of holding data equal to or greater than two values (data of one or more bits).

As shown in the figure, the threshold voltage of each memory cell transistor MT takes a value included in any one of, for example, eight discrete distributions. In the following, these eight distributions are referred to as an "Er" state, an "A" state, a "B" state, a "C" state, a "D" state, an "E" state, an "F" state, and a "G" state, in ascending order of threshold voltages.

The "Er" state corresponds, for example, to an erase state of data. The "A" to "G" states correspond to a state where the charge storage layer is charged with electric charge and data is written therein. In a write operation, verify voltages corresponding to these respective threshold distributions are assumed to be AV, BV, CV, DV, EV, FV, and GV. Then, these voltage values have a relationship of AV<BV<CV<DV<EV<FV<GV.

More specifically, a threshold voltage included in the "Er" state is lower than the voltage AV. A threshold voltage included in the "A" state is equal to or higher than the voltage AV and lower than the voltage BV. A threshold voltage value included in the "B" state is equal to or higher than the voltage BV and lower than the voltage CV. A threshold voltage included in the "C" state is equal to or higher than the voltage CV and lower than the voltage DV. A threshold voltage included in the "D" state is equal to or higher than the voltage DV and lower than the voltage EV. A threshold voltage included in the "E" state is equal to or higher than the voltage EV and lower than the voltage FV. A threshold voltage included in the "F" state is equal to or higher than the voltage FV and lower than the voltage GV. A threshold voltage included in the "G" state is equal to or higher than the voltage GV.

As described above, the respective memory cell transistors MT can take eight kinds of states by possessing one of the eight threshold distributions. Each of the memory cell transistors MT can hold 3-bit data by allocating these states to "000" to "111" in binary notation. Each of the 3-bit data will be hereinafter referred to as an "upper bit", a "middle bit", and a "lower bit". Moreover, an aggregate of upper bits collectively written in (or collectively read to) the memory cell group MCG is referred to as an "upper page", an aggregate of middle bits is referred to as a "middle page", and an aggregate of lower bits is referred to as a "lower page".

In the example of FIG. 6, data is allocated to the memory cell transistors MT included in the respective threshold distributions as shown below.

"Er" state: "111" ("upper bit/middle bit/lower bit") data
"A" state: "110" data
"B" state: "100" data
"C" state: "000" data
"D" state: "010" data
"E" state: "011" data
"F" state: "001" data
"G" state: "101" data In a write operation, for example, lower bit data is stored in the latch circuit ADL of the sense amplifier unit SAU, middle bit data is stored in the latch circuit BDL of the sense amplifier unit SAU, and upper bit data is stored in the latch circuit CDL of the sense amplifier unit SAU.

With respect to the threshold distribution described above, a read voltage is set between adjacent threshold distributions. For example, a read voltage AR, for determining whether a certain memory cell transistor MT has a threshold voltage of the "Er" state or a threshold voltage of the "A" state or higher, is set between the maximum threshold voltage in the "Er" state and the minimum threshold voltage in the "A" state. The read voltage BR, for determining whether a certain memory cell transistor MT has a threshold voltage of the "A" state or a threshold voltage of the "B" state or higher, is set between the maximum threshold voltage in the "A" state and the minimum threshold voltage in the "B" state. The other read voltages CR, DR, ER, FR, and GR are set in the same manner as the read voltages AR and BR. The read voltages AR, BR, CR, DR, ER, FR, and GR have a relationship of AR<BR<CR<DR<ER<FR<GR. A voltage VREAD is set to a voltage higher than the maximum threshold voltage in the "G" state threshold distribution. The voltage VREAD is a voltage applied to the non-selected word lines WL during a read operation. The memory cell transistor MT having the voltage VREAD applied to the control gate is turned on regardless of the data held therein.

In a read operation, data in a lower page is determined by a result of the read operation with use of the voltages AR and ER. Data in a middle page is determined by a result of the read operation with use of the voltages BR, DR, and FR. Data in an upper page is determined by a result of the read operation with use of the voltages CR and GR. That is, lower page data, middle page data, and upper page data are determined by twice, three times, and twice of the read operation, respectively. Such data allocation is hereinafter referred to as "2-3-2 code".

With respect to various verify voltages and read voltages set between the respective threshold distributions, either the same voltage value may be set, or different voltage values may be set.

The example in FIG. 6 describes a case where the eight states are discretely distributed, for example, in an ideal state immediately after data writing. Therefore, adjacent states may overlap in reality. For example, there may be a case where after the writing of data, the upper end of the "Er" state overlaps the lower end of the "A" state because of disturbance, etc. In this case, for example, the ECC technique is used to correct the data.

Furthermore, the allocation of data to the "Er" to "G" states is not limited to the 232 code.

1.3 Read Operation

Next, a read operation will be described. A read operation roughly includes page read operation and cache read operation. The page read operation is an operation of reading data from a memory cell transistor MT to the data register 21 (latch circuit XDL), and the cache read operation is an operation of reading data from the data register 21 to the controller 200.

1.3.1 Operation of Controller in Read Operation

First, the operation of the controller in a read operation will be described with reference to FIG. 7. The example in FIG. 7 shows a read operation in a normal state (not including suspension and resumption of a write operation), for the sake of simplicity.

Figure 7:
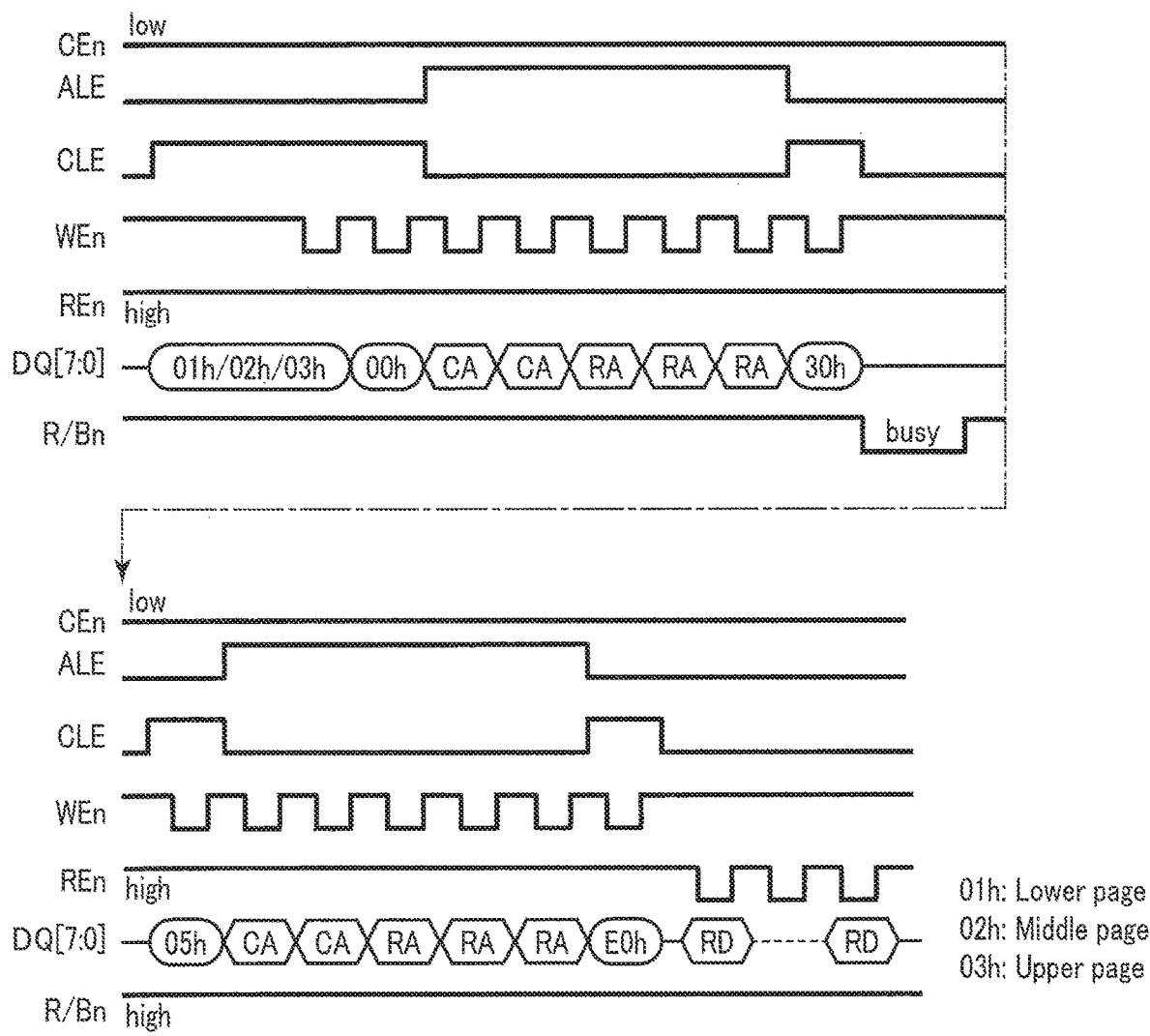
FIG. 7 is a timing chart of various signals during a read operation in a memory system including the semiconductor memory device according to the first embodiment.

As shown in FIG. 7, the controller 200 first transmits a command that designates any one of a lower page ("01h"), a middle page ("02h"), and an upper page ("03h") and a command "00h" providing notification that page read operation is to be executed, to the NAND flash memory 100. It then sets a command latch enable signal CLE to the "H" level and asserts it.

Next, the controller 200 transmits an address "ADD", sets an address latch enable signal ALE to the "H" level, and asserts it. Although the example in FIG. 7 refers to a case where a column address CA is transmitted for 2 cycles and then a row address RA is transmitted for 3 cycles, the cycles of a column address CA and a row address RA may be set discretionally. Furthermore, the commands 01h, 02h, and 03h for designating a page may be omitted, and the column address CA may include a page address corresponding to the lower, middle, or upper page.

Furthermore, the controller 200 transmits a page read command "30h" instructing execution of page read operation, sets the command latch enable signal CLE to the "H" level, and asserts it.

The NAND flash memory 100 comes into the busy state (R/Bn="L") in response to a page read command "30h", and starts page read operation. The NAND flash memory 100 comes into the ready state when data reading to the data register 21 (latch circuit XDL) is completed, and the signal R/Bn is set to the "H" level.

After confirming that the signal R/Bn has returned to the "H" level (ready state), the controller 200 transmits, to the NAND flash memory 100, a command "05h" notifying that cache read operation is to be executed, sets the command latch enable signal CLE to the "H" level, and asserts it.

Next, the controller 200 transmits the column address CA as the address "ADD" for two cycles, transmits the row address RA for three cycles, sets the address latch enable signal ALE to the "H" level, and asserts it. In cache read operation, the row address RA may be omitted.

Next, the controller 200 transmits a cache read command "E0h" instructing the execution of cache read operation, sets the command latch enable signal CLE to the "H" level, and asserts it.

The NAND flash memory 100 starts cache read operation in response to the cache read command "E0h". More specifically, the NAND flash memory 100 transmits read data RD to the controller 200 based on a read enable signal REn received from the controller 200.

1.3.2 Voltage of Each Interconnect in Page Reading

Next, the voltage of each interconnect in page read operation will be described with reference to FIG. 8. The example in FIG. 8 shows a case where the reading of a single state (for example, "A" state) is executed, for the sake of simplicity. For example, when the page read operation of a plurality of states is to be executed, the read voltage VCGRV corresponding to each of the states is applied to selected word lines WL. The voltage VCGRV is a voltage corresponding to the threshold voltage level of data to be read. More specifically, the reading of data in the "A" state and "E" state is executed in the reading of a lower page. When reading data in the "A" state, the voltage AR is applied as the read voltage VCGRV to the selected word line WL, and when reading data in the "E" state, a voltage ER is applied as the read voltage VCGRV to the selected word line WL.

The verify operation performed in a write operation also takes a similar waveform to that obtained in page read operation, and the read voltage VCGRV applied to the selected word line WL differs according to the verify state. For example, in the case of a verify operation in the "A" state, the voltage AV is applied as the read voltage VCGRV to the selected word line WL.

As shown in FIG. 8, at time t1, the row decoder 19 applies a voltage VSG to the selection gate lines SGD and SGS of the selected block BLK, a voltage VCGRV to the selected word line WL, and a voltage VREAD to non-selected word lines WL. The voltage VSG is a voltage which turns on the selection transistors ST1 and ST2. The voltage VCGRV and the voltage VREAD have a relationship of VCGRV<VREAD.

At time t2, the sense amplifier 20 charges a bit line BL (hereinafter, referred to as "BL pre-charge"), and applies a voltage VBLRD to the bit line BL. The voltage VBLRD is a voltage applied to a bit line BL during a read operation.

A voltage VSRC is applied to a source line SL via, for example, a source line driver (not shown). The voltage VBLRD and the voltage VSRC have a relationship of VBLRD>VSRC (>VSS).

At time t3, the sequencer 15 sets a signal HLL to the "H" level and turns on the transistor 45. With this configuration, a voltage VSENP is applied to the node SEN in the sense amplifier unit SAU.

At time t4, the sequencer 15 sets the signal HLL to the "L" level and brings the node SEN in a floating state. The sequencer 15 applies an "H" level voltage to the clock signal CLK (hereinafter, referred to as a "clock-up"). As a result, the capacitance element 52 is charged with electricity, and the voltage at the node SEN rises to a voltage VBST due to the influence of capacitive coupling. The voltage VBST is a voltage of the node SEN which has been raised through the clock-up and is higher than the voltage VSENP.

In a period time t5 to time t6, the sequencer 15 performs sensing. More specifically, during the period time t5 to time t6, the sequencer 15 sets a signal XXL to the "H" level and turns on the transistor 44. In this state, when the threshold voltage of a memory cell transistor MT to be read is equal to or higher than the target level, the memory cell transistor MT is turned off (hereinafter, referred to as an "off-cell"), and there is almost no electric current flowing to the source line SL from the corresponding bit line BL. Therefore, the electric charges stored in the node SEN and the capacitance element 52 are only minimally discharged, and the voltage of the node SEN only minimally fluctuates. In contrast, when the threshold voltage of the memory cell transistor MT to be read is lower than the target level, the memory cell transistor MT is turned on (hereinafter, referred to as an "on-cell"), and an electric current flows to the source line SL from the corresponding bit line BL. Namely, the voltage of the node SEN decreases.

At time t6, the sequencer 15 sets the signal XXL to the "L" level and turns off the transistor 44. The sequencer 15 applies an "L" level voltage to the clock signal CLK (hereinafter referred to as a "clock-down"). As a result, the voltage of the node SEN decreases due to the influence of capacitive coupling.

In a period time t7 to time t8, the sequencer 15 strobes the voltage of the node SEN. More specifically, the sequencer 15 sets the signal STB to the "H" level and turns on the transistor 48. In this state, when the voltage of the node SEN is equal to or higher than the threshold voltage (determination level) of the sense transistor 47, the corresponding sense transistor 47 is turned on. As a result, the bus LBUS previously set to the "H" level is set to the "L" level.

In contrast, when the voltage of the node SEN is lower than the threshold voltage (determination level) of the sense transistor 47, the sense transistor 47 is turned off. As a result, the bus LBUS previously set to the "H" level maintains the "H" level.

For example, the transistor 61 of the latch circuit SDL is turned on, and inverted data of the bus LBUS is transferred to the latch circuit SDL. That is, when the node SEN is at the "H" level, "H" level data ("1" data) is stored in the latch circuit SDL, and when the node SEN is at the "L" level, "L" level data ("0" data) is stored in the latch circuit SDL.

At the time t8, the recovery process is performed, and the read operation ends.

When multilevel data reading is executed, the processing from the time t2 to time t8 is repeated for each corresponding state. In this case, the voltage VCGRV corresponding to each state is set.

1.4 Write Operation

Next, the write operation will be described. When the controller 200 transmits a write instruction to the NAND flash memory 100, the controller 200 transmits either a normal write command or a cache write command to the NAND flash memory 100. When the NAND flash memory 100 receives the normal write command, the NAND flash memory 100 sets the signal R/Bn to the "L" level (busy state) during a time at which write data WD is being written to the memory cell array 18.

On the other hand, when the NAND flash memory 100 receives a cache write command, the NAND flash memory 100 sets the signal R/Bn to the "L" level during a period from the start of a write operation until the data register 21 ends transfer of the write data WD to the sense amplifier 20. That is, when the data resister 21 (latch circuit XDL) becomes usable, the NAND flash memory 100 transmits a "H" level (ready state) signal R/Bn to the controller 200 so it becomes ready to receive the next command, even during the write operation to the memory cell array 18. In the present embodiment, a case where the controller 200 transmits a cache write command will be described.

The write operation generally includes a program operation and a verify operation. The threshold voltage of a memory cell transistor MT is raised to a target level by the repetition of the combination of the program operation and the verify operation (hereinafter referred to as a "program loop").

The program operation is an operation to inject electrons into the charge storage layer to raise the threshold voltage (or inhibit charging to maintain the threshold voltage). The operation to raise the threshold voltage will be hereinafter referred to as "'0' program' or '0' write', and a voltage (e.g., voltage VSS) corresponding to "0" data is given to the bit line BL targeted for the "0" program from the sense amplifier 20.

On the other hand, the operation to maintain the threshold voltage will be referred to as "'1' program', "'1' write', or 'write inhibit', and a voltage corresponding to "1" data (hereinafter, referred to as "voltage VBL") is given to the bit line BL targeted for the "1" program from the sense amplifier 20. Hereinafter, a bit line corresponding to the "0" program will be referred to as 'BL ("0")', and a bit line corresponding to the "1" program will be referred to as 'BL ("1")'.

The verify operation is an operation to read data after the program operation, and determine whether or not the threshold voltage of the memory cell transistor MT has reached a desired target level. Hereinafter, the case where the threshold voltage of the memory cell transistor MT has reached the target level will be referred to as "verify operation is passed", whereas the case where the threshold voltage of the memory cell transistor MT has not reached the target level will be referred to as "verify operation is failed".

Furthermore, the write operation includes the case where data for a lower, middle, and upper page is written separately, and the case where data for the lower, middle, and upper page is written simultaneously (hereinafter referred to as a "full sequence write operation"). In the present embodiment, a case where a full sequence write operation is used will be described.

1.4.1 Overall Flow of Write Operation in Memory System

First, the overall flow of the write operation in the memory system will be described with reference to FIG. 9.

Figure 9:
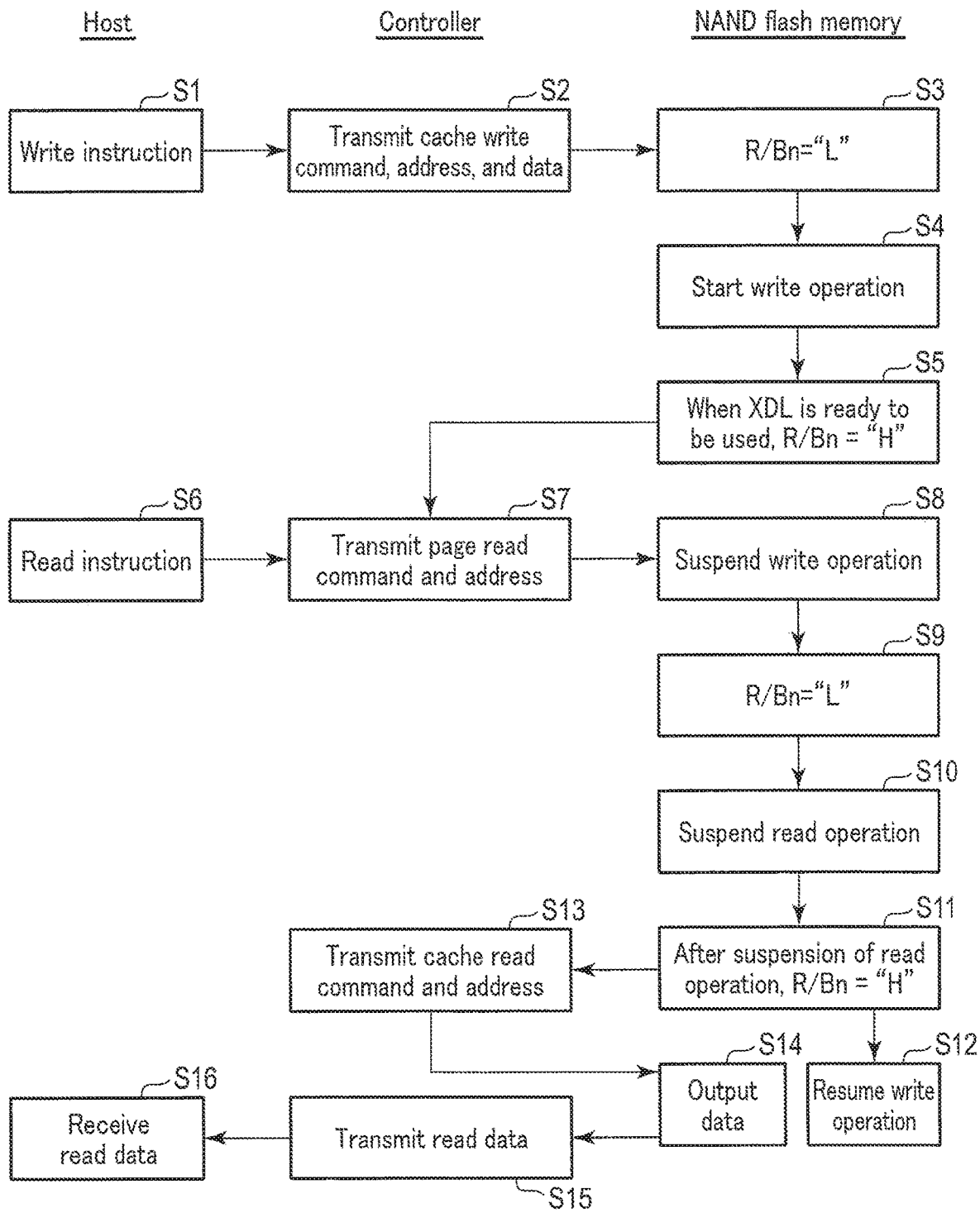
FIG. 9 is a flowchart of a write operation of the memory system including the semiconductor memory device according to the first embodiment.

As shown in FIG. 9, a host interface circuit 210 of the controller 200 receives a write instruction from the host device 2 (step S1).

In response to the write instruction, the controller 200 transmits a write instruction (cache write command, address ADD, and write data WD) to the NAND flash memory 100 via a NAND interface circuit 250 (step S2).

Then the sequencer 15 of the NAND flash memory 100 sets the signal R/Bn to the "L" level (busy state) based on the write instruction (step S3) and starts the write operation (step S4).

When the transmission of the write data WD from the data register 21 to the sense amplifier 20 is completed, and the data register 21 (latch circuit XDL) becomes usable, the sequencer 15 sets the signal R/Bn to the "H" level (ready state) (Step S5). The sequencer 15 starts the program operation after setting the signal R/Bn to the "H" level and repeats the program loop.

The controller 200 receives, for example, a read command from the host device 2 during the execution of the write operation (step S6). After confirming that the signal R/Bn has returned to the "H" level (ready state), the controller 200 transmits a page read instruction (page read command, address ADD) to the NAND flash memory 100 (step S7).

The sequencer 15 suspends the write operation based on the page read command (step S8). At this time, the sequencer 15 stores the suspend information in a register in the sequencer 15, for example. The sequencer 15 may also transmit the suspend information to the controller 200.

The sequencer 15 sets the signal R/Bn to the "L" level (busy state) (step S9), and performs a suspend read operation (step S10).

Specifically, when the page address of data to be written is identical to that of data to be read, the following operation is performed. Data read from the memory cell transistor MT is stored as read data RD in a latch circuit XDL corresponding to the memory cell transistor MT for which the write operation has ended. On the other hand, the write data WD stored in the latch circuits ADL, BDL, or CDL is stored as read data RD in a latch circuit XDL corresponding to the memory cell transistor MT for which the write operation has not ended. For example, when a lower page is to be read, the sense amplifier 20 transfers the write data WD of the lower page stored in the latch circuit ADL to the latch circuit XDL. Similarly, when a middle page is to be read, the sense amplifier 20 transfers the write data WD of the middle page stored in the latch circuit BDL to the latch circuit XDL. When an upper page is to be read, the sense amplifier 20 transfers the write data WD of the upper page stored in the latch circuit CDL to the latch circuit XDL. Thereby, the same data as the write data WD is stored in the latch circuit XDL.

When the page address of data to be written is different from the page address of data to be read, the data read from the memory cell transistor MT is stored in the latch circuit XDL as in the normal page read operation.

A page read operation in the case where the page address of data to be written is the same as the page address of data to be read will be hereinafter referred to as "the same page suspend read operation", and a page read operation in the case where the page address of data to be written differs from the page address of data to be read will be referred to as "a normal suspend read operation".

When the suspend read operation has ended, the sequencer 15 sets the signal R/Bn to the "H" level (ready state) (step S11) and resumes the write operation based on the suspend information (step S12).

After confirming that the signal R/Bn has returned to the "H" level (ready state), the controller 200 transmits a cache read instruction (cache read command, address ADD) to the NAND flash memory 100 (step S13).

The sequencer 15 transmits the read data RD held by the data register 21 to the controller 200 in response to the cache read instruction even during the execution of the write operation (step S14).

After executing the ECC processing of the read data RD, the controller 200 transmits the read data RD after the ECC correction processing to the host device 2 (step S15). The host device 2 receives, from the controller 200, the read data RD after the ECC correction processing (step S16).

1.4.2 Overall Flow of Write Operation in NAND Flash Memory

Next, the overall flow of a write operation in the NAND flash memory 100 will be described with reference to FIGS. 10 and 11. In the example in FIGS. 10 and 11, a case will be described in which the write operation is suspended after a verify operation, and the write operation is resumed from a program operation. Even when the write operation is suspended after the verify operation, the write operation may be resumed from the verify operation. Furthermore, the write operation may be suspended after the program operation. In this case, the write operation may be resumed from the verify operation.

Figure 10:
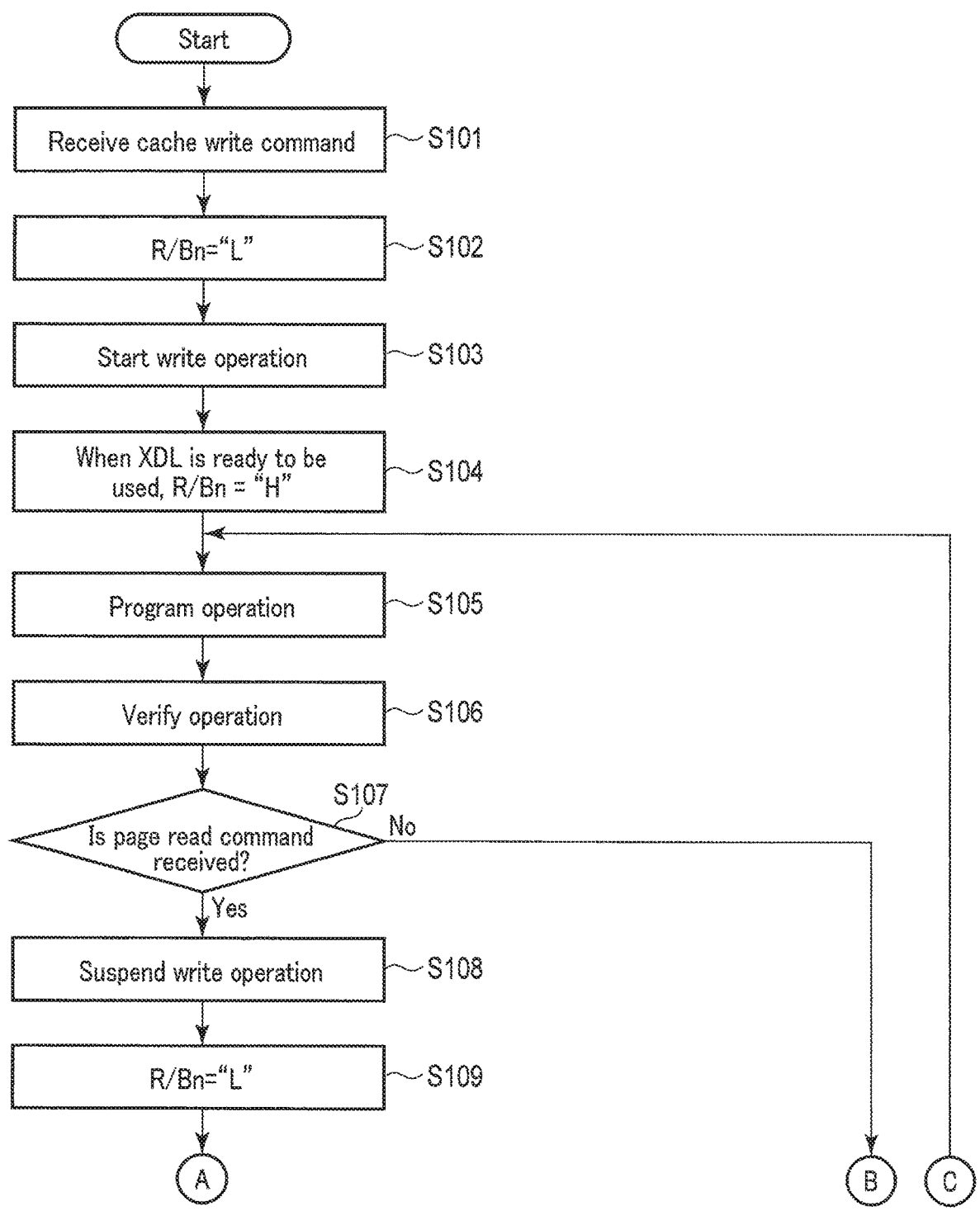
FIG. 10 is a flowchart of a write operation in the semiconductor memory device according to the first embodiment.

As shown in FIG. 10, the NAND flash memory 100 receives a write instruction (cache write command, address ADD, and write data WD) from the controller 200 (step S101).

In response to the write command, the sequencer 15 sets the signal R/Bn to the "L" level (busy state) (step S102) and starts the write operation (step S103). More specifically, the sequencer 15 transmits the write data WD stored in the data register 21 to the sense amplifier 20. When the write data WD is data of a lower page, the write data WD is stored in the latch circuit ADL. Similarly, data of a middle page is stored in the latch circuit BDL, and data of an upper page is stored in the latch circuit CDL.

When the transmission of the write data WD from the data register 21 (latch circuit XDL) to the sense amplifier 20 is completed and the data register 21 becomes usable, the sequencer 15 sets the signal R/Bn to the "H" level (ready state) (step S104).

Next, the sequencer 15 executes a program operation (step S105). More specifically, the sense amplifier 20 stores, as program data, a result of data calculation of the latch circuits ADL, BDL, and CDL in the latch circuit SDL. The sense amplifier 20 then starts the program operation based on the data held by the latch circuit SDL. When "0" data is stored in the latch circuit SDL, that is, when the node LAT_S is at the "L" level, the voltage VSS is applied to the bit line BL ("0") corresponding to the "0" program. On the other hand, when "1" data is stored in the latch circuit SDL, that is, when the node LAT_S is at the "H" level, the voltage VBL (>VSS) is applied to the bit line BL ("1") corresponding to the "1" program. The row decoder 19 selects one of the word lines WL in a selected block BLK, applies a voltage VPGM as a program voltage to the selected word line WL, and applies a voltage VPASS to a non-selected word line WL. The voltage VPGM is a high voltage for injecting electrons into the charge storage layer. For example, in a first program operation, the row decoder 19 applies the voltage VPGM to a selected word line WL. The voltage VPASS is a voltage that turns on the memory cell transistor MT regardless of the threshold voltage of the memory cell transistor MT. The voltage VPGM and the voltage VPASS have a relationship of VPGM>VPASS. With this configuration, "1" or "0" data is written in a target memory cell transistor MT.

Next, the sequencer 15 performs a verify operation (step S106). More specifically, the sequencer 15 stores, for example, "1" data in the latch circuit SDL when the threshold voltage of the memory cell transistor MT is equal to or higher than the verify voltage Vpfy, namely, when the verify operation is passed. On the other hand, when the threshold voltage of the memory cell transistor MT is lower than the verify voltage Vpfy, namely, when the verify operation is failed, for example, "0" data is stored in the latch circuit SDL. The verify voltage Vpfy corresponds to the read voltage VCGRV in FIG. 8. For example, when an "A" level verify operation is to be executed, a voltage AV is applied as the verify voltage Vpfy. When the verify operation is passed, the sequencer 15 stores "1" data in the latch circuits ADL, BDL, and CDL.

When the sequencer 15 receives a page read instruction (page read command and address ADD) from the controller 200 (step S107_Yes), the sequencer 15 suspends the write operation (step S108).

In contrast, when the sequencer 15 has not received a page read command from the controller 200 (step S107_No), the sequencer 15 continues the write operation.

The sequencer 15 suspends the write operation (step S108), and then sets the signal R/Bn to the "L" level (step S109).

Figure 11:
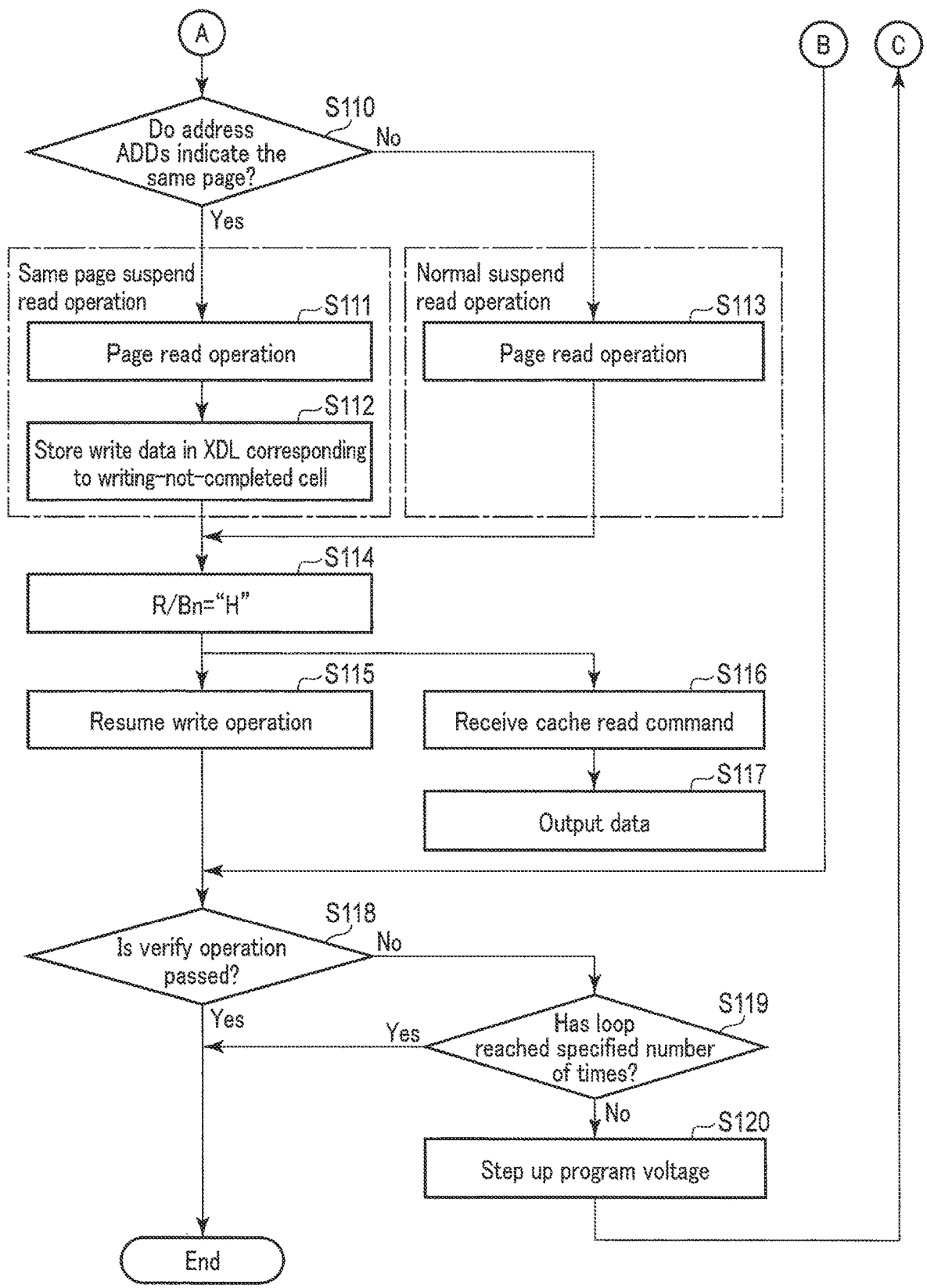
FIG. 11 is a flowchart of a write operation in the semiconductor memory device according to the first embodiment.

As shown in FIG. 11, when the address ADD of a write instruction and the address ADD of a page read instruction indicate the same page (step S110_Yes), the sequencer 15 performs the same page suspend read operation.

In the same page suspend read operation, the sequencer 15 first performs a page read operation (step S111). More specifically, the row decoder 19 applies the voltage VCGRV to a selected word line WL of a selected block BLK and applies the voltage VREAD to a non-selected word line WL. In this state, the sense amplifier 20 senses an electric current flowing through each of the bit lines BL, and reads data from the memory cell transistor MT. The sense amplifier 20 then transfers the read data to the latch circuit XDL.

Next, when writing to the memory cell transistor MT to be read is not completed (write-incomplete cell), the sense amplifier 20 transmits the write data WD of the latch circuit ADL, BDL, or CDL to the latch circuit XDL. (Step S112). Therefore, the data of the memory cell transistor MT is stored as read data RD in a latch circuit XDL corresponding to the memory cell transistor MT for which the write operation has ended. On the other hand, the write data WD is stored as read data RD in a latch circuit XDL corresponding to the memory cell transistor MT for which the write operation has not ended. That is, data identical to the write data WD is stored as read data RD in the latch circuit XDL.

When the address ADD of a write instruction and the address ADD of a page read instruction do not indicate the same page (step S110_No), the sequencer 15 executes the normal suspend read operation, i.e., the normal page read operation (step S113). In this case, the data of the memory cell transistor MT is stored as read data RD in each of the latch circuits XDL.

When the suspend read operation has ended, the sequencer 15 sets the signal R/Bn to the "H" level (ready state) (step S114), and resumes the write operation based on the suspend information (step S115).

The sequencer 15 sets the signal R/Bn to the "H" level (ready state) (step S114), and then receives a cache read instruction (cache read command and address ADD) from the controller 200 (step S116). The sequencer 15 transmits the read data RD of the data register 21 (latch circuit XDL) to the controller 200 even in the state where the write operation is resumed (step S117).

Also, the sequencer 15 resumes the write operation (step S115).

The sequencer 15 ends the write operation when the verify operation is passed (step S118_Yes). More specifically, the sequencer 15 counts the number of bits in which the verify operation is failed (the number of memory cell transistors). When the number of fail bits is less than a specified value, the sequencer 15 determines that the verify operation is passed, and ends the write operation.

When the verify operation is failed (step S118_No), the sequencer 15 confirms whether the program loop has reached a predetermined number of times set (step S119).

When the program loop has reached the specified number of times (step S119_Yes), the sequencer 15 ends the write operation and reports to the controller 200 that the write operation has not ended properly.

When the program loop has not reached the specified number of times (step S119_No), the sequencer 15 steps up the program voltage (step S120). More specifically, the sequencer 15 steps up the program voltage by a voltage $\Delta V$ every time the program loop is repeated. For example, when the program voltage in the first program operation is assumed as "VPGM", the program voltage in the second program operation is VPGM+$\Delta V$, and the program voltage in the third program operation is VPGM+2$\Delta V$. Namely, the program voltage in the m-th program (m is an integer of 1 or more) is VPGM+(m−1) $\Delta V$.

After stepping up the program voltage (step S120), the process returns to step S105, and the next program loop is executed. At this time, the row decoder 19 applies a stepped-up program voltage to the selected word line WL.

The sequencer 15 repeats the program loop until the verify operation is passed or the program loop has reached the specified number of times.

1.4.3 Operation of Controller in Write Operation

Next, the operation of the controller 200 at the time of the write operation is described with reference to FIG. 12. The example in FIG. 12 shows a case where the controller 200 transmits a cache write command in a write operation of any one of a lower page, middle, and upper page.

As shown in FIG. 12, first, the controller 200 transmits, to the NAND flash memory 100, a command that designates any one of a lower page ("01h"), a middle page ("02h"), and an upper page ("03h") and a command "80h" providing notification that a write operation is to be executed, sets a command latch enable signal CLE to the "H" level, and asserts it.

Next, the controller 200 transmits an address "ADD", sets an address latch enable signal ALE to the "H" level, and asserts it. The example in FIG. 12 shows a case where a column address CA is transmitted in 2 cycles before a row address RA is transmitted in 3 cycles. However, the number of column address cycles and the number of row address cycles may be set discretionally. Furthermore, the commands 01h, 02h, and 03h each designating a page may be omitted, and the column address CA may include a page address corresponding to the lower, middle, or upper page.

Next, the controller 200 transmits the write data "WD" in the required number of cycles.

Furthermore, the controller 200 transmits a cache write command "15h" instructing execution of a write operation, sets the command latch enable signal CLE to the "H" level, and asserts it.

In response to the write command "15h", the NAND flash memory 100 starts the write operation and is in the busy state (R/Bn="L").

When the transfer of the write data WD from the data register 21 to the sense amplifier 20 is completed and the data register 21 (latch circuit XDL) becomes usable, the NAND flash memory 100 comes into the ready state, and the signal R/Bn is set to the "H" level.

After the signal R/Bn is set to the "H" level, the sequencer 15 repeats the program loop and writes data to the memory cell transistor MT.

1.4.4 Operation of Controller in Full Sequence Writing

Next, the operation of the controller 200 in a full sequence write operation will be described with reference to FIG. 13. The example in FIG. 13 shows a case where write data WD is transmitted in the order of a lower page, a middle page, and an upper page in the full sequence write operation. The example in FIG. 13 also shows data DQ [7:0] and signal R/Bn, and signals CEn, CLE, ALE, WEn, and REn are omitted. The order of transmission of data of respective pages may be set discretionarily.

As shown in FIG. 13, the controller 200 sequentially transmits, as a command sequence (hereinafter, referred to as a "first command set") for the transmission of write data WD of the lower page, a command "01h" for designating a lower page, a command "80h" for notifying the execution of the write operation, column address CA, row address RA, the write data WD of the lower page, and command "1Ah". In response to the command "1Ah", the NAND flash memory 100 is in the busy state (R/Bn="L"). When the transmission of the write data WD of the lower page from the data register 21 (latch circuit XDL) to the sense amplifier 20 (latch circuit ADL) is completed and the data register 21 becomes usable, the NAND flash memory 100 comes into the ready state, and the signal R/Bn is set to the "H" level.

Next, after confirming that the signal R/Bn has returned to the "H" level, the controller 200 transmits, as a command sequence (hereinafter, referred to as a "second command set") for the transmission of write data WD of the middle page, a command "02h" for designating the middle page, the command "80h", and column address CA, row address RA, the write data WD of the middle page, and a command "1Ah" for instruction of data storage in the sense amplifier 20. In response to the command "1Ah", the NAND flash memory 100 comes into the busy state (R/Bn="L"). When the transmission of the write data WD of the middle page from the data register 21 to the sense amplifier 20 (latch circuit BDL) is completed and the data register 21 becomes usable, the NAND flash memory 100 comes into the ready state and the signal R/Bn is brought to the "H" level.

Next, after confirming that the signal R/Bn has returned to the "H" level, the controller 200 transmits, as a command sequence (hereinafter, referred to as a "third command set") for transmitting write data WD of the upper page, a command "03h" for designating the upper page, the command "80h", column address CA, row address RA, the write data WD of the upper page, and the write command "10h". In response to the write command "10h", the NAND flash memory 100 comes into the busy state (R/Bn="L"). After the completion of the write operation to the memory cell transistor MT, the NAND flash memory 100 comes into the ready state, and the signal R/Bn is set to the "H" level.

The cache write command "15h" may be used instead of the write command "10h". In this case, when the transmission of the write data WD of the upper page from the data register 21 to the sense amplifier 20 (latch circuit CDL) is completed and the data register 21 becomes usable, the NAND flash memory 100 comes into the ready state, and the signal R/Bn is set to the "H" level.

1.4.5 Voltage of Each Interconnect in Program Operation

Next, the voltage of each interconnect during a program operation will be described with reference to FIG. 14. The example in FIG. 14 shows the program operation in the first program loop.

As shown in FIG. 14, at time t1, the sense amplifier 20 applies a voltage VBL to a bit line BL ("1") and starts BL pre-charge operation. More specifically, when "1" data ("H" level data) is held in a latch circuit SDL (in the node LAT_S), the node INV_S comes into the "L" level, and the transistor 51 therefore turns on. In this state, the signals BLS and BLX are set to the "H" level, and the transistors 40 and 42 are thus turned on. When the signal BLC is set to the "H" level and then a voltage "VBL+Vt41" (Vt41 is a threshold voltage of the transistor 41) is applied to a gate of the transistor 41, the voltage VBL is applied to the bit line BL ("1"). On the other hand, when "0" data ("L" level data) is held in the latch circuit SDL (in the node LAT_S), the node INV_S comes into the "H" level, and the transistor 43 therefore turns on. When the voltage VSS is applied to the node SRCGND, the voltage VSS is applied to the corresponding bit line BL ("0").

The row decoder 19 applies the voltage VSD1 to a selection gate line SGD (reference symbol "selected SGD") of a selected string unit SU in the selected block BLK. The voltage VSD1 is a voltage which turns on the selection transistor ST1 at a voltage equal to or higher than "VBL+ Vtsg" where Vtsg is the threshold voltage of the selection transistor ST1. On the other hand, the row decoder 19 applies the voltage VSS to the selection gate line SGD (reference symbol "non-selected SGD") of the non-selected string unit SU to turn off the corresponding selection transistor ST1. The row decoder 19 also applies the voltage VSS to the selection gate lines SGS of the selected string unit SU and the non-selected string unit SU to turn off the selection transistor ST2.

Furthermore, a voltage VCELSRC (>VSS) is applied to the source line SL via, for example, a source line driver (not shown).

At time t2, the row decoder 19 applies a voltage VSD2 to the selection gate line SGD of the selected string unit SU. The voltage VSD2 is a voltage which turns on the selection transistor ST1 to which the voltage VSS is applied, but cuts off the selection transistor ST1 to which the voltage VBL is applied, at a voltage lower than the voltage VSD1 and the voltage VBL. Accordingly, the channel of the NAND string SR corresponding to the bit line BL("1") comes into a floating state.

At time t3, the row decoder 19 applies a voltage VPASS to each of the word lines WL in the selected string unit SU.

At time t4, the row decoder 19 applies a voltage VPGM to the selected word line WL in the selected string unit SU.

In the NAND string SR corresponding to the bit line BL ("0"), the selection transistor ST1 comes into the ON-state, and thus the channel potential of the memory cell transistor MT coupled to the selected word line WL becomes VSS. Thus, a potential difference (VPGM-VSS) between the control gate and the channel increases. As a result, electrons are injected into the charge storage layer, and the threshold voltage of the memory cell transistor MT corresponding to the bit line BL ("0") is raised.

In the NAND string SR corresponding to the bit line BL("1"), the selection transistor ST1 becomes a cut-off state. Thus, the channel of the memory cell transistor MT coupled to the selected word line WL becomes electrically floating. Accordingly, the channel potential increases due to capacitive coupling with the word line WL, etc. Therefore, the potential difference between the control gate and the channel is smaller than that of the memory cell transistor MT corresponding to the bit line BL ("0"). As a result, the charge storage layer is only minimally charged with electrons, and the threshold voltage of the memory cell transistor MT corresponding to the bit line BL ("1") is maintained (the threshold voltage fluctuates by less than the threshold distribution level when it shifts to a higher distribution).

At time t5, the row decoder 19 applies the voltage VSS to the word line WL.

At time t6, recovery processing is performed, and the program operation ends.

1.5 Specific Examples of Same Page Suspend Read Operation

Next, a specific example of performance of the same page suspend read operation will be described.

1.5.1 Specific Example of Overall Flow of Write Operation

First, the entire flow of the write operation will be described with reference to FIG. 15. The example in FIG. 15 shows a case where in a second program loop, a write operation is suspended after completion of a verify operation, and the write operation is resumed after execution of the same page suspend read operation. The example in FIG. 15 also shows a case where a word line WL0 in a string unit SU0 is selected to perform a full sequence write operation and a lower-page-read operation. Parts of voltages to be applied to the selected word line WL and the selection gate line SGD are omitted, for the sake of simplicity.

As shown in FIG. 15, during a period time t0 to time t1, the controller 200 transmits the first command set, the second command set, and the third command set described in FIG. 13, as command sequences of a full-sequence write operation, to the flash memory 100.

At time t1, the sequencer 15 sets the signal R/Bn to the "L" level in response to a write command "15h" and starts the write operation. During a period time t1 to time t2, the status of the write operation is brought to the ready state (reference symbol "SETUP"), and the data register 21 transmits the write data WD to the sense amplifier 20.

At time t2, after completion of the transfer of the write data WD from the data register 21 to the sense amplifier 20, the sequencer 15 sets the signal R/Bn to the "H" level. During a period time t2 to time t3, the status of the write operation is brought to a program state (reference symbol "PROG"), and the sequencer 15 executes the first program operation. The row decoder 19 applies the voltage VPGM to the selected word line WL0, the voltage VSD2 to the selection gate line SGD0 in the selected string unit SU0, and the voltage VSS to the selection gate lines SGD1 to SGD3 in the non-selected string units SU1 to SU3.

During a period time t3 to time t4, the status of the write operation is brought to a verify state (reference symbol "PVFY"), and the sequencer 15 performs a first verify operation. The row decoder 19 applies the verify voltage Vpfy to the selected word line WL0, the voltage VSG to the selection gate line SGD0, and the voltage VSS to the selection gate lines SGD1 to SGD3. Multilevel verify operations may be performed during the period time t3 to time t4.

During a period time t4 to time t5, the status of the write operation is brought to the program state, and the sequencer 15 executes the second program operation. The row decoder 19 applies a program voltage VPGM+ΔV to the selected word line WL0. The other operations are the same as those in the period time t2 to time t3.

During a period time t5 to t6, the status of the write operation is brought to the verify state, and the sequencer 15 performs the second verify operation. The specific operation of the second verify operation is the same as the first verify operation in the period time t3 to time t4.

After the time t2, the sequencer 15 receives a page read instruction (commands "01h", "00h", 5-cycle address data "ADD", and page read command "30h") of a lower page in the same memory cell group MCD from the controller 200. For example, when the sequencer 15 receives the page read command "30h" during the period time t5 to t6, the sequencer 15 suspends the write operation and sets the signal R/Bn to the "L" level at the time t6. During a period time t6 to time t7, the status of the write operation is brought to a suspend read state (reference symbol "SPD-READ"), and the sequencer 15 performs the same page suspend read operation. In the case of a read operation in the "A" state, the row decoder 19 applies the voltage AR to the same selected word line WL0 as in the write operation, and in the case of a read operation in the "E" state, the row decoder 19 applies the voltage ER to the selected word line WL0. During the read operation in the "A" state and "E" state, the row decoder applies the voltage VSG to the same selection gate line SGD0 as in the write operation and applies the voltage VSS to the selection gate lines SGD1 to SGD3.

For example, in the normal page read operation, when the memory cell transistor MT to be read is in a different memory cell group MCG in the same string unit SU, the selected word line WL in the read operation is different from the selected word line WL0 in the write operation. When the memory cell transistor MT to be read is in a different string unit SU, the selection gate line SGD corresponding to the selected string unit SU in the read operation is different from the selection gate line SGD0 corresponding to the selected string unit SU in the write operation.

When the same page suspend read operation ends at time t7, the sequencer 15 sets the signal R/Bn to the "H" level and resumes the write operation. During a period time t7 to time t8, the status of the write operation is brought to the program state, and the sequencer 15 performs a third program operation. The row decoder 19 applies a program voltage VPGM+ 2ΔV to the selected word line WL0. The other operations are the same as those in the period time t2 to time t3.

During a period time t8 to time t9, the status of the write operation is brought to the verify state, and the sequencer 15 performs a third verify operation. The specific operation is the same as the first verify operation in the period time t3 to time t4.

The sequencer 15 repeats the program loop, and during a period time t10 to time t11, the status of the write operation is brought to the program state, and the sequencer 15 performs an m-th program operation. The row decoder 19 applies a program voltage VPGM+(m−1) ΔV to the selected word line WL0. The other operations are the same as those in the period time t2 to time t3.

During a period time t11 to time t12, the status of the write operation is brought to the verify state, and the sequencer 15 performs the m-th verify operation. The specific operation is the same as in the period time t3 to time t4. Then, when the verify operation is passed in the m-th verify operation, the sequencer 15 executes recovery processing for a period time t12 to t13, and ends the write operation.

Upon receiving the cache read instruction (command "05h", 5-cycle address data "ADD", and cache read command "E0h") during a period time t7 to time t13, the sequencer 15 transmits the read data RD to the controller 200 even during the execution of the write operation.

1.5.2 Specific Examples of Data Held by Latch Circuit

Next, specific examples of data held by the latch circuits SDL, ADL, BDL, CDL, and XDL in the same page suspend read operation will be described with reference to FIGS. 16 to 21. The examples of FIGS. 16 to 21 show a case of performing the same page suspend read after receiving write data of a lower, middle, and upper page from the controller 200 and performing a program operation, an "A" state verify operation, and a "B" state verify operation. In this example, the case is shown where the write data WD is in the "Er" state, the "A" state, the "B" state, or the "E" state, for the sake of simplicity. In the following description, when the latch circuits SDL, ADL, BDL, CDL, and XDL corresponding to the bit line BL0 are limited, they are referred to as "latch circuits SDL0", "ADL0", "BDL0", "CDL0", and "XDL0", respectively. The same applies to the other bit lines BL1 to BL5.

Figure 16:
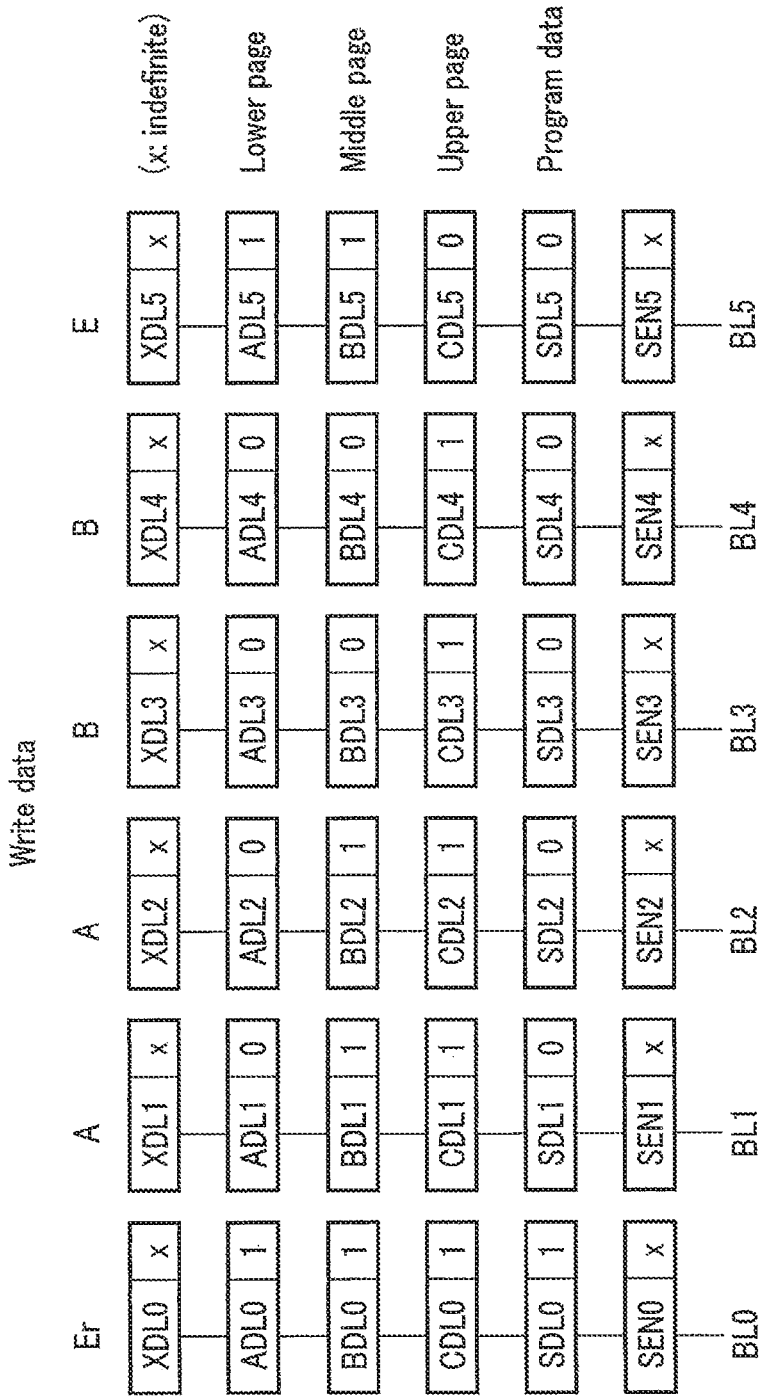
FIG. 16 is a diagram showing an example of data held by latch circuits SDL, ADL, BDL, CDL, and XDL, in a write operation, in the semiconductor memory device according to the first embodiment.

First, as shown in FIG. 16, 3-bit write data WD received from the controller 200 is stored in the latch circuits ADL, BDL, and CDL, respectively, via the latch circuit XDL. In the example of FIG. 16, "Er" state data is stored in the latch circuits ADL0, BDL0, and CDL0 corresponding to the bit line BL0, and "A" state data is stored in the latch circuits ADL1, BDL1, and CDL1 corresponding to the bit line BL1, and the latch circuits ADL2, BDL2, and CDL2 corresponding to the bit line BL2. Furthermore, "B" state data is stored in the latch circuits ADL3, BDL3, and CDL3 corresponding to the bit line BL3, and the latch circuits ADL4, BDL4, and CDL4 corresponding to the bit line BL4, and "E" state data is stored in the latch circuits ADL5, BDL5, and CDL5 corresponding to the bit line BL5.

Each sense amplifier unit SAU performs an AND operation (SDL=ADL & BDL & CDL) ("&": indicates AND operation) of the data of the latch circuits ADL, BDL, and CDL in the sense circuit SA, and stores the result as program data in the latch circuit SDL. As a result, "1" data is stored in a latch circuit SDL corresponding to the "Er" state data. Furthermore, "0" data is stored in a latch circuit SDL corresponding to the data in "A" to "G" states. In the example of FIG. 16, "1" data is stored in the latch circuit SDL0, and "0" data is stored in the latch circuits SDL1 to SDL5.

Then, the first program operation is executed according to the data of the latch circuit SDL. That is, the "1" program is executed in the sense amplifier unit SAU corresponding to the "Er" state data, and the "0" program is executed in the sense amplifier unit SAU corresponding to the "A" to "G" state data.

As shown in FIG. 17, next, the sequencer 15 performs the "A" state verify operation. In the example of FIG. 17, since the data of the latch circuit SDL corresponding to the "Er" state, the "B" state, and the "E" state is determined to be indefinite, because the data is not eligible for the "A" state verify operation, and the description thereof is omitted.

More specifically, a result of the "A" state verify operation is first transferred from the node SEN of the sense circuit SA to the latch circuit SDL. When the "A" state verify operation is passed, "1" data is stored in the latch circuit SDL, and when the verify operation is failed, "0" data is stored in the latch circuit SDL. In the example of FIG. 17, "0" data is stored in the latch circuit SDL1, and "1" data is stored in the latch circuit SDL2.

Next, the sense amplifier 20 performs the following arithmetic operation corresponding to the verify operation in each of the states. As a result, when the verify operation is passed, the data of the corresponding latch circuits ADL, BDL, and CDL are set to "1" data. In the following arithmetic expressions, "|" indicates an OR operation, and "/" indicates inverted data. In each of the arithmetic expressions, the values of the latch circuits ADL, BDL, and CDL on the right side indicate write data WD. For example, in the case of "B" state verify operation, first, an operation result of SDL & (/ADL) & (/BDL) & CDL is stored in the latch circuit SDL. Next, an OR operation result of the latch circuit ADL and the latch circuit SDL is stored in the latch circuit ADL, and an OR operation result of the latch circuit BDL and the latch circuit SDL is stored in the latch circuit BDL.

"A" state verify operation
ADL=ADL|(SDL & (/ADL) & BDL & CDL)
"B" state verify operation
ADL=ADL|(SDL & (/ADL) & (/BDL) & CDL)
BDL=BDL|(SDL & (/ADL) & (/BDL) & CDL)
"C" state verify operation
ADL=ADL|(SDL & (/ADL) & (/BDL) & (/CDL))
BDL=BDL|(SDL & (/ADL) & (/BDL) & (/CDL))
CDL=CDL|(SDL & (/ADL) & (/BDL) & (/CDL))
"D" state verify operation
ADL=ADL|(SDL & (/ADL) & BDL & (/CDL))
CDL=CDL|(SDL & (/ADL) & BDL & (/CDL))
"E" state verify operation
ADL=ADL|(SDL & ADL & BDL & (/CDL))
"F" state verify operation
BDL=BDL|(SDL & ADL & (/BDL) & (/CDL))
CDL=CDL|(SDL & ADL & (/BDL) & (/CDL))
"G" state verify operation
BDL=BDL|(SDL & ADL & (/BDL) & CDL)

In the example of FIG. 17, an arithmetic operation corresponding to the above-mentioned "A" state verify operation is performed. As a result, the "1" data is stored in the latch circuit ADL2 corresponding to the memory cell transistor MT for which the "A" verify operation is passed.

As shown in FIG. 18, for example, the sequencer 15 performs a "B" state verify operation. Since the range of the rise in the threshold voltage (write speed) through one program operation varies for each memory cell transistor MT, there may be a case where memory cell transistors MT in which an "A" state write operation has not been completed and memory cell transistors MT in which a "B" state write operation has been completed coexist. As a result of the "B" state verify operation, "0" data is stored in the latch circuit SDL3, and "1" data is stored in the latch circuit SDL4. Then, an arithmetic operation corresponding to the above-described "B" state verify operation is performed. As a result, the "1" data is stored in the latch circuits ADL4 and BDL4 corresponding to the memory cell transistors MT for which the "B" verify operation is passed.

At this stage, the memory cell transistors MT corresponding to the bit lines BL2 and BL4 are in a state where the write operation has ended, and the memory cell transistors MT corresponding to the bit lines BL1, BL3, and BL5 are in a state where the write operation is not completed.

Figure 19:
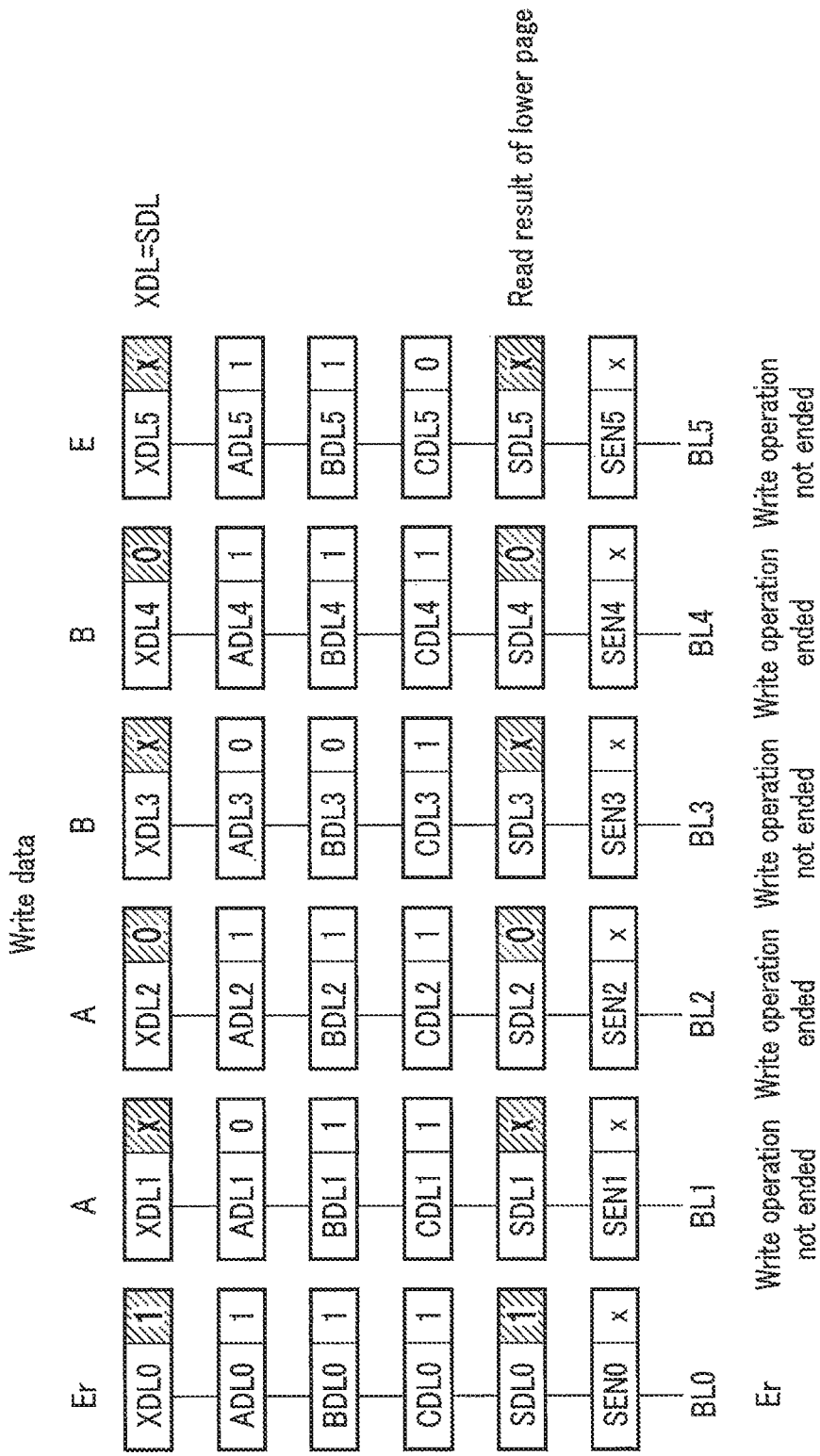
FIG. 19 is a diagram showing an example of data held by the latch circuits SDL, ADL, BDL, CDL, and XDL, in a write operation, in the semiconductor memory device according to the first embodiment.

As shown in FIG. 19, after the verify operation, the sequencer 15 suspends the write operation to perform the same suspend read operation. More specifically, the sequencer 15 first reads data of the lower page (reading data in "A" state and "E" state), and stores the result in the latch circuit SDL. More specifically, the sequencer 15 first performs an "A" state read operation. At this time, the memory cell transistor MT corresponding to the "Er" state is turned on, and an electric current flows from the bit line BL to the source line SL. For this reason, the node SEN is brought to the "L" level. On the other hand, the memory cell transistors MT corresponding to the "A" to "G" states are turned off, and no electric current flows from the bit line BL to the source line SL. For this reason, the node SEN maintains the "H" level. As a result, "1" data, which is the inverted data of the node SEN, is stored in the latch circuit SDL corresponding to the "Er" state, and "0" data is stored in the latch circuits SDL corresponding to the "A" to "G" states. Next, the sequencer 15 performs an "E" state read operation. As a result, the nodes SEN corresponding to the "Er" to "D" states are brought to the "L" level, and the nodes SEN corresponding to the "E" to "G" states are brought to the "H" level. The sense amplifier 20 performs an OR operation for the data of the node SEN and the data of the latch circuit SDL, and stores the result in the latch circuit SDL. As a result, "1" data is stored in the latch circuits SDL corresponding to the "Er" and "E" to "G" states, and "0" data is stored in the latch circuits SDL corresponding to the "A" to "D" states. In the example of FIG. 19, at this time, "1" data is stored in the latch circuit SDL0, and "0" data is stored in the latch circuits SDL2 and SDL4. The data in the latch circuits SDL1, SDL3, and SDL5 corresponding to the memory cell transistors MT in which the write operation has not ended is determined to be indefinite. Then, the data of the latch circuits SDL is transferred to latch circuits XDL.

Figure 20:
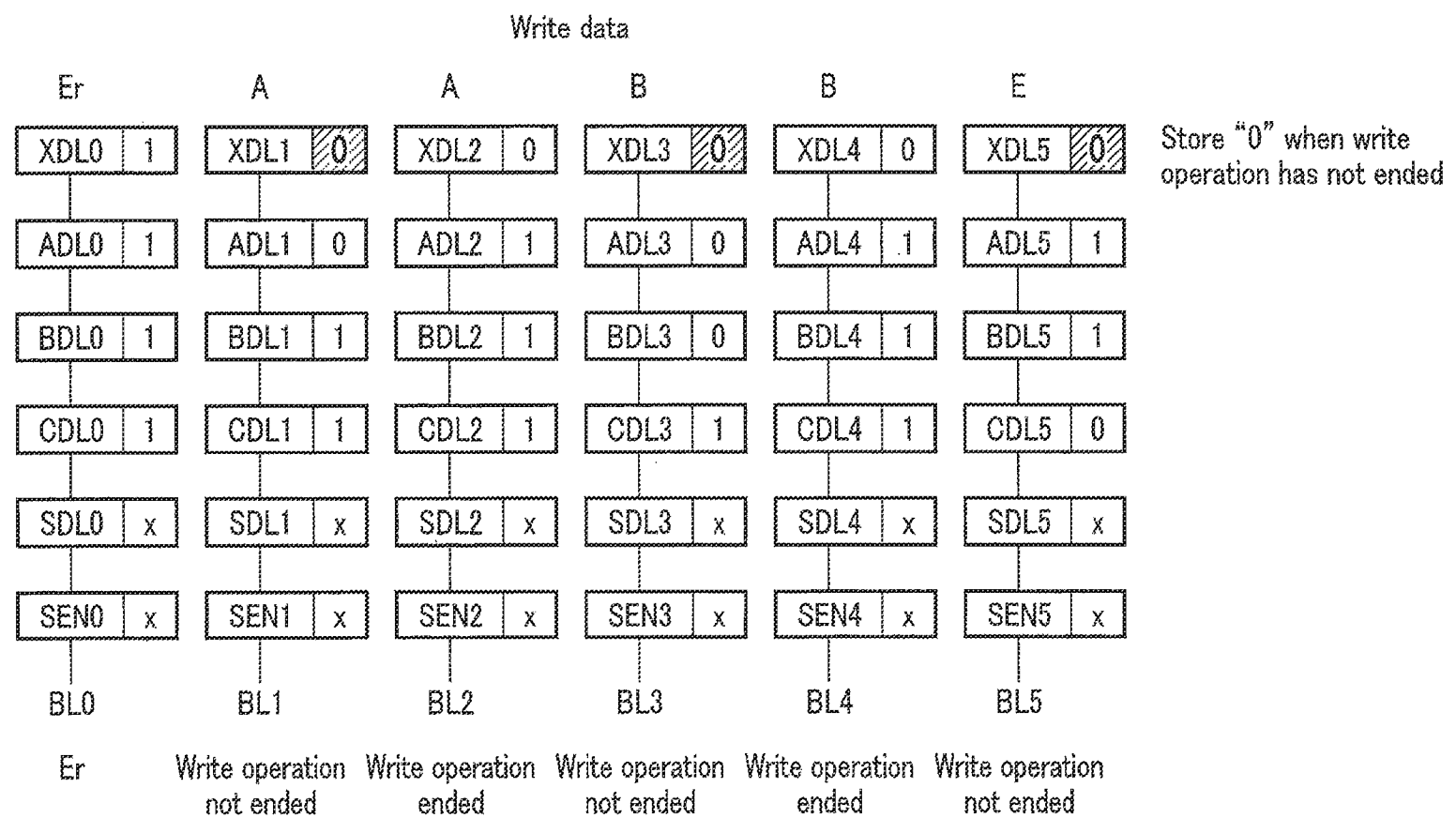

As shown in FIG. 20, the sequencer 15 next performs an arithmetic operation of XDL=XDL & ADL & BDL & CDL in the sense amplifier 20 and stores "0" data in the latch circuits XDL corresponding to the memory cell transistors MT in which the write operation has not ended. In the example of FIG. 20, "0" data is stored in the latch circuits XDL1, XDL3, and XDL5.

As shown in FIG. 21, next, the sense amplifier 20 performs the following arithmetic operation corresponding to the page to be read. As a result, the write data WD held by the latch circuit ADL, BDL, or CDL is stored in the latch circuits XDL corresponding to the memory cell transistors MT that hold "0" data (latch circuit XDL=0) and in which the write operation has not ended.

Lower page: XDL=ADL & (/(ADL & BDL & CDL)) | XDL

Middle page: XDL=BDL & (/(ADL & BDL & CDL)) | XDL

Upper page: XDL=CDL & (/(ADL & BDL & CDL)) | XDL

In the example of FIG. 21, the data read from the memory cell transistors MT is stored in a latch circuit XDL0 corresponding to the "Er" state, and in latch circuits XDL2 and XDL4 corresponding to memory cell transistors MT for which the write operation has ended; and the write data WD of the latch circuits ADL1, ADL3, and ADL5 is stored in the latch circuits XDL1, XDL3, and XDL5, respectively, corresponding to the memory cell transistors MT for which the write operation has not ended. The data stored in the latch circuit XDL is transmitted as read data RD to the controller 200.

1.6 Advantageous Effects of Present Embodiment

According to the configuration of the present embodiment, the reliability of the semiconductor memory device and the memory system can be improved. Hereinafter, the advantageous effects will be detailed.

For example, in an SSD intended for a data center, the response guarantee period (QoS) from when a read request is received to when a read result is returned is tight. For this reason, the NAND flash memory may be required to transmit the read result without waiting for the end of the write operation, even during the execution of the write operation. In such a case, the NAND flash memory suspends the write operation and performs a read operation. However, when a page to be written and a page to be read are the same, the data read from a memory cell transistor in the middle of a write operation is different from the write data. Therefore, correct data (identical to the write data) cannot be sent to the controller.

In contrast, in the configuration according to the present embodiment, data identical to the write data WD can be transmitted to the controller 200 when the page identical to the page to be written is read. More specifically, when writing to the memory cell transistor MT is completed, the sense amplifier 20 transmits the data read from the memory cell transistor MT to the data register 21 (latch circuit XDL). In contrast, when the writing to the memory cell transistor MT is not completed, the sense amplifier 20 can transmit the write data WD held by the latch circuits ADL, BDL, and CDL of the sense amplifier 20 to the data register 21. Thereby, the reliability of the read data RD can be improved. Therefore, the reliability of the semiconductor memory device can be improved.

Furthermore, since the same page can be read in the middle of the write operation, it is possible to suppress the response guarantee period from when a read request is received to when a read result is returned, and thus ensure it is not prolonged.

2. Second Embodiment

Next, a second embodiment will be described. In the second embodiment, a case will be described in which suspension and resumption of a write operation are controlled using a suspend command and a resume command. Only differences from the first embodiment will be described below.

2.1 Write Operation

First, the write operation will be described. In the present embodiment, a case where the controller 200 transmits a normal write command will be described.

2.1.1 Overall Flow of Write Operation in Memory System

First, the overall flow of the write operation in the memory system will be described with reference to FIG. 22.

As shown in FIG. 22, the controller 200 receives a write instruction from the host device 2 (step S1).

In response to the write instruction from the host device 2, the controller 200 transmits a write instruction (write command, address ADD, and write data WD) to the NAND flash memory 100 (step S20).

Upon receiving the write instruction, the sequencer 15 of the NAND flash memory 100 sets the signal R/Bn to the "L" level (busy state) (step S3) and starts the write operation (step S4), based on the write instruction.

The controller 200 receives, for example, a read instruction from the host device 2 while the NAND flash memory 100 is performing a write operation (step S6).

In response to the read instruction, the controller 200 transmits a suspend command to the NAND flash memory 100 (step S21).

The sequencer 15 suspends the write operation in response to the suspend command even when the signal R/Bn is at the "L" level (busy state) (step S8), and the sequencer 15 sets the signal R/Bn to the "H" level (ready state) (Step S22). The sequencer 15 then stores suspend information in a register in the sequencer 15, for example.

After confirming that the signal R/Bn has returned to the "H" level (ready state), the controller 200 transmits a page read instruction (page read command, address ADD) to the NAND flash memory 100 (step S7).

In response to the page read instruction, the sequencer 15 sets the signal R/Bn to the "L" level (busy state) (step S9) and performs the suspend read operation (step S10).

When the suspend read operation has ended, the sequencer 15 sets the signal R/Bn to the "H" level (ready state) (step S11).

After confirming that the signal R/Bn has returned to the "H" level (ready state), the controller 200 transmits a cache read instruction (cache read command, address ADD) to the NAND flash memory 100 (step S13).

The sequencer 15 transmits the read data RD held by the data register 21 to the controller 200 in response to the cache read instruction (step S14).

After executing the ECC processing of the read data RD, the controller 200 transmits, to the host device 2, the read data RD subjected to ECC correction processing (step S15). The host device 2 receives, from the controller 200, the read data RD subjected to the ECC correction processing (step S16).

Upon receiving the read data RD which is read from the NAND flash memory 100, the controller 200 transmits a resume command to the NAND flash memory 100 (step S23).

In response to the resume command, the sequencer 15 confirms the suspend information and resumes the write operation (step S12).

2.1.2 Overall Flow of Write Operation in NAND Flash Memory

Figure 23:
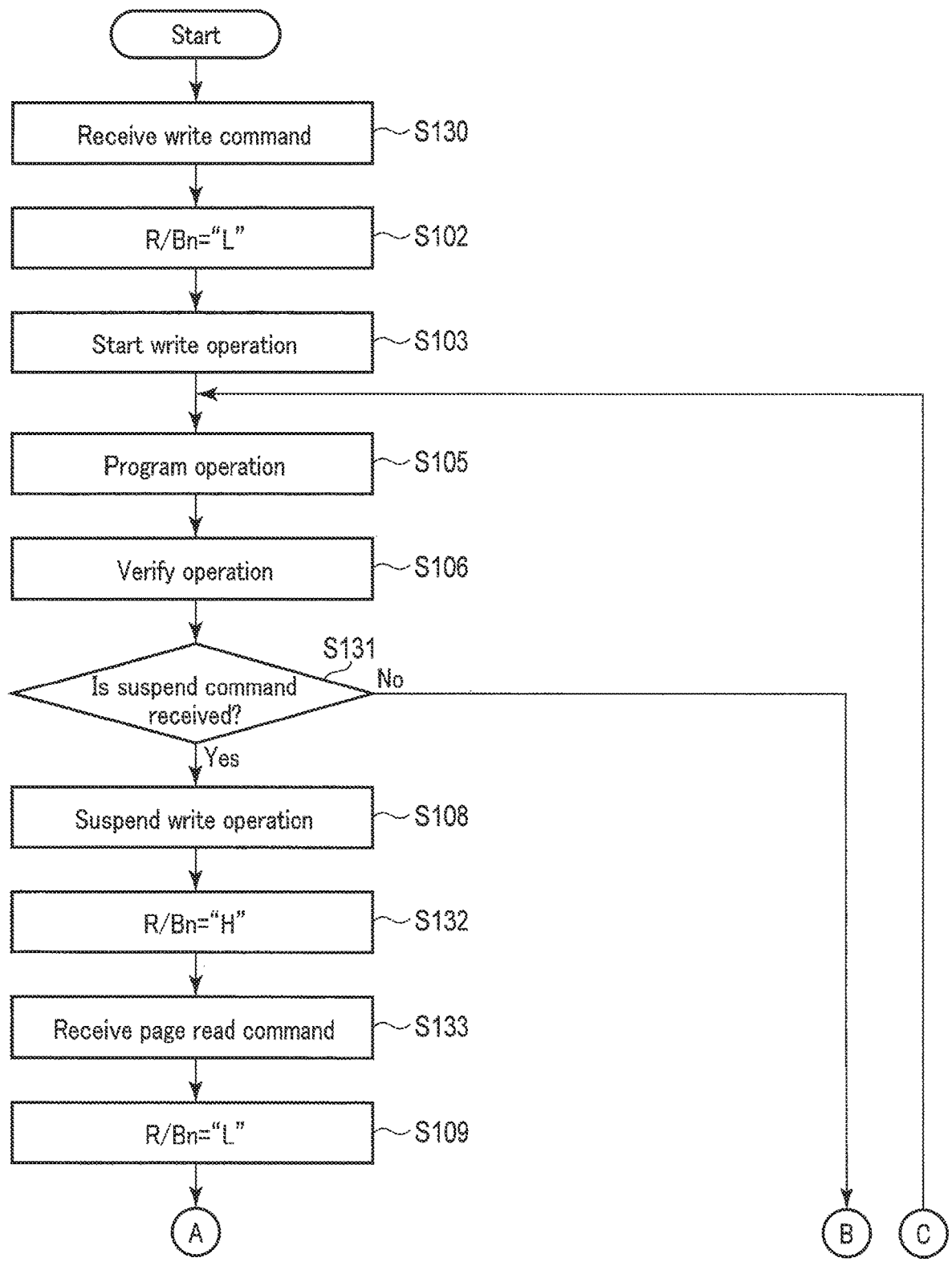
FIG. 23 is a flowchart of a write operation in the semiconductor memory device according to the second embodiment.
Figure 24:
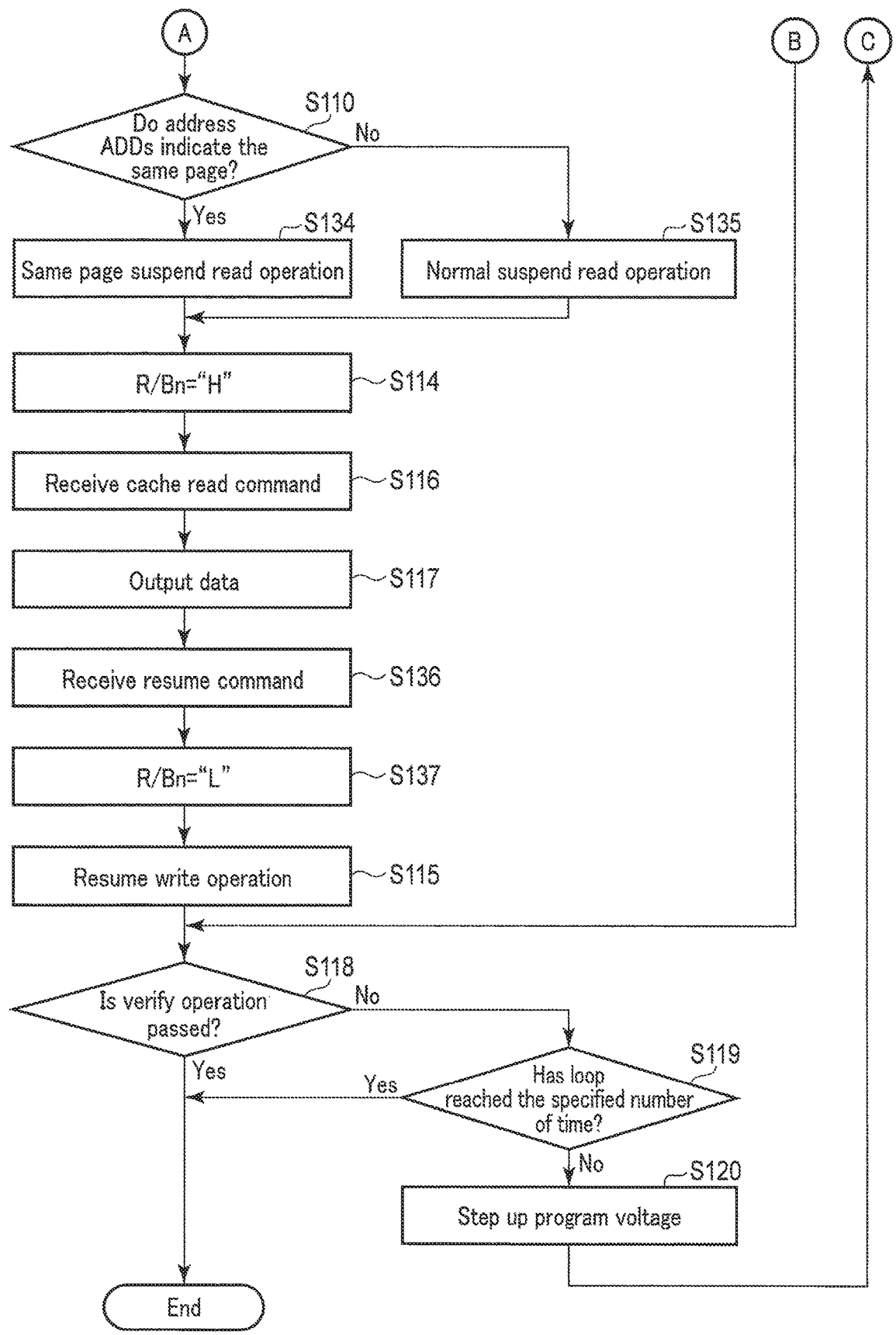
FIG. 24 is a flowchart of a write operation in the semiconductor memory device according to the second embodiment.

Next, the overall flow of a write operation in the NAND flash memory 100 will be described with reference to FIGS. 23 and 24. In the example of FIGS. 23 and 24, a case where the write operation is suspended after a verify operation, and the write operation is resumed from a program operation will be described, as in the case of FIGS. 10 and 11. As in the first embodiment, even when a write operation is suspended after a verify operation, the write operation may be resumed from the verify operation. Furthermore, the write operation may be suspended after a program operation. In this case, the write operation may be resumed from the verify operation. Only differences from the first embodiment shown in FIGS. 10 and 11 will be described below.

As shown in FIG. 23, the NAND flash memory 100 receives a write instruction (write command, address ADD, and write data WD) from the controller 200 (step S130).

In response to the write command, the sequencer 15 sets the signal R/Bn to the "L" level (busy state) (step S102) and starts a write operation (step S103).

Upon completion of the transmission of the write data WD from the data register 21 to the sense amplifier 20, the sequencer 15 performs a program operation (step S105).

Next, the sequencer 15 performs a verify operation (step S106).

When the sequencer 15 receives a suspend command from the controller 200 (step S131_Yes), the sequencer 15 suspends the write operation (step S108).

In contrast, when the sequencer 15 has not received the suspend command from the controller 200 (step S131_No), the sequencer 15 continues the write operation.

After the sequencer 15 suspends the write operation (step S108), the sequencer 15 sets the signal R/Bn to the "H" level (step S132).

Upon receiving a page read instruction (page read command and address ADD) from the controller 200 (step S133), the sequencer 15 sets the signal R/Bn to the "L" level (step S109). As shown in FIG. 24, when the address ADD of the write command and the address ADD of the page read command indicate the same page (step S110_Yes), the sequencer 15 performs a same page suspend read operation (step S134). The specific operation is the same as that in steps S110 and S111 in FIG. 11 illustrating the first embodiment.

When the address ADD of the write command and the address ADD of the page read command do not indicate the same page (step S110_No), the sequencer 15 performs a normal suspend read operation, i.e., a normal page read operation (step S135).

Upon completion of the suspend read operation, the sequencer 15 sets the signal R/Bn to the "H" level (ready state) (step S114).

Next, upon receiving a cache read instruction (cache read command and address ADD) from the controller 200 (step S116), the sequencer 15 transmits the read data RD from the data register 21 (latch circuit XDL) to the controller 200 (step S117).

Upon receiving a resume command from the controller 200 (step S136), the sequencer 15 sets the signal R/Bn to the "L" level (step S137) and resumes the write operation based on the suspend information (step S115).

The operation after resuming the write operation is the same as that in FIGS. 10 and 11, according to the first embodiment.

When the verify operation is passed (step S118_Yes) or the program loop has reached the specified number of times (step S119_Yes), the sequencer 15 sets the signal R/Bn to the "H" level and ends the write operation.

2.1.3 Operation of Controller in Write Operation

Next, the operation of the controller 200 in a write operation will be described with reference to FIG. 25. The example of FIG. 25 illustrates a write operation when the controller 200 transmits a normal write command. Only differences from the first embodiment shown in FIG. 12 will be described below.

As shown in FIG. 25, the differences from FIG. 12 of the first embodiment are that the controller 200 transmits a write command "10h" after transmitting the write data "WD", and the signal R/Bn is set to the "H" level after completion of the write operation to the memory cell transistor MT.

2.2 Specific Example of Overall Flow of Write Operation

Figure 26:
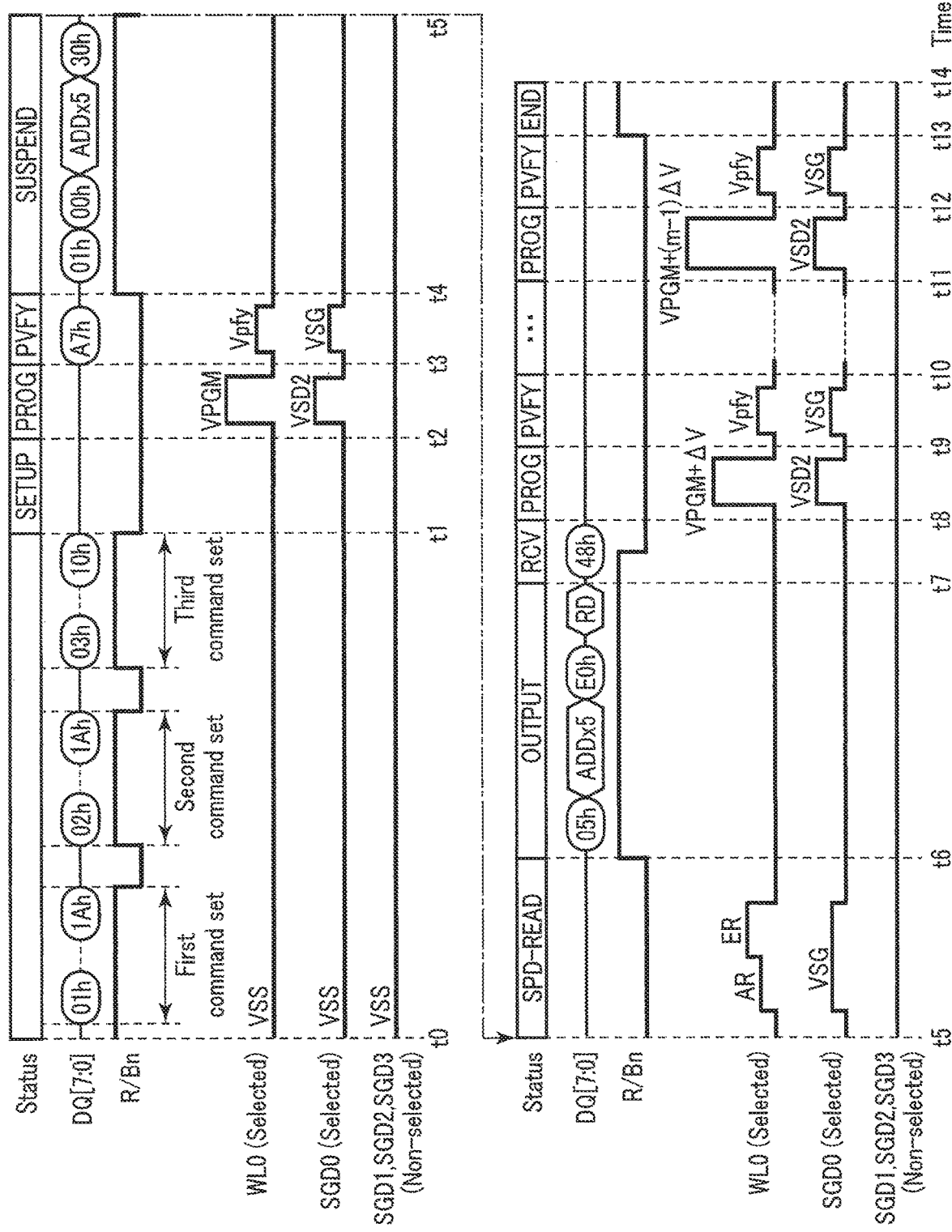
FIG. 26 is a timing chart illustrating an example of a write operation including a same page suspend read operation, in a memory system including the semiconductor memory device according to the second embodiment.

Next, the overall flow of the write operation will be described with reference to FIG. 26. The example of FIG. 26 shows a case where a write operation is suspended after completion of a verify operation in the first program loop, and the write operation is resumed after executing a same page suspend read operation and a cache read operation. Also, the example of FIG. 26 shows a case where the word line WL0 of the string unit SU0 is selected to perform a full sequence write operation and a lower page read operation as in FIG. 15, according to the first embodiment. Only the differences from FIG. 15 of the first embodiment will be described below.

As shown in FIG. 26, in a period time t0 to time t1, the controller 200 transmits, as a full sequence write command sequence, a first command set, a second command set, and a third command set to the NAND flash memory 100.

At time t1, the sequencer 15 sets the signal R/Bn to the "L" level in response to a write command "10h" and starts the write operation. During a period time t1 to time t2, the status of the write operation is brought to the ready state (reference symbol "SETUP"), and the data register 21 transmits the write data WD to the sense amplifier 20.

When the transmission of the write data WD from the data register 21 to the sense amplifier 20 is completed at time t2, during a period from time t2 to time t3, the status of the write operation is brought to a program state (reference symbol "PROG"), and the sequencer 15 executes the first program operation.

During a period time t3 to time t4, the status of the write operation is brought to a verify state (reference symbol "PVFY"), and the sequencer 15 performs a first verify operation. During this time, when the sequencer 15 receives a suspend command "A7h", the sequencer 15 suspends the write operation after completion of the verify operation, and sets the signal R/Bn to the "H" level.

During a period time t4 to time t5, the status of the write operation is brought to a suspend state (reference symbol "SUSPEND"), and the sequencer 15 receives a page read instruction (commands "01h", "00h", 5-cycle address data "ADD", and page read command "30h") of a lower page of the same memory cell group MCG from the controller 200.

At time t5, the sequencer 15 sets the signal R/Bn to the "L" level. During a period time t5 to time t6, the status of the write operation is brought to a suspend read state, and the sequencer 15 performs a same page suspend read operation.

When the same page suspend read operation has ended at time t6, the sequencer 15 sets the signal R/Bn to the "H" level. After confirming that the signal R/Bn has returned to the "H" level, the controller 200 transmits a cache read instruction (command "05h", 5-cycle address data "ADD", and cache read command "E0h").

During a period time t6 to time t7, the status of the write operation is brought to a data output state (reference symbol "OUTPUT"), and the sequencer 15 transmits the read data RD to the controller 200 based on the cache read instruction.

During a period time t7 to time t8, the status of the write operation is brought to a recovery state (reference symbol "RCV"), and upon receiving a resume command "48h" from the controller 200, the sequencer 15 resumes the write operation.

During a period time t8 to time t9, the status of the write operation is brought to the program state, and the sequencer 15 performs a second program operation.

During a period time t9 to time t10, the status of the write operation is brought to the verify state, and the sequencer 15 performs a second verify operation.

The sequencer 15 repeats the program loop. During a period time t11 to time t12, the status of the write operation is brought to the program state, and the sequencer 15 performs an m-th program operation.

During a period time t12 to time t13, the status of the write operation is brought to the verify state, and the sequencer 15 performs the m-th verify operation. Then, when the verify operation is passed in the m-th verify operation, the sequencer 15 executes recovery processing for a period time t13 to time t14, and ends the write operation.

2.3 Advantageous Effects of Present Embodiment

According to the configuration of the present embodiment, advantageous effects similar to those in the first embodiment can be achieved.

3. Third Embodiment

Next, a third embodiment will be described. The third embodiment shows a case where data is written at two stages in a full sequence write operation. Only differences from the first to third embodiments will be described below.

3.1 Write Operation

First, the write operation in the present embodiment will be described with reference to FIG. 27. In the present embodiment, the NAND flash memory 100 performs a two-stage write operation when writing 3-bit data to the memory cell transistor MT. In the following description, a first-stage write operation of the two-stage write operation is referred to as a "first write operation", and a second-stage write operation of the two-stage write operation is referred to as a "second write operation".

As shown in FIG. 27, the first write operation is an operation to preliminarily raise the threshold voltage, for example, of memory cell transistors MT corresponding to a write operation in any of the "D" to "G" states which have relatively large threshold voltage variations, to an "LM" state. A threshold voltage included in the "LM" state is equal to or higher than a voltage LMV and lower than a voltage EV. For example, in the first write operation, in order to reduce the number of program loops, a program condition is applied under which the amount of variation in threshold voltage in a single program operation is relatively large. For this reason, the threshold distribution of the "LM" state tends to be wider than those of the "A" to "G" states. Therefore, for example, the voltage LMV is set to be equal to or higher than the voltage CV and lower than the voltage DV.

The second write operation is an operation to write "A" to "C" states to the memory cell transistors MT in the "Er" state, and write "D" to "G" states to the memory cell transistors MT in the "LM" state. For example, in the second write operation, a program condition is applied under which the variation amount of the threshold voltage in a single program operation is smaller than that in the first write operation, so that the threshold distribution in each state becomes narrower than the threshold distribution in the "LM" state. More specifically, for example, a program voltage VPGM lower than that in the first write operation is set.

In the first write operation, the memory cell transistors MT in which writing of data in the "LM" state is performed, and the voltage LMV can be set discretionarily. For example, memory cell transistors MT in which writing of data in the "E" to "G" states is to be performed may be set as targets of the writing. In this case, the voltage LMV may be set to, for example, equal to or higher than the voltage DV and lower than the voltage EV.

3.1.1 Operation of Controller in Write Operation

Next, the operation of the controller 200 in the write operation will be described with reference to FIG. 28. The example in FIG. 28 shows a case where data of a lower page is transmitted as a write instruction for a first write operation (hereinafter referred to as a "first write instruction"), and data of a middle page and data of an upper page is sequentially transmitted as a write instruction for a second write operation (hereinafter referred to as a "second write instruction"). Also, the example of FIG. 28 shows data DQ [7:0] and the signal R/Bn, and signals CEn, CLE, ALE, WEn, and REn are omitted. The order of transmissions of data of respective pages may be set discretionarily.

As shown in FIG. 28, the controller 200 executes a command sequence for transmitting the lower page write data WD corresponding to a write operation in the "LM" state as the first write instruction. More specifically, the controller 200 sequentially transmits a command "01h" for designating a lower page, a command "80h" for notifying that a write operation is to be executed, a column address CA, a row address RA, lower page write data WD, and a write command "10h". In response to the write command "10h", the NAND flash memory 100 comes into the busy state (R/Bn="L"). Upon completion of the first write operation, the NAND flash memory 100 comes into the ready state, and the signal R/Bn is set to the "H" level.

Next, after confirming that the signal R/Bn has returned to the "H" level, the controller 200 transmits a second write instruction to the NAND flash memory 100. More specifically, the controller 200 first transmits, as a command sequence for transmitting write data of a middle page, a command "02h" for designating a middle page, the command "80h", a column address CA, a row address RA, middle page write data WD and a command "1Ah". In response to the command "1Ah", the NAND flash memory 100 comes into the busy state (R/Bn="L"). When the transmission of the middle page write data WD from the data register 21 to the sense amplifier 20 (latch circuit BDL) has ended and the data register 21 becomes usable, the NAND flash memory 100 comes into the ready state, and the signal R/Bn is set to the "H" level.

Next, after confirming that the signal R/Bn has returned to the "H" level, the controller 200 transmits, as a command sequence for transmitting upper page write data, a command "03h" for designating an upper page, the command "80h", a column address CA, a row address RA, upper page write data WD, and a write command "10h". In response to the write command "10h", the NAND flash memory 100 comes into the busy state (R/Bn="L"). When the second write operation to the memory cell transistor MT has ended, the NAND flash memory 100 comes into the ready state, and the signal R/Bn is set to the "H" level.

The controller 200 may issue commands instructing the first write operation and the second write operation, respectively.

3.1.2 Overall Flow of Write Operation in NAND Flash Memory

Figure 29:
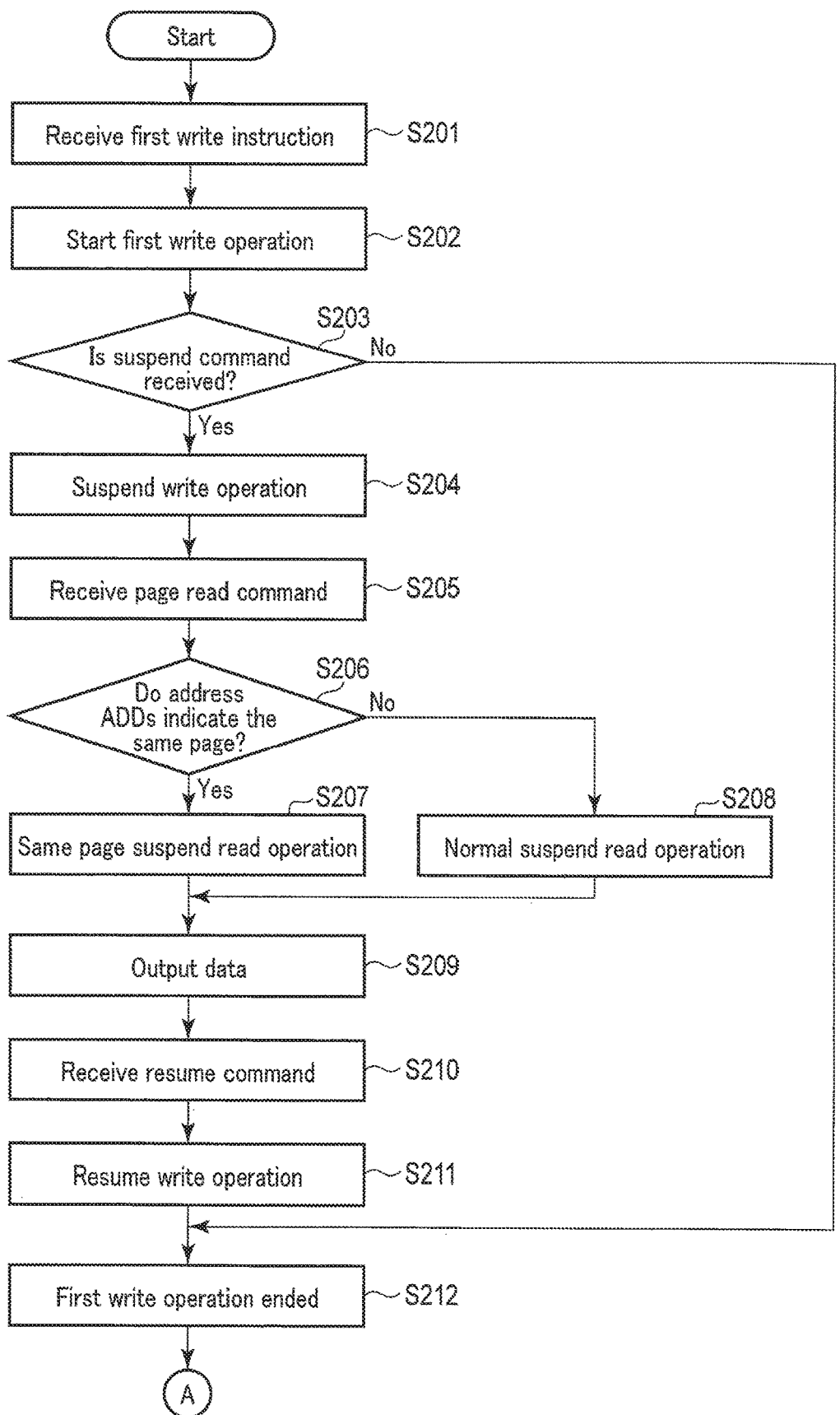
FIG. 29 is a flowchart of a write operation in the semiconductor memory device according to the third embodiment.
Figure 30:
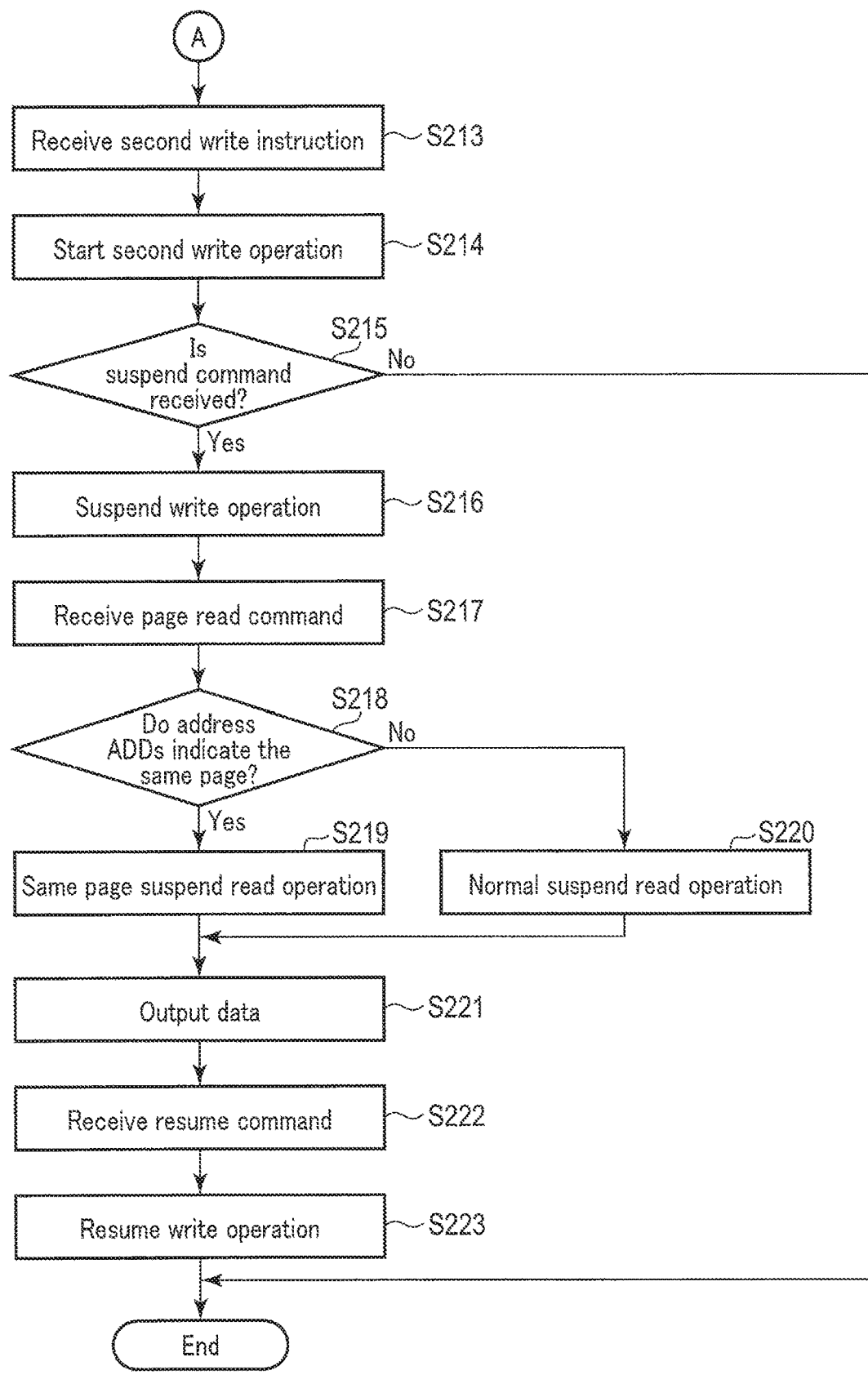
FIG. 30 is a flowchart of a write operation in the semiconductor memory device according to the third embodiment.

Next, the overall flow of a write operation in the NAND flash memory 100 will be described with reference to FIGS. 29 and 30. In the example of FIGS. 29 and 30, the program operation and the verify operation in the write operation are omitted, and the timing for suspending the write operation is not particularly limited. The write operation may be suspended either after the program operation or after the verify operation.

As shown in FIG. 29, the NAND flash memory 100 receives a first write instruction (write command, address ADD, and lower page write data WD) from the controller 200 (step S201).

In response to the first write instruction, the sequencer 15 sets the signal R/Bn to the "L" level and starts the first write operation (step S202).

When the sequencer 15 receives a suspend command from the controller 200 during the first write operation (step S203_Yes), the sequencer 15 suspends the write operation (step S204) and sets the signal R/Bn to the "H" level.

In contrast, when the sequencer 15 has not received the suspend command from the controller 200 (step S203_No), the sequencer 15 continues the first write operation.

After suspending the write operation (step S204), the sequencer 15 receives a page read instruction (page read command and address ADD) from the controller 200 (step S205). In response to the page read instruction, the sequencer 15 sets the signal R/Bn to the "L" level.

When the address ADD of the first write instruction and the address ADD of the page read instruction indicate the same page (step S206_Yes), the sequencer 15 performs a same page suspend read operation (step S207).

In contrast, when the address ADD of the first write instruction and the address ADD of the page read instruction indicate different pages (step S206_No), the sequencer 15 executes the normal suspend read operation (step S208).

Upon completion of the suspend read operation, the sequencer 15 sets the signal R/Bn to the "H" level. Then, upon receiving a cache read instruction, the sequencer 15 transmits the read data RD to the controller 200 (step S209).

Upon receiving a resume command from the controller 200 (step S210), the sequencer 15 sets the signal R/Bn to the "L" level and resumes the first write operation (step S211).

Upon completion of the first write operation (step S212), the sequencer 15 sets the signal R/Bn to the "H" level.

As shown in FIG. 30, the NAND flash memory 100 receives a second write instruction (write command, address ADD, and middle page and upper page write data WD) from the controller 200 (step S213).

In response to the second write instruction, the sequencer 15 sets the signal R/Bn to the "L" level and starts a second write operation (step S214).

When the sequencer 15 receives a suspend command from the controller 200 during the second write operation (step S215_Yes), the sequencer 15 suspends the write operation (step S216) and sets the signal R/Bn to the "H" level.

In contrast, when the sequencer 15 has not received the suspend command from the controller 200 (step S215_No), the sequencer 15 continues the second write operation.

After suspending the write operation (step S216), the sequencer 15 receives a page read instruction (page read command and address ADD) from the controller 200 (step S217). In response to the page read instruction, the sequencer 15 sets the signal R/Bn to the "L" level.

When the address ADD of the second write instruction and the address ADD of the page read instruction indicate the same page (step S218_Yes), the sequencer 15 executes a same page suspend read operation (step S219).

In contrast, when the address ADD of the second write instruction and the address ADD of the page read instruction indicate different pages (step S218_No), the sequencer 15 performs a normal suspend read operation (step S220).

Upon completion of the suspend read operation, the sequencer 15 sets the signal R/Bn to the "H" level. Then upon receiving a cache read instruction, the sequencer 15 transmits the read data RD to the controller 200 (step S221).

When the sequencer 15 receives a resume command from the controller 200 (step S222), the sequencer 15 sets the signal R/Bn to the "L" level and resumes a second write operation (step S223).

3.1.3 Specific Examples of Data Held by Latch Circuit in First and Second Write Operations Next, specific examples of data held by the latch circuits ADL, BDL, and CDL in the first and second write operations will be described with reference to FIGS. 31 and 32. In the examples of FIGS. 31 and 32, a case where the data allocation of 1-3-3 code shown below is used will be described.

"Er" state: "111" ("upper bit/middle bit/lower bit") data
"A" state: "101" data
"B" state: "011" data
"C" state: "001" data
"D" state: "110" data
"E" state: "100" data
"F" state: "010" data
"G" state: "000" data First, as shown in FIG. 31, the sense amplifier 20 stores lower page data in the latch circuit ADL based on a first write instruction (write command, address ADD, and lower page write data WD). More specifically, "1" data is stored in a latch circuit ADL corresponding to the "Er" to "C" states, and "0" data is stored in a latch circuit ADL corresponding to the "D" to "G" states. The data of the latch circuit ADL is then transferred to the latch circuit SDL, and the first write operation is performed. In the first write operation, an "LM" state write operation is performed for the memory cell transistors MT corresponding to the "D" to "G" states to which "0" data is allocated. Upon completion of the first write operation, "1" data is stored in the latch circuits ADL corresponding to the "D" to "G" states for which the verify operation is passed. That is, upon completion of the first write operation, "1" data is stored in the latch circuits ADL corresponding to the "Er" to "G" states.

As shown in FIG. 32, next, the sense amplifier 20 stores the data of the middle page and upper page in the latch circuits BDL and CDL in response to a second write instruction (write command, address ADD, and middle page and upper page write data WD). The sense amplifier 20 then executes internal data load (IDL) and stores, in the latch circuit ADL, the result of reading the data of the memory cell transistors MT. Thereby, data corresponding to the 1-3-3 code is stored in the latch circuits ADL, BDL, and CDL. The sequencer 15 performs the second write operation based on the data stored in the latch circuits ADL, BDL, and CDL.

3.2 Advantageous Effects of Present Embodiment

According to the configuration of the present embodiment, the advantageous effects similar to those of the first embodiment can be achieved.

4. MODIFICATION, ETC

The semiconductor memory device according to the above-described embodiments includes a first memory string (SR) including a first memory cell (MT0) and a first selection transistor (ST1) coupled to the first memory cell (MT0); a second memory string (SR) including a second memory cell (MT0) and a second selection transistor (ST1) coupled to the second memory cell (MT0); a word line (WL0) coupled to gates of the first and second memory cells; a first selection gate line (SGD0) coupled to a gate of the first selection transistor; a second selection gate line (SGD1) coupled to a gate of the second selection transistor; a bit line (BL0) coupled to the first and second selection transistors; a row decoder (19) coupled to the word line, the first selection gate line, and the second selection gate line; a sense amplifier (20) including a latch circuit (ADL) coupled to the bit line and capable of holding write data; a data register coupled to the sense amplifier to transmit and receive data to and from the sense amplifier; and a control circuit (15) capable of suspending a write operation to perform a read operation of the first memory cell when receiving a read instruction of the first memory cell during the write operation of the first memory cell. In the read operation of the first memory cell performed while suspending the write operation of the first memory cell, the row decoder is configured to apply a write voltage to the word line, and the sense amplifier transmits data read from the first memory cell to the data register as read data when the writing of the write data to the first memory cell is completed, and transmits the write data held by the latch circuit to the data register as the read data when the writing of the write data to the first memory cell is not completed.

A semiconductor memory device with improved reliability can be provided by applying the above-mentioned embodiments.

The embodiments are not limited to the configurations described above, but can be modified in various ways.

For example, in the above-described embodiments, the sense amplifier 20 may further include a latch circuit TDL to perform the various arithmetic operations that have been performed by using the latch circuits ADL, BDL, CDL, and XDL in the same page suspend read operation, through use of the latch circuits ADL, BDL, CDL, and TDL, and to transfer read data RD (data read from the memory cell transistor MT or write data WD held by the latch circuits ADL, BDL, or CDL) to the latch circuit XDL.

Furthermore, the above-described embodiments are not limited to the full sequence write operation. For example, the above-described embodiments can also be applied to write and read operations of a lower, middle, or upper page.

Furthermore, the above-described embodiments are not limited to a three-dimensional stacked NAND flash memory but may also be applied to a planar NAND flash memory with memory cells arranged on a semiconductor substrate. Furthermore, the above-described embodiments are not limited to a NAND flash memory, and may also be applied to a semiconductor memory device using another memory capable of performing suspend and resume operations during a write operation including a program operation and a verify operation.

Furthermore, the term "couple" in the above-described embodiments includes a state of indirect coupling via a transistor, a resistor, or the like.

In each of the embodiments related to the present invention, the following may be used. For example, the memory cell transistor MT can hold data of 2 bits (4 values), and the threshold voltage level when holding one of the 4 values is lower from the Er state (erase level), A state, B state, And C state, (1) In the read operation, The voltage applied to the word line selected for an A state read operation is, for example, between 0V and 0.55V. The voltage may be any of 0.1V to 0.24V, 0.21V to 0.31V, 0.31V to 0.4V, 0.4V to 0.5V, and 0.5V to 0.55V, without being limited to the above-described range.

The voltage applied to the word line selected for a B state read operation is, for example, between 1.5V and 2.3V. The voltage may be any of 1.65V to 1.8V, 1.8V to 1.95V, 1.95V to 2.1V, and 2.1V to 2.3V, without being limited to the above-described range.

The voltage applied to the word line selected for a C state read operation is, for example, between 3.0V and 4.0V. The voltage may be any of 3.0V to 3.2V, 3.2V to 3.4V, 3.4V to 3.5V, 3.5V to 3.6V, and 3.6V to 4.0V, without being limited to the above-described range.

The read operation time (tR) may be, for example, between 25 μs to 38 μs, 38 μs to 70 μs, or 70 μs to 80 μs.

(2) The write operation includes a program operation and a verify operation as described above.

In the write operation, the voltage initially applied to the word line selected during the program operation is, for example, between 13.7V and 14.3V. The voltage may be between 13.7 V to 14.0 V and 14.0 V to 14.6 V, for example, without being limited to the above range.

The voltage initially applied to a selected word line when an odd-numbered word line is written, and that initially applied to a selected word line when an even-numbered word is written may be changed.

When the program operation is executed according to an incremental step pulse program (ISPP) method, the step-up voltage is, for example, about 0.5V.

The voltage applied to a non-selected word line may be, for example, between 6.0V and 7.3V. The voltage may be between 7.3 V and 8.4 V, or may be 6.0 V or lower, without being limited to the above range.

The pass voltage to be applied may be changed depending on whether the non-selected word line is an odd-numbered word line or an even-numbered word line.

The write operation time (tProg) may be, for example, between 1700 μs to 1800 μs, 1800 μs to 1900 μs, or 1900 μs to 2000 μs.

(3) In an erase operation,

The voltage initially applied to a well formed on the semiconductor substrate and on which the memory cell is disposed is, for example, between 12V and 13.6V. The voltage may be, for example, between 13.6 V to 14.8 V, 14.8 V to 19.0 V, 19.0 to 19.8 V, or 19.8 V to 21 V, without being limited to the above range.

The erase operation time (tErase) may be, for example, between 3000 µs to 4000 µs, 4000 µs to 5000 µs, or 4000 µs to 9000 µs.

(4) The structure of the memory cell in the planar NAND flash memory includes a charge storage layer disposed on a semiconductor substrate (silicon substrate) via a tunnel insulating film having a film thickness of 4 to 10 nm. This charge storage layer may have a laminated structure of an insulating film, such as SiN or SiON having a thickness of 2 to 3 nm, and polysilicon having a thickness of 3 to 8 nm. A metal, such as Ru, may be added to the polysilicon. The charge storage layer includes an insulating film on the charge storage layer. This insulating film includes, for example, a silicon oxide film having a film thickness of 4 to 10 nm interposed between a lower High-k film having a film thickness of 3 to 10 nm and an upper High-k film having a film thickness of 3 to 10 nm. An example of the High-k film is HfO. The film thickness of the silicon oxide film may be made greater than those of the High-k films. A control electrode having a film thickness of 30 nm to 70 nm is formed on the insulating film via a work function adjusting material having a thickness of 3 to 10 nm. The work function adjusting material is a metal oxide film, such as TaO, or a metal nitride film, such as TaN. W or the like can be used for the control electrode.

In addition, an air gap may be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory string including a first memory cell and a first selection transistor coupled to the first memory cell;
a second memory string including a second memory cell and a second selection transistor coupled to the second memory cell;
a third memory string including a third memory cell and a third selection transistor coupled to the third memory cell;
a word line coupled to gates of the first memory cell, the second memory cell, and the third memory cell;
a first selection gate line coupled to a gate of the first selection transistor and the third selection transistor;
a second selection gate line coupled to a gate of the second selection transistor;
a first bit line coupled to the first and second selection transistors;
a second bit line coupled to the third selection transistor;
a row decoder coupled to the word line, the first selection gate line, and the second selection gate line;
a sense amplifier coupled to the first bit line and the second bit line, and including a latch circuit capable of holding write data;
a data register coupled to the sense amplifier to transmit and receive data to and from the sense amplifier; and
a control circuit capable of suspending a write operation of the first memory cell and the third memory cell to perform a read operation of the first memory cell and the third memory cell when receiving a read instruction of the first memory cell and the third memory cell during the write operation of the first memory cell and the third memory cell,
wherein in the read operation of the first memory cell and the third memory cell performed while suspending the write operation of the first memory cell and the third memory cell, the row decoder is configured to apply a read voltage to the word line, and the sense amplifier transmits data read from the first memory cell to the data register as read data, and transmits the write data of the third memory cell held by the latch circuit to the data register as the read data, when the writing of the write data to the first memory cell is completed and the writing of the write data to the third memory cell is not completed.

2. The semiconductor memory device according to claim 1, wherein the write data is identical to the read data.

3. The semiconductor memory device according to claim 1, wherein in the write operation, the control circuit is configured to repeatedly perform a program loop including a program operation and a verify operation, suspend the write operation after completion of the program operation when the write operation is suspended, and resume the write operation from the verify operation when the write operation is resumed.

4. The semiconductor memory device according to claim 1, wherein in the write operation, the control circuit is configured to repeatedly perform a program loop including a program operation and a verify operation, suspend the write operation after completion of the verity operation when the write operation is suspended, and resume the write operation from the verify operation when the write operation is resumed.

5. The semiconductor memory device according to claim 1, wherein in the write operation, the control circuit is configured to repeatedly perform a program loop including a program operation and a verify operation, suspend the write operation after completion of the verify operation when the write operation is suspended, and when the write operation is suspended, and resume the write operation from the program operation when the write operation is resumed.

6. The semiconductor memory device according to claim 1, wherein when the control circuit receives a suspend command during the write operation, the control circuit is configured to suspend the write operation, and when the control circuit receives a resume command during the suspension of the write operation, the control circuit is configured to resume the write operation.

7. The semiconductor memory device according to claim 1, wherein when a read operation of the second memory cell performed while suspending the write operation of the first memory cell and the third memory cell, the sense amplifier is configured to transmit data read from the second memory cell to the data register as the read data.

8. The semiconductor memory device according to claim 1, wherein in the write operation to the first memory cell and the third memory cell, the row decoder is configured to apply a first voltage lower than the write voltage to the first selection gate line, and a second voltage lower than the first voltage to the second selection gate line; and in the read operation from the first memory cell and the third memory cell, the row decoder is configured to apply a third voltage higher than the read voltage to the first selection gate line, and a fourth voltage lower than the read voltage to the second selection gate line.

9. The semiconductor memory device according to claim 8, wherein in the write operation, the control circuit is configured to repeatedly perform a program loop including a program operation and a verify operation, and the row decoder is configured to step up the write voltage every time the program operation is repeated.

10. The semiconductor memory device according to claim 1, wherein the read operation includes a first read operation to store the read data in the data register and a second read operation to output the read data from the data register to an external device; and the read instruction includes a first read instruction corresponding to the first read operation and a second read instruction corresponding to the second read operation.

11. The semiconductor memory device according to claim 10, wherein the control circuit is configured to output a ready/busy signal indicating a busy state during a period of the first read operation, and to output the ready/busy signal indicating a ready state during a period of the second read operation.

12. The semiconductor memory device according to claim 10, wherein when receiving a first write instruction, the control circuit is configured to output a ready/busy signal indicating a busy state during a period from the start of the write operation until the end of transmission of the write data from the data register to the sense amplifier; and when receiving a second write instruction, the control circuit is configured to output the ready/busy signal indicating the busy state during the period from the start of the write operation until the end of the write operation.

13. The semiconductor memory device according to claim 12, wherein when the control circuit receives the first read instruction during the execution of the write operation based on the first write instruction, the control circuit is configured to suspend the write operation to perform the first read operation and resume the write operation after completion of the first read operation.

14. The semiconductor memory device according to claim 13, wherein when receiving the second read instruction after the resumption of the write operation, the control circuit is capable of performing the resumed write operation in parallel with the second read operation.

15. The semiconductor memory device according to claim 12, wherein when receiving a suspend command while executing the write operation based on the second write instruction, the control circuit is configured to suspend the write operation and transmit the ready/busy signal indicating a ready state; when receiving the first read instruction after suspension of the write operation, the control circuit is configured to perform the first read operation; when receiving the second read instruction after completion of the first read operation, the control circuit is configured to perform the second read operation; and when receiving a resume command after completion of the second read operation, the control circuit is configured to resume the write operation.

16. The semiconductor memory device according to claim 1, wherein in the read operation of the first memory cell and the third memory cell performed while suspending the write operation of the first memory cell and the third memory cell, the sense amplifier is configured to refer to the latch circuit after transmitting the data read from the first memory cell to the data resister and transmitting the write data of the third memory cell to the data register as the read data; and when the writing of the write data to the first memory cell is completed and the writing of the write data to the third memory cell is not completed, the sense amplifier is configured to transmit the write data stored in the latch circuit to the data register.

17. The semiconductor memory device according to claim 1, wherein in the read operation of the first memory cell and the third memory cell performed while suspending the write operation of the first memory cell and the third memory cell, when the writing of the write data to the first memory cell is not completed, the sense amplifier is configured to replace data read from the first memory cell with the write data held by the latch circuit.

* * * * *